United States Patent
Kanda

(10) Patent No.: US 7,428,161 B2
(45) Date of Patent: Sep. 23, 2008

(54) SEMICONDUCTOR MEMORY DEVICE WITH MOS TRANSISTORS EACH HAVING FLOATING GATE AND CONTROL GATE

(75) Inventor: Kazushige Kanda, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 16 days.

(21) Appl. No.: 11/537,880

(22) Filed: Oct. 2, 2006

(65) Prior Publication Data

US 2007/0121359 A1 May 31, 2007

(30) Foreign Application Priority Data

Oct. 7, 2005 (JP) .............................. 2005-294741

(51) Int. Cl.
- G11C 5/06 (2006.01)
- G11C 11/34 (2006.01)
- G11C 16/04 (2006.01)
- G11C 8/00 (2006.01)

(52) U.S. Cl. ................ 365/63; 365/185.05; 365/185.11; 365/72; 365/230.03

(58) Field of Classification Search .................... 365/63, 365/185.05, 185.06, 185.11
See application file for complete search history.

(56) References Cited

U.S. PATENT DOCUMENTS

| 5,142,541 A | 8/1992 | Kim et al. |
| 2003/0193827 A1* | 10/2003 | Choi ...................... 365/185.18 |
| 2004/0197990 A1* | 10/2004 | Hieda ........................ 438/253 |

FOREIGN PATENT DOCUMENTS

JP 2-166700 6/1990

OTHER PUBLICATIONS

Wei-Hua Liu, et al., "A 2-Transistor Source-Select (2TS) Flash EEPROM for 1.8V-Only Applications", Non-Volatile Semiconductor Memory Workshop (NVSMW), 4.1, Feb. 1997, pp. 1-3.

* cited by examiner

Primary Examiner—Ly D Pham
(74) Attorney, Agent, or Firm—Oblon, Spivak, McClelland, Maier & Neustadt, P.C.

(57) ABSTRACT

A semiconductor memory device includes memory cell arrays, word lines, bit lines, column gates, sense amplifiers, and an error correcting circuit. The memory cell array includes first regions and a second region. The first region includes first element isolating regions which have stripe shapes along the bit lines. The memory cell is formed on an element region between the adjacent element isolating regions. The first regions are arranged in plurality along the word line direction. The second region is provided adjacent to the first region in a direction along the word lines. The second region includes a second element isolating region whose width along the word line direction is greater than that of the first element isolating region. Addresses of the bit line adjacent to the second region are different from one another among the memory cell arrays.

17 Claims, 57 Drawing Sheets

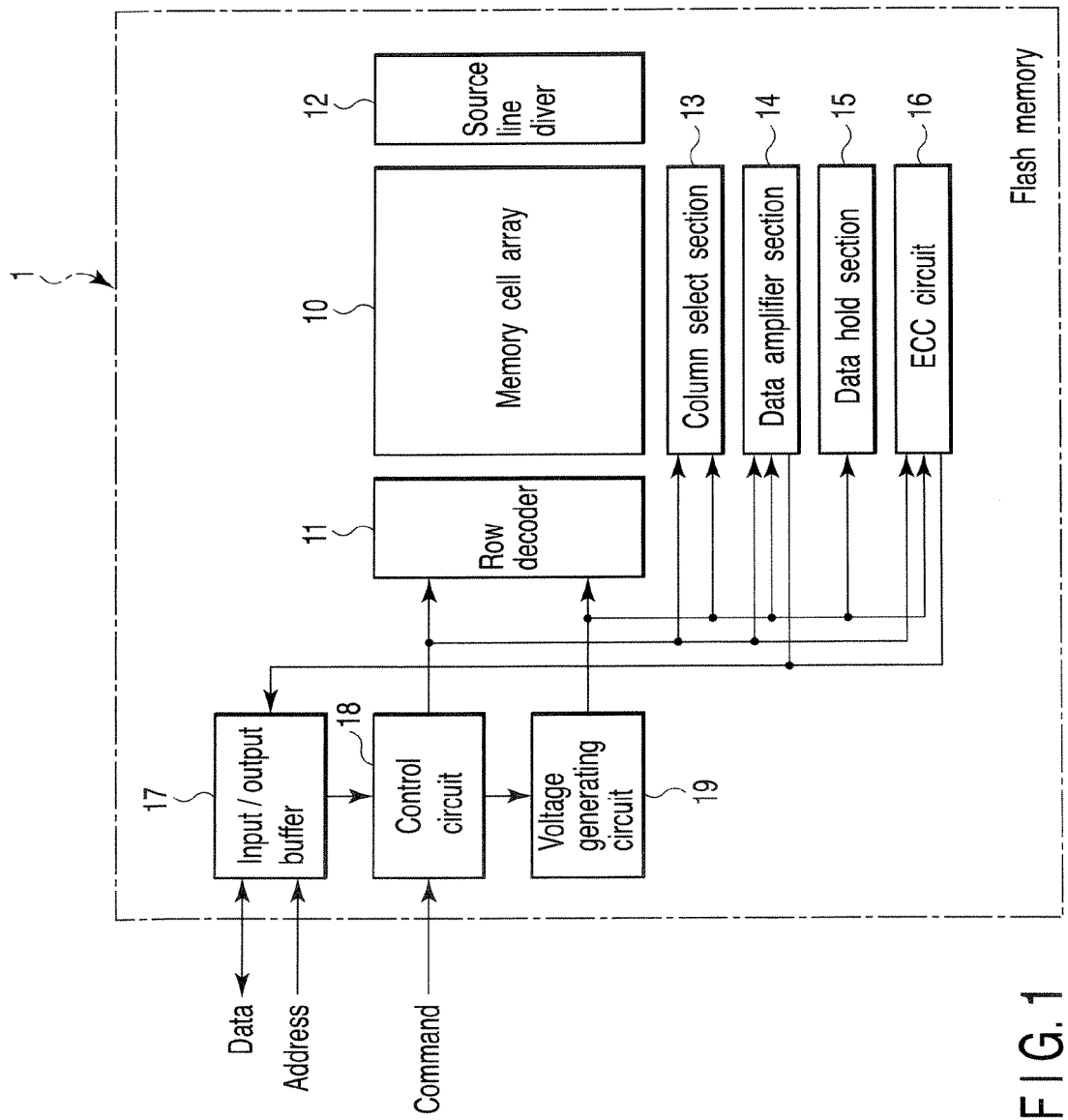
F I G. 1

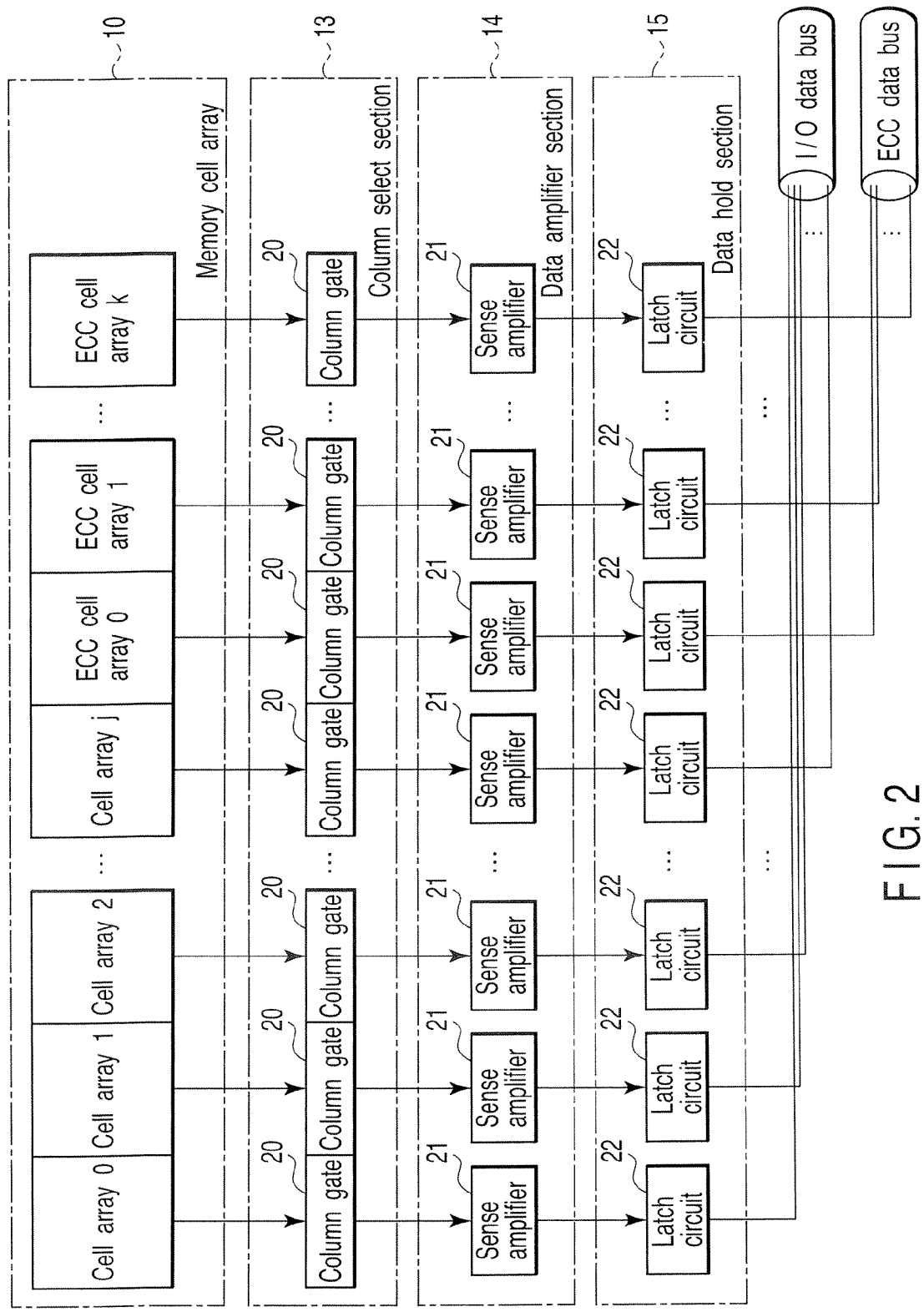
F I G. 2

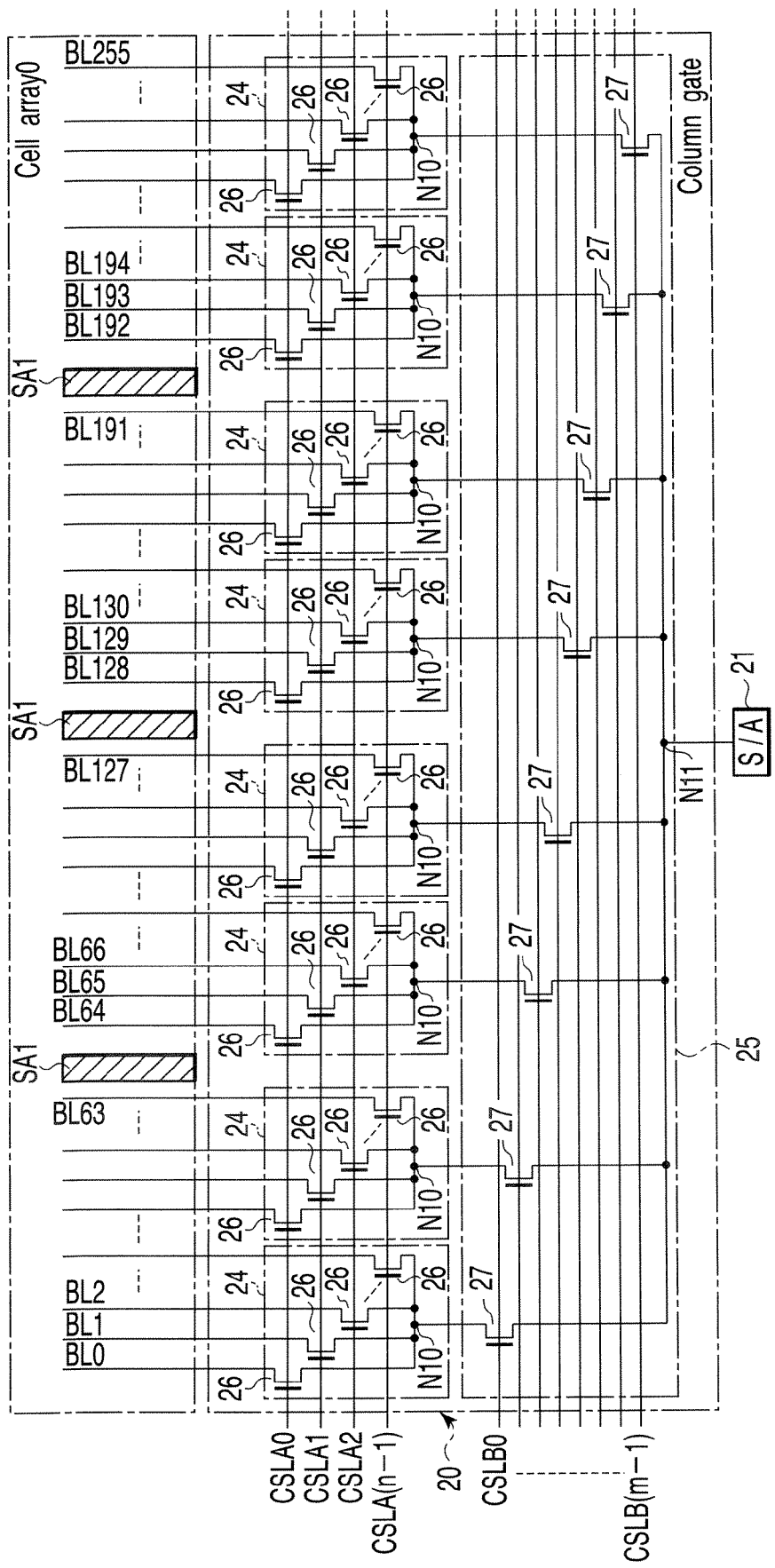
F I G. 4

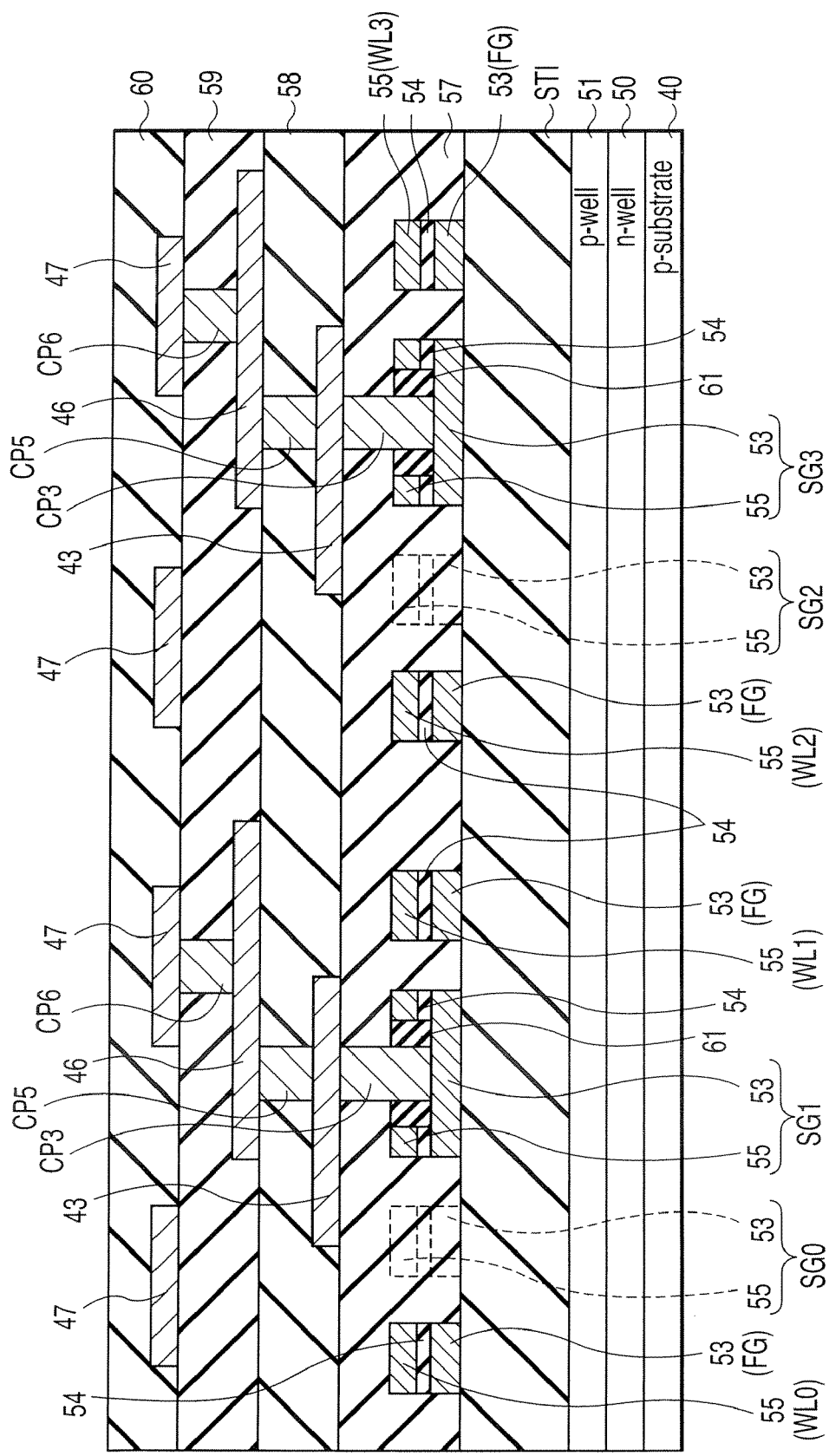
F I G. 15

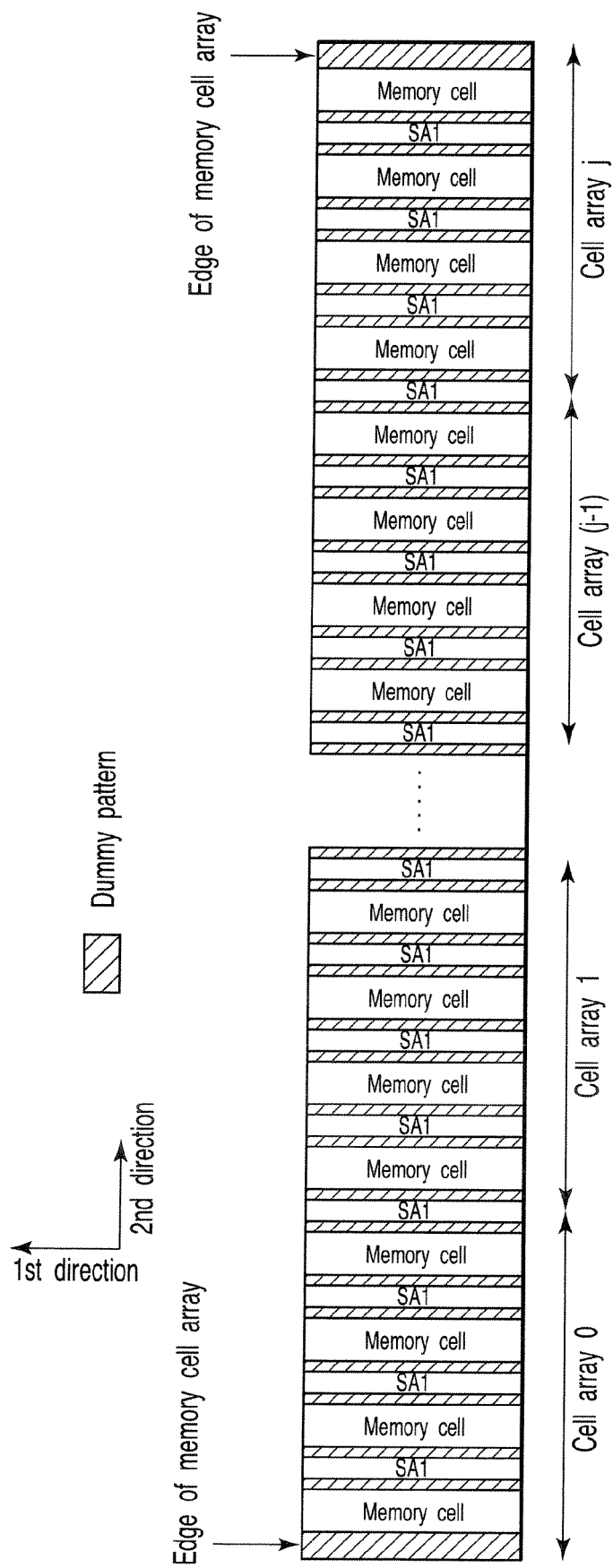
F I G. 18

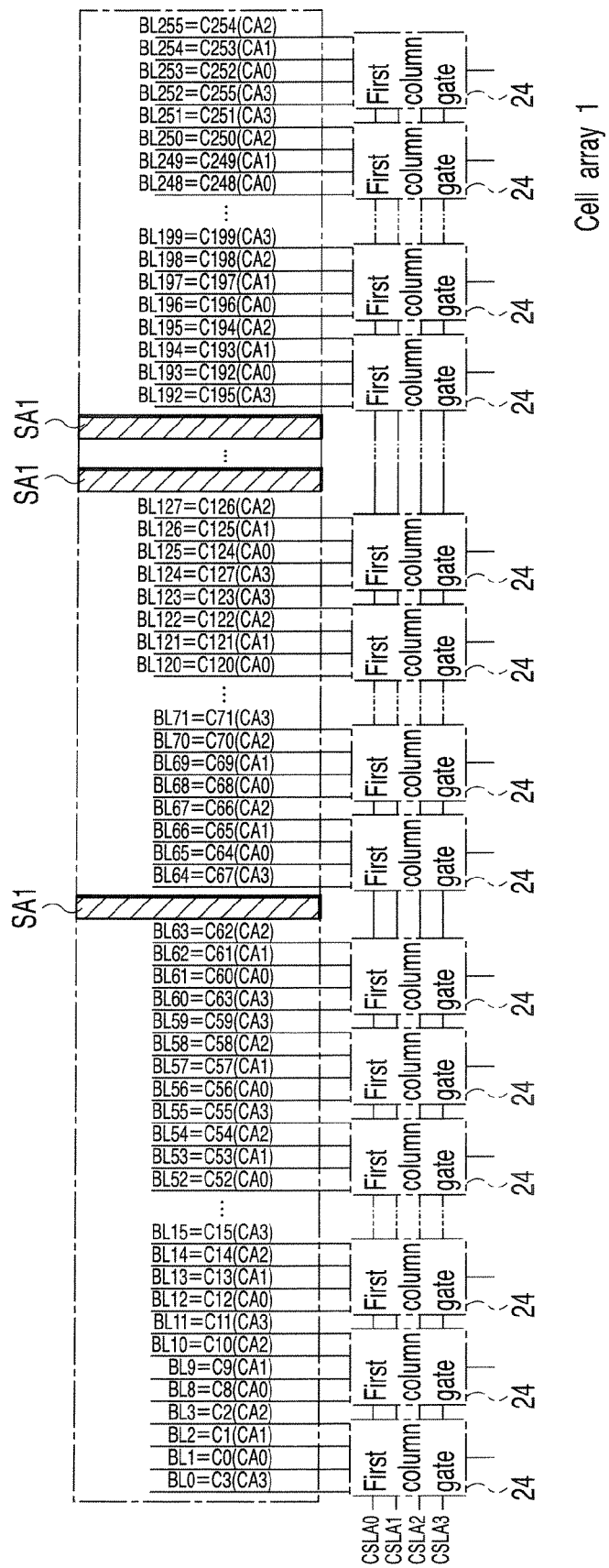
F I G. 20

| | Selected column | Cell array 0 | Cell array 1 | Cell array 2 | Cell array 3 | One-bit correcting ECC |
|---|---|---|---|---|---|---|
| CASE1 | C0 | Fail(BL0) | Fail(BL0) | Fail(BL0) | Fail(BL0) | Correction is disabled |
| CASE2 | C32 | Pass(BL32) | Fail(BL32) | Pass(BL32) | Pass(BL32) | Correction is enabled |
| CASE3 | C64 | Fail(BL64) | Pass(BL64) | Pass(BL64) | Fail(BL64) | Correction is disabled |

| Selected column | Cell array 0 | Cell array 1 | Cell array 2 | Cell array 3 | One-bit correcting ECC |
|---|---|---|---|---|---|
| CASE1 | C0 | Fail(BL0) | Pass(BL1) | Pass(BL2) | Pass(BL3) | Correction is enabled |
| CASE2 | C32 | Pass(BL32) | Fail(BL32) | Pass(BL32) | Pass(BL32) | Correction is enabled |
| CASE3 | C64 | Fail(BL64) | Pass(BL65) | Pass(BL66) | Pass(BL67) | Correction is enabled |

F I G. 31

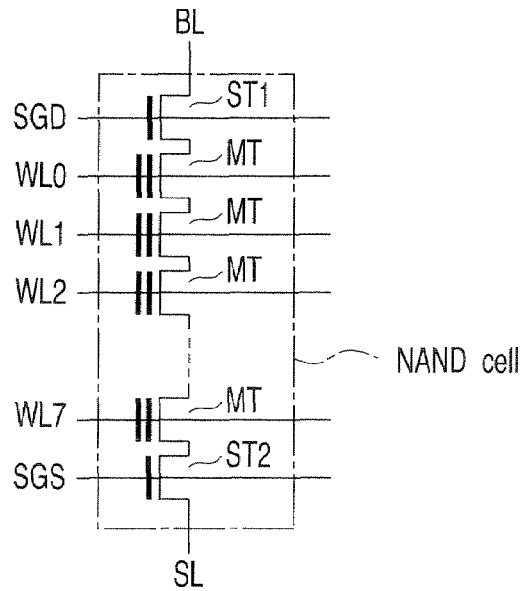
F I G. 32
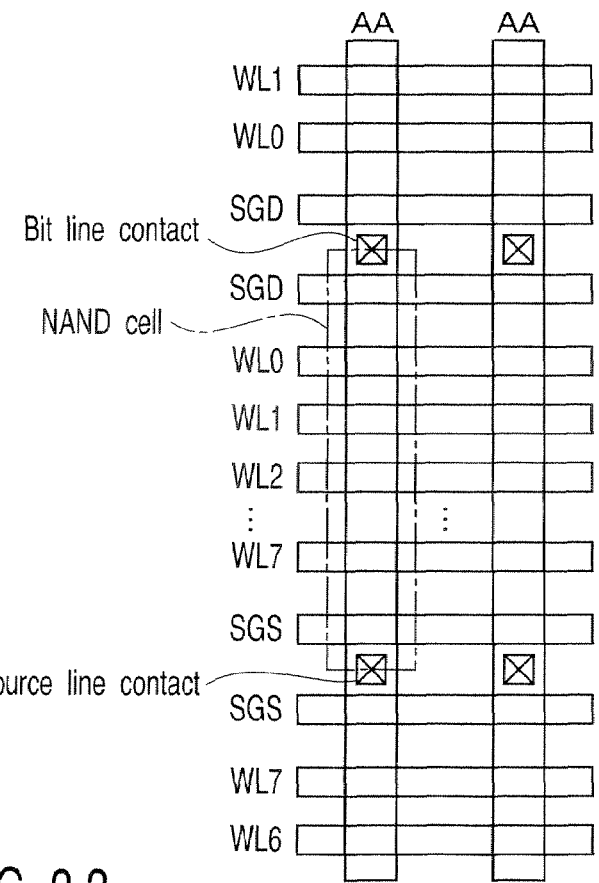
F I G. 33

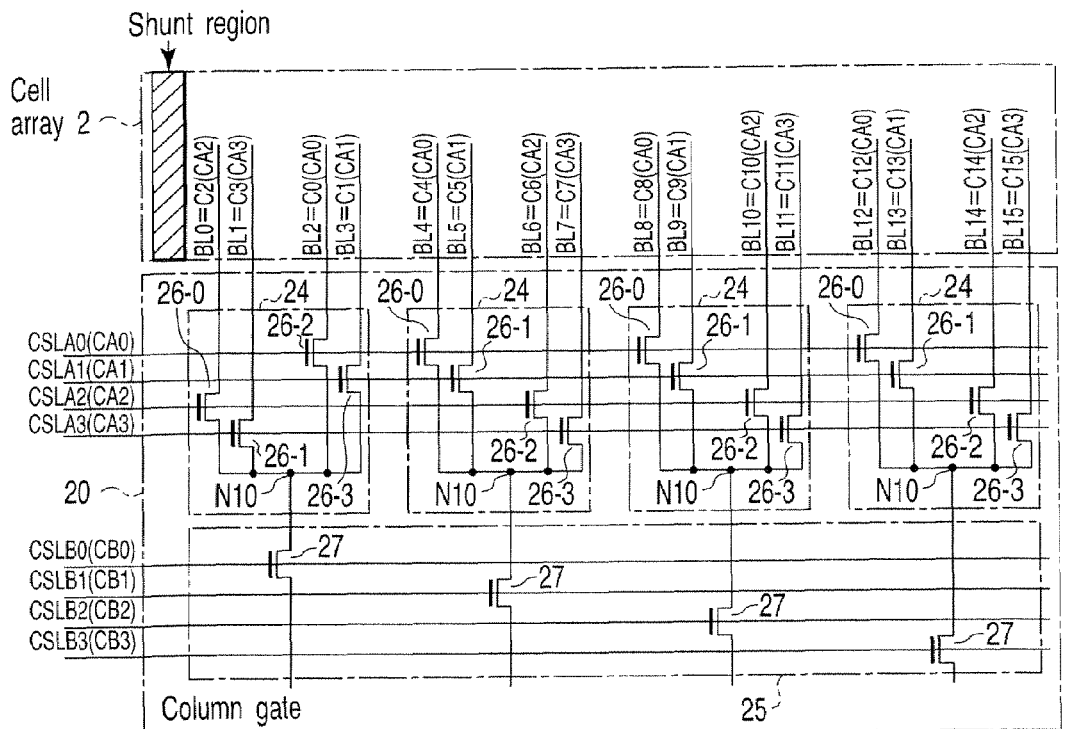
F I G. 37
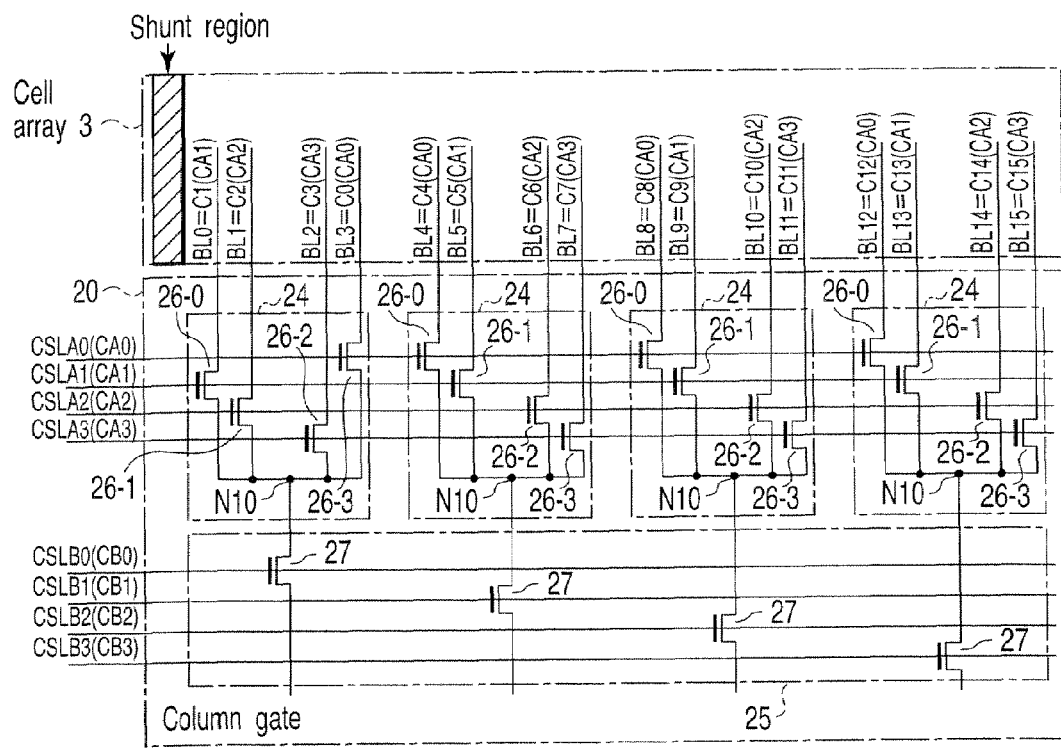
F I G. 38

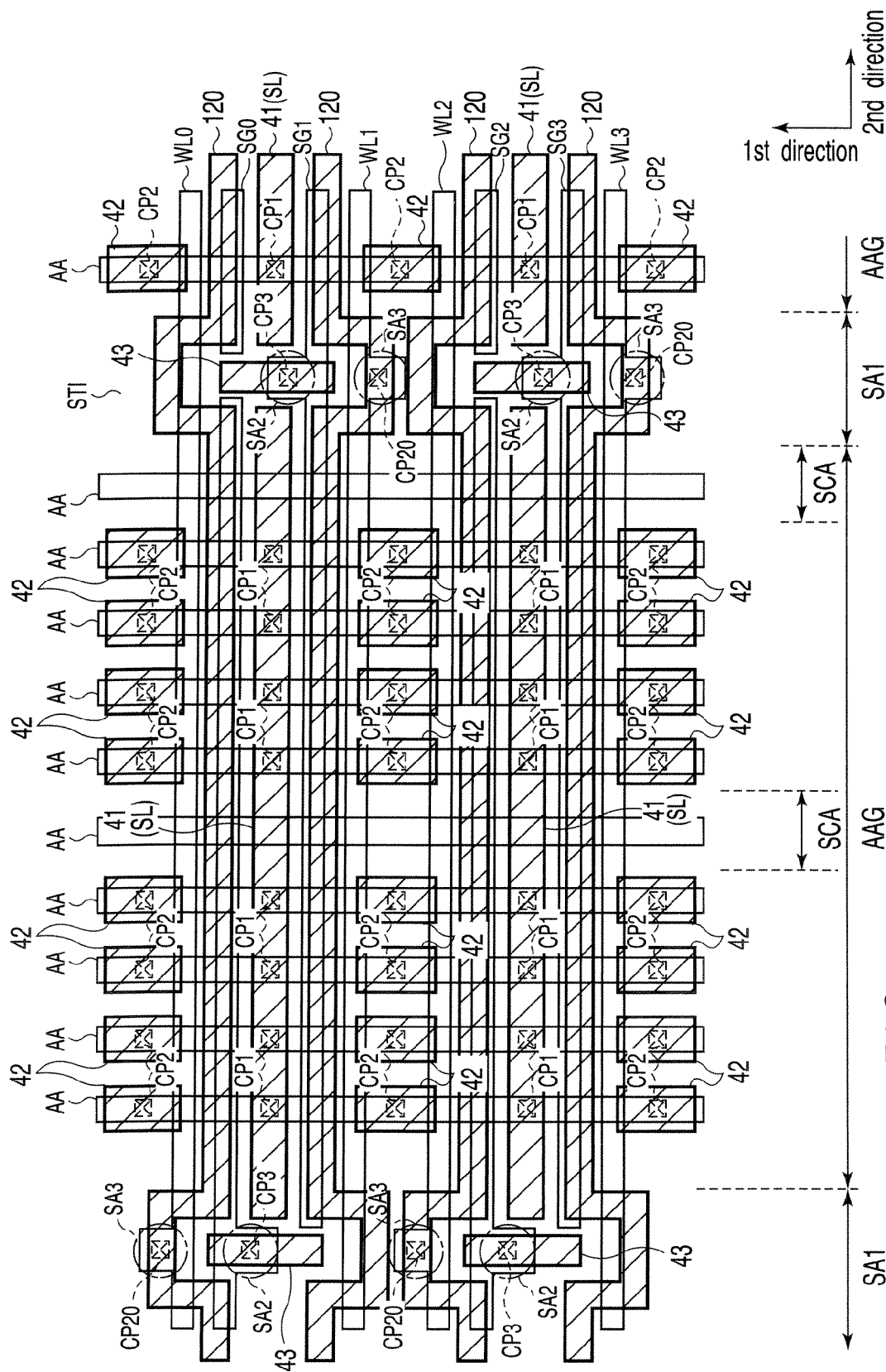
F I G. 55

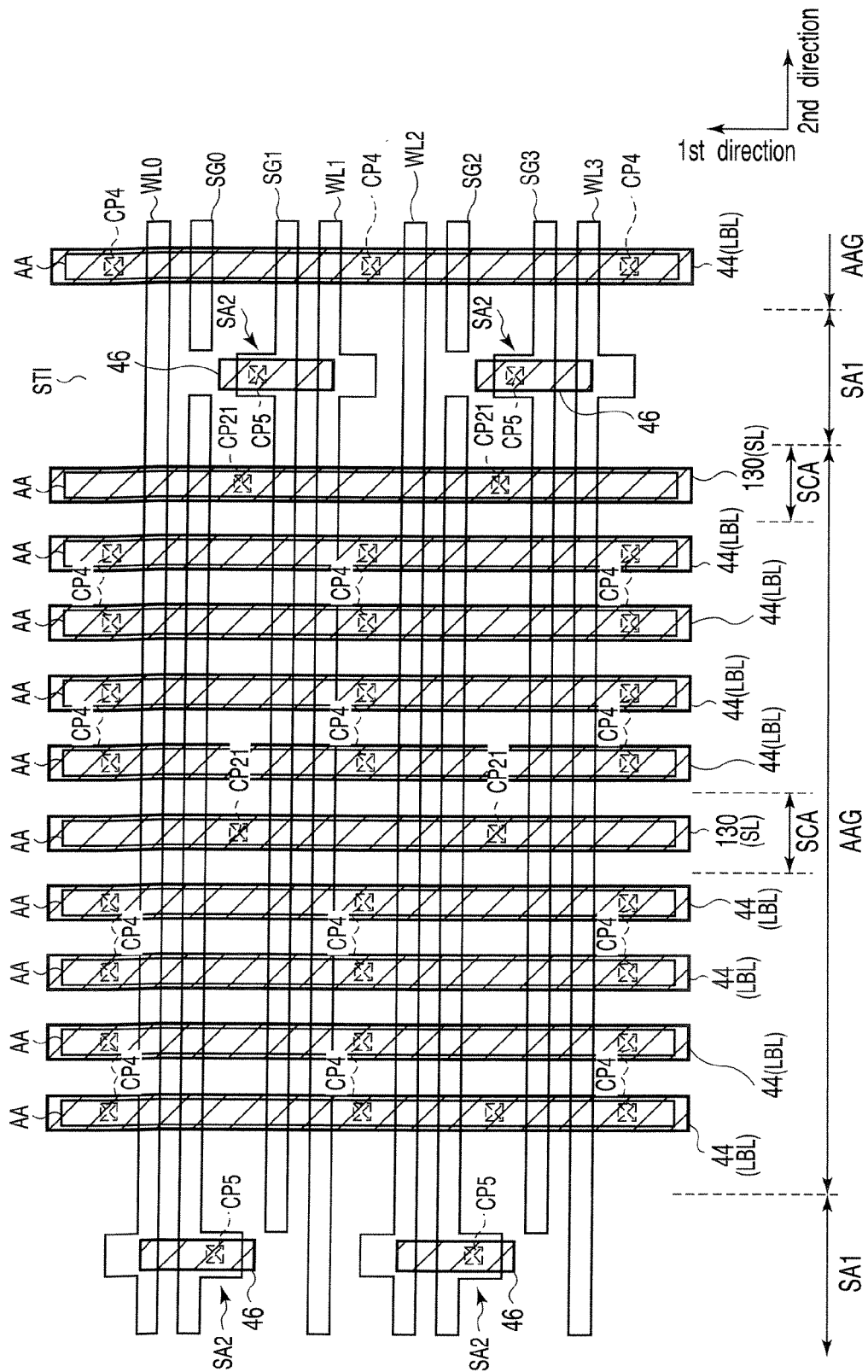
F I G. 56

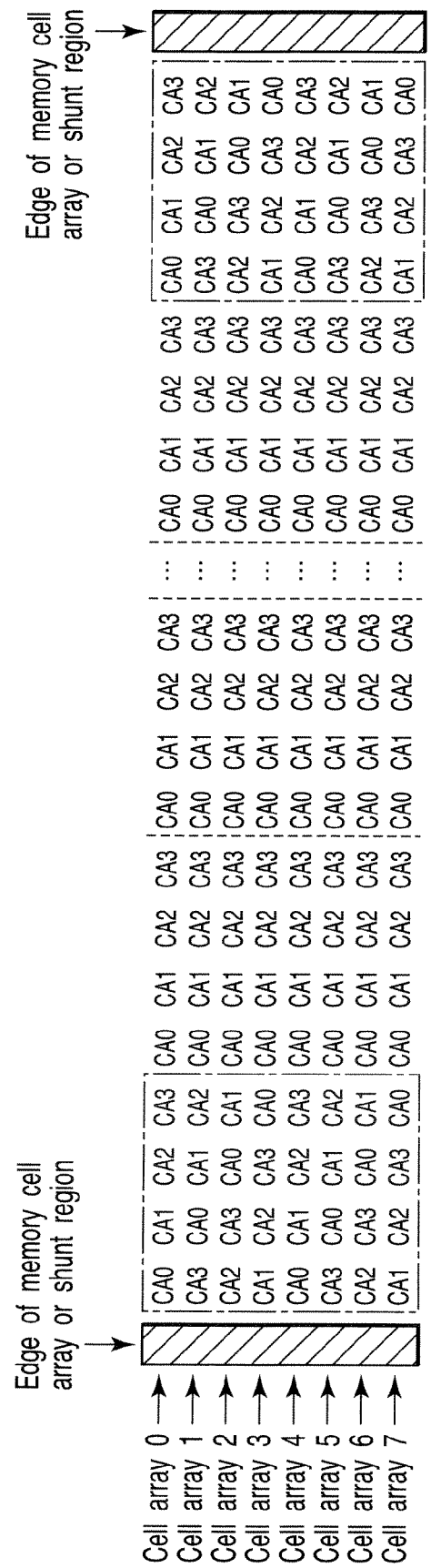
F I G. 61

SEMICONDUCTOR MEMORY DEVICE WITH MOS TRANSISTORS EACH HAVING FLOATING GATE AND CONTROL GATE

CROSS-REFERENCE TO RELATED APPLICATIONS

This application is based upon and claims the benefit of priority from prior Japanese Patent Application No. 2005-294741, filed Oct. 7, 2005, the entire contents of which are incorporated herein by reference.

BACKGROUND OF THE INVENTION

1. Field of the Invention

This invention relates to a semiconductor memory device. For example, this invention relates to a nonvolatile semiconductor memory with MOS transistors each having a floating gate and a control gate.

2. Description of the Related Art

Conventionally, NOR and NAND flash memories are known and widely used as nonvolatile semiconductor memory devices.

In recent years, a flash memory combining the features of the NOR flash memory and the NAND flash memory has been proposed. Hereinafter, such a type of flash memory is referred to as a 2Tr flash memory. A proposal relating to the 2Tr flash memory has been made in, for example, Wei-Hua Liu, "A 2-Transistor Source-select (2TS) Flash EEPROM for 1.8V-only Application," Non-Volatile Semiconductor Memory Workshop 4,1, 1997. Each memory cell of the 2Tr flash memory has two MOS transistors. One MOS transistor functions as a nonvolatile memory section. In addition, this MOS transistor comprises a control gate and a floating gate, and is connected to a bit line. The other MOS transistor is connected to a source line, and is used to select a memory cell.

In the flash memory, shunt wirings are used in order to apply a potential to a word line or a source line at a high speed. The shunt wires are each connected to the word line or the source line in an exclusive region (shunt region) provided in a memory cell array. Therefore, in the shunt region, the regularity of the memory cell arrays is distorted. Also in an edge of a memory cell array, the regularity is distorted. Thus, there has been a problem that a fault is very likely to occur with the word line or bit line which is adjacent to the edge of the memory cell array or shunt region, and, even if an error checking and correcting (ECC) circuit is used, it is difficult to recover a memory cell.

BRIEF SUMMARY OF THE INVENTION

A semiconductor memory device according to an aspect of the present invention comprises:

a plurality of memory cell arrays in which memory cells are arranged in a matrix;

word lines which connect commonly gates of the memory cells in a same row in the memory cell arrays;

bit lines which connect commonly drains of the memory cells in a same column in the memory cell arrays;

column gates each of which is provided on a memory cell array basis, the column gates selecting the bit lines in the memory cell arrays;

sense amplifiers each of which is provided on a memory cell array basis, the sense amplifiers amplifying data read out from the memory cells selected by the column gates; and an error correcting circuit which performs error correction of the read-out data, the memory cell arrays including:

first regions including first element isolating regions which have stripe shapes along the bit lines and which are formed to be cyclically repeated in a semiconductor substrate, and the memory cells formed on an element region between the adjacent element isolating regions, the first regions being arranged in plurality along the word line direction; and a second region provided adjacent to the first region in a direction along the word lines, the second region including a second element isolating region whose width along the word line direction is greater than that of the first element isolating region, addresses of the bit line adjacent to the second region being different from one another among the memory cell arrays.

A memory card according to an aspect of the present invention includes a semiconductor memory device, the device including:

a plurality of memory cell arrays in which memory cells are arranged in a matrix;

word lines which connect commonly gates of the memory cells in a same row in the memory cell arrays;

bit lines which connect commonly drains of the memory cells in a same column in the memory cell arrays;

column gates each of which is provided on a memory cell array basis, the column gates selecting the bit lines in the memory cell arrays;

sense amplifiers each of which is provided on a memory cell array basis, the sense amplifiers amplifying data read out from the memory cells selected by the column gates; and an error correcting circuit which performs error correction of the read-out data, the memory cell arrays including:

first regions including first element isolating regions which have stripe shapes along the bit lines and which are formed to be cyclically repeated in a semiconductor substrate, and the memory cells formed on an element region between the adjacent element isolating regions, the first regions being arranged in plurality along the word line direction; and a second region provided adjacent to the first region in a direction along the word lines, the second region including a second element isolating region whose width along the word line direction is greater than that of the first element isolating region, addresses of the bit line adjacent to the second regions being different from one another among the memory cell arrays.

BRIEF DESCRIPTION OF THE SEVERAL VIEWS OF THE DRAWING

FIG. 1 is a block diagram of a 2Tr flash memory in accordance with a first embodiment of the invention;

FIG. 2 is a block diagram of a memory cell array, a column select section, a data amplifier section, and a data hold section provided in the 2Tr flash memory in accordance with the first embodiment of the invention;

FIG. 4 is a circuit diagram of a cell array and a column gate provided in the 2Tr flash memory in accordance with the first embodiment of the invention;

FIG. 15 is a sectional view of a cell array provided in the 2Tr flash memory in accordance with the first embodiment of the invention, and is a sectional view taken along line 15-15 in FIG. 6;

FIG. 18 is a plan view of a memory cell array provided in the 2Tr flash memory in accordance with the first embodiment of the invention, and a view adopted to explain how shunt regions are arranged in the cell array;

FIG. 19 to FIG. 22 are circuit diagrams of a cell array and first column gates provided in the 2Tr flash memory in accordance with the first embodiment of the invention;

FIG. 31 a diagram showing a relationship between a selected column and a possibility of ECC correction in the cell arrays provided in the flash memory in accordance with the first embodiment of the invention;

FIG. 32 is a circuit diagram of a NAND cell provided in a NAND flash memory;

FIG. 33 is a plan view of a NAND cell provided in a NAND flash memory;

FIG. 35 to FIG. 38 are circuit diagrams of a cell array and a column gate provided in a 2Tr flash memory comprises in accordance with the second embodiment of the invention;

FIG. 55 is a plan view of a cell array provided in the 2Tr flash memory in accordance with the sixth embodiment of the invention, the showing a first-layer metal wiring layer;

FIG. 56 is a plan view of a cell array provided in the 2Tr flash memory in accordance with the sixth embodiment of the invention, the view showing a second-layer metal wiring layer;

FIG. 61 is a conceptual view showing a relationship between each of cell arrays provided in a flash memory in accordance with a second modified example of the first to eighth embodiments of the invention and a column address thereof;

DETAILED DESCRIPTION OF THE INVENTION

Figure 3:
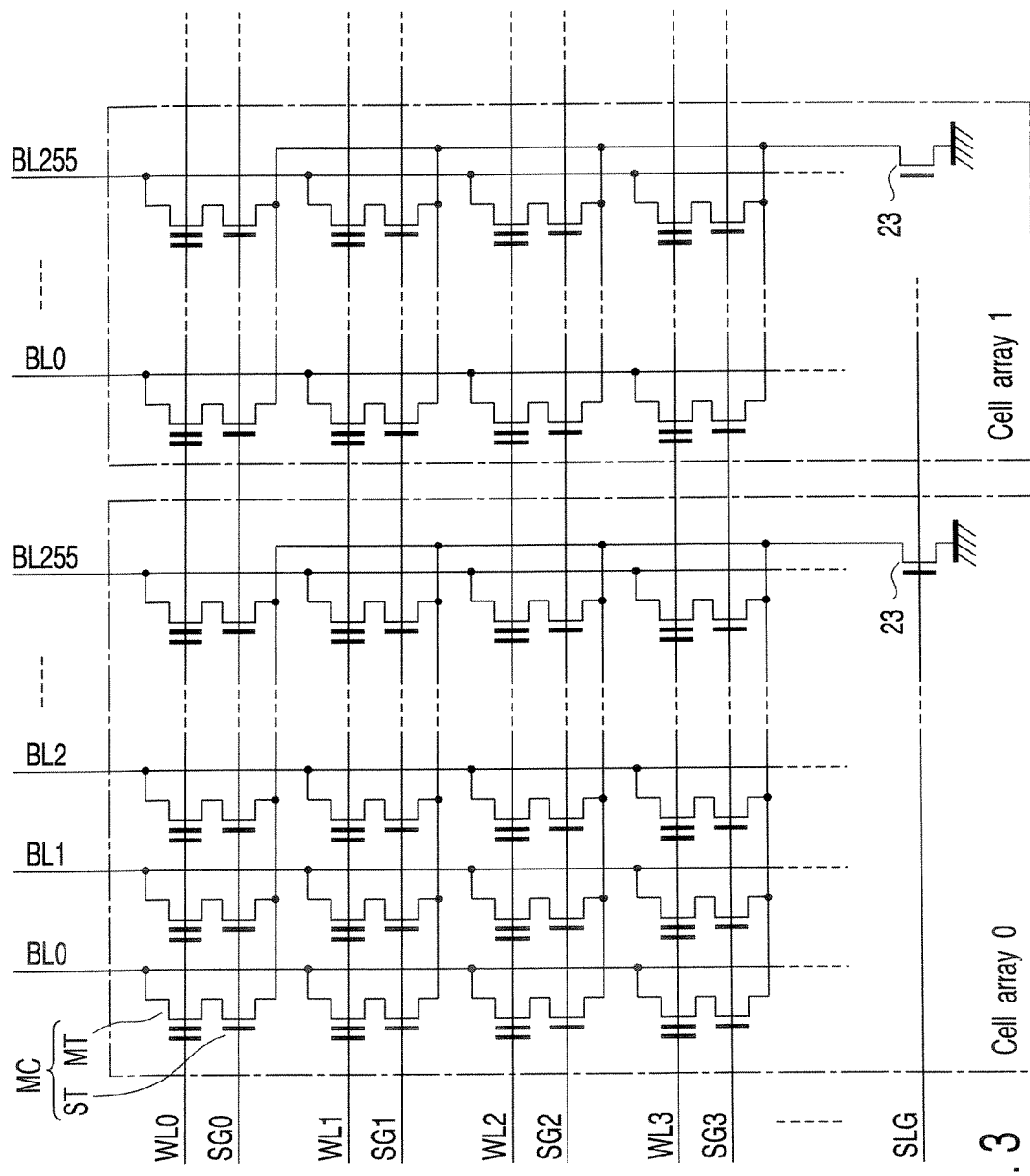
FIG. 3 is a circuit diagram of cell arrays provided in the 2Tr flash memory in accordance with the first embodiment of the invention.

Hereinafter, a semiconductor memory device in accordance with a first embodiment of the invention will be described with reference to FIG. 1. FIG. 1 is a block diagram of a 2Tr flash memory in accordance with the present embodiment.

As shown in the figure, a flash memory 1 comprises a memory cell array 10, a row decoder 11, a source line driver 12, a column select section 13, a data amplifier section 14, a data hold section 15, an ECC circuit 16, an input/output buffer 17, a control circuit 18, and a voltage generating circuit 19.

The memory cell array 10 comprises a plurality of memory cells arranged in a matrix. The row decoder 11 selects a row of the memory cell array 10. The source line driver 12 applies a voltage to a source line of the memory cell array 10. The column select section 13 selects a column of the memory cell array 10. The data amplifier section 14 amplifies data read out from a memory cell. The data hold section 15 temporarily latches data. The ECC circuit 16 detects whether or not an error occurs with data, and corrects the data in the case where an error occurs. The input/output buffer 17 captures an external signal and outputs read-out data to the outside. The control circuit 18 controls an operation of each circuit block in accordance with an externally assigned command. The voltage generating circuit 19 generates a voltage required for the above circuit block to operate.

FIG. 2 is a block diagram of the memory cell array 10, the column select section 13, the data amplifier section 14, and the data hold section 15. As shown in the figure, the memory cell 10 comprises a plurality of cell arrays 0 to j (j is a natural number of 1 or more) and ECC cell arrays 0 to k (k is a natural number of 1 or more). The cell arrays 0 to j and the ECC cell arrays 0 to k comprise a plurality of memory cells. The column select section 13 comprises column gates 20 provided in association with the cell arrays 0 to k and the ECC cell arrays 0 to k, respectively. Each column gate 20 selects any one column in each of the corresponding cell arrays 0 to j or each of the ECC cell arrays 0 to k. The data amplifier section 14 comprises sense amplifiers 21 provided to the column gates 20, respectively. Each sense amplifier 21 converts data read out from a memory cell in the column selected by the column gate 20 from an analog value to a digital value. The data hold section 15 comprises latch circuits 22 provided every sense amplifier 21. Each latch circuit 22 latches data read out from the corresponding sense amplifier 21 or data to be written into the corresponding column.

FIG. 3 is a circuit diagram of the cell arrays 0 to j. FIG. 3 shows only the cell arrays 0 and 1. As shown in the figure, each of the cell arrays 0 to j has a plurality of memory cells MC (for example, 256×256 without being limited thereto) arranged in a matrix. The memory cell MC is a 2Tr flash cell. Specifically, each of the memory cells MC includes a memory cell transistor MT and a select transistor ST for which current paths are connected in series. The memory cell transistor MT has a stacked gate structure that includes a floating gate formed on a semiconductor substrate with a gate insulating film interposed therebetween and a control gate formed on the floating gate with an inter-gate insulating film interposed therebetween. A source region of the memory cell transistor is connected to a drain region of the select transistor ST. In addition, memory cells MC adjoining each other in the column direction share the source region of the select transistor ST or the drain region of the memory cell transistor MT.

The control gates of the memory cell transistors MT of the memory cells MC in a same row are connected commonly to any one of word lines WL0 to WL255. Gates of the select transistors ST of the memory cells in a same row are connected commonly to any one of select gate lines SG0 to SG255. Drains of the memory cell transistors MT of the memory cells MC in a same column are connected commonly to any one of bit lines BL0 to BL255. In addition, sources of the select transistors ST of the memory cells MC are connected commonly to a source line SL, and are connected to a grounding potential via a current path of a MOS transistor 23. A gate of the MOS transistor 23 is controlled by the source line driver 12.

The ECC cell arrays 0 to k also have the configuration similar to that of the above cell arrays 0 to j. In addition, word lines and select gate lines are connected commonly among the plurality of cell arrays 0 to j and among the plurality of ECC cell arrays 0 to k, and are selected by the row decoder 11.

FIG. 4 is a circuit diagram of a cell array 0 and a column gate 20 which corresponds to the cell array 0. This also applies to the cell arrays 1 to j and the BCC cell arrays 0 to k.

As shown in the figure, the cell array 0 comprises 256 bit lines BL0 to BL255. Shunt regions SA1 are provided in cell array at intervals of 64 bit lines, for example. The shunt region SA1 is a region used to connect a select gate line to a shunt wire of the select gate line. A detailed description will be given later.

The column gate 20 comprises a plurality of first column gates 24 and second column gates 25. Each of the first column gates 24 is provided for a set of a plurality of bit lines, for example, n bit lines (n is a natural number of 2 or more), and comprises MOS transistors 26 provided for individual bit lines. In each of the first column gates 24, one end of a current path of the MOS transistor 26 is connected to the corresponding bit line, and the other end is connected commonly to the other MOS transistors 26 (hereinafter, this common junction node is referred to as a node N10). In addition, a gate of the MOS transistor 26 is connected to any one of n first column select lines CSLA0 to CSLA(n−1). In the individual first column gates 24, the gates of n MOS transistors 26 are connected to the first column select lines which are different from each other. Therefore, each of the first column select lines CSLA0 to CSLA(n−1) connects commonly a gate of one MOS transistor 26 in each of the first column gates 24.

Each second column gate 25 comprises MOS transistors 27 provided for each of the first column gates 24. One end of a current path of the MOS transistor 27 is connected to any node N10, and the other end is connected commonly to the other MOS transistors 27 (hereinafter, this common junction node is referred to as a node N11). The gates of the MOS transistors 27 are connected to the second column select lines CSLB0 to CSLB(m−1), respectively. However, "m" denotes a natural number of 2 or more, and is equal to the number of first column gates 24.

The first and second column select lines CSLA and CSLB are selected in accordance with column addresses by the control circuit 18. The node N11 is connected to the sense amplifier 21. Therefore, while in data readout, data can be read out from a plurality of cell arrays at the same time, but the data which can be read out by the sense amplifier 21 once for each cell array is limited to one bit line.

Figure 5:
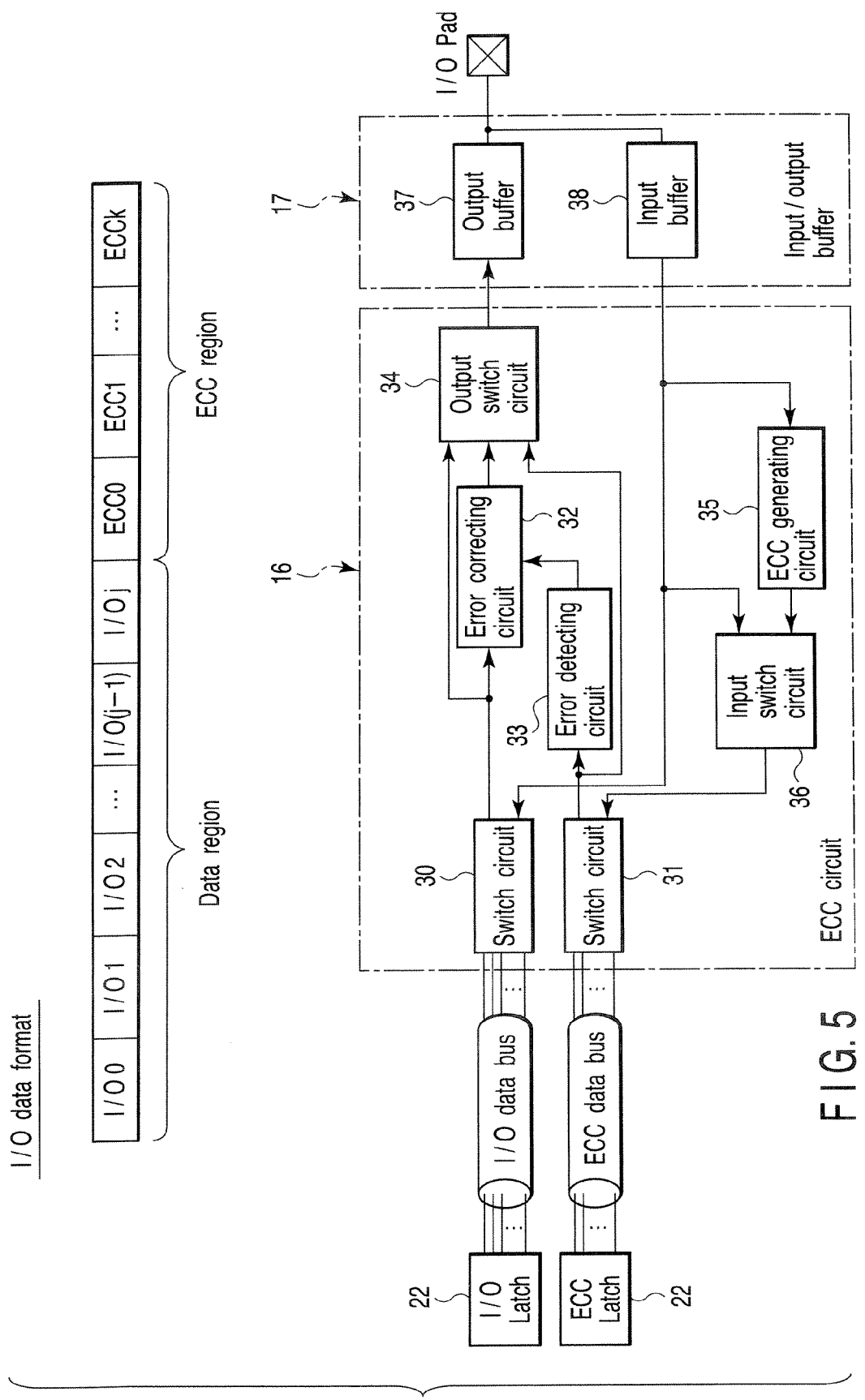
FIG. 5 is a block diagram of an ECC circuit and an input/output buffer provided in the 2Tr flash memory in accordance with the first embodiment of the invention.

FIG. 5 is a circuit diagram of the ECC circuit 16 and the input/output buffer 17. As shown in the figure, the input/output buffer 17 comprises an output buffer 37 and an input buffer 38. The output buffer 37 holds readout data outputted from the ECC circuit 16 and the input buffer 38 holds write data input from the outside.

The ECC circuit 16 comprises switch circuits 30 and 31, an error correcting circuit 32, an error detecting circuit 33, an output switch circuit 34, an ECC generating circuit 35, and an input switch circuit 36. In the following description, data to be read out from the cell arrays 0 to j and data to be written therein are referred to as I/O data, and data to be read out from the ECC cell arrays 0 to k and data to be written therein are referred to as ECC data.

The switch circuit 30 transfers I/O data to the error correcting circuit 32, output switch circuit 34 or the latch circuit 22. The switch circuit 31 transfers ECC data to the error detecting circuit 33, output switch circuit 34 or the latch circuit 22. The error detecting circuit 33 detects whether or not an error occurs with data on the basis of the ECC data. The error correcting circuit 32 corrects an error of I/O data on the basis of the result of the detection in the error detecting circuit 33. The output switch circuit 34 outputs to the output buffer 37 any of the I/O data, the ECC data, and the output of the error correcting circuit 32. The ECC generating circuit 35 generates ECC data on the basis of the I/O data output from the input buffer 38. The input switch circuit 36 outputs the I/O data or the output of the ECC generating circuit 35 to the switch circuit 31.

An operation of the above configured ECC circuit 16 will be briefly described here. As described previously, the readout data from the memory cell array 10 is read out as an I/O data string of a maximum of (j+1) bits and an ECC data string of (k+1) bits. The bits of the I/O data string are read out from the cell arrays 0 to j, respectively, (these bits are referred to as I/O0 to I/Oj), and the bits of the ECC data string are read out from the ECC cell arrays 0 to k, respectively (these bits are referred to as ECC0 to ECCk). The ECC circuit 16 corrects h bits (h is a natural number of 1 or more) from the I/O data string of (j+1) bits on the basis of the ECC data string of (k+1) bits.

The I/O data read out from the cell arrays 0 to j are amplified by the sense amplifier 21, and the amplified data are latched by the latch circuit 22. Then, the latched data are input to the ECC circuit 16 as the I/O data string of (j+1) bits. In addition, the ECC data read out from the ECC cell arrays 0 to k are amplified by the sense amplifier 21 and the amplified data are latched by the latch circuit 22. Then, the latched data are input to the ECC circuit 16 as the ECC data string of (k+1) bits via an ECC data bus.

In the case where data is read out from the memory cell array 10, the switch circuit 30 sends the I/O data read out via the I/O data bus to the error correcting circuit 32 in the ECC circuit 16. The switch circuit 31 sends the ECC data read out via the ECC data bus to the error detecting circuit 33. The error detecting circuit 33 determines whether or not an error occurs on the basis of the ECC data sent from the switch circuit 31. When it has been determined that no error occurs, the error detecting circuit 33 outputs to the error detecting circuit 32 a data string obtained in the case where no error correction is carried out. When it has been determined that an error occurs and the error can be corrected, the error detecting circuit 33 outputs to the error correcting circuit 32 a data string (syndrome data) for data correction. When correction is disabled, the error detecting circuit 33 outputs to the control circuit information indicating that an error occurs without correcting it. When no error occurs or error is corrected, the error correcting circuit 32 outputs the I/O data to the output switch circuit 34 as it is. When an error is corrected, the error correcting circuit 32 corrects the error by using the syndrome data imparted from the error detecting circuit 33, and outputs the corrected I/O data to the output switch circuit 34. The output switch circuit 34 outputs to the output buffer 37 the data sent from the error correcting circuit 32. In FIG. 5, a path which bypasses the error correcting circuit 32 and the error detecting circuit 33 is a testing path for checking whether or not the ECC circuit 16 operates normally.

When data is written into the memory cell array 10, the I/O data (write data) of (j+1) bits is input from the input buffer 38 to the ECC circuit 16. Then, the ECC generating circuit 35 generates the ECC data of (k+1) bits by using the I/O data. The input switch circuit 36 outputs the ECC data to the switch circuit 31, and the switch circuit 31 outputs the ECC data via the data bus to the latch circuit 22 which corresponds to each of the ECC cell arrays 0 to k. In addition, the switch circuit 30 outputs the I/O data transferred from the input buffer via the I/O bus to the latch circuit 22 which corresponds to each of the cell arrays 0 to j. The input switch circuit 36 can select ECC data directly input from the outside in order to test the operation of the ECC circuit.

Hereinafter, a case in which a correction enable bit is 1 bit (h=1) will be described by way of example.

Figure 6:
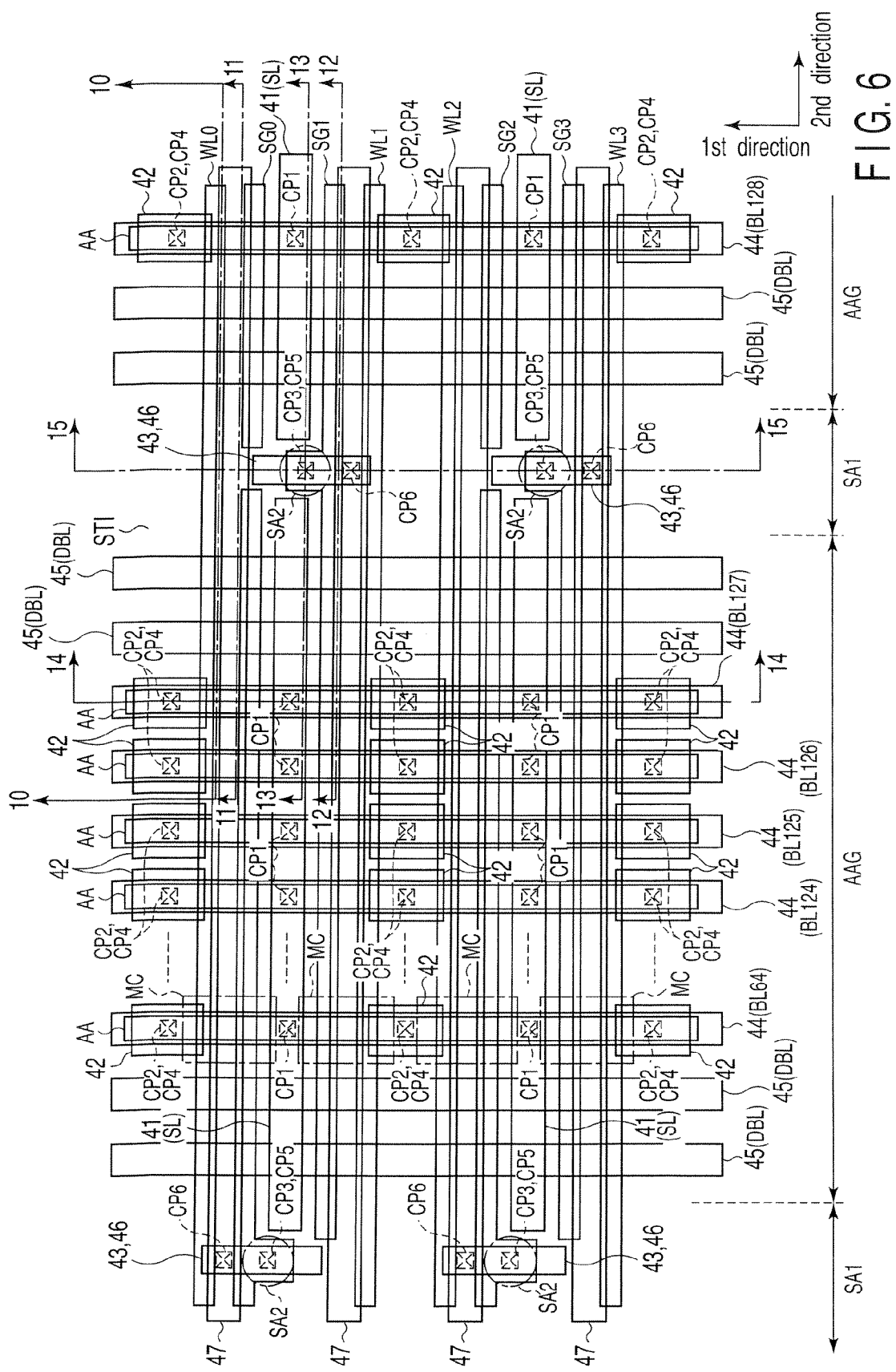
FIG. 6 is a plan view of a cell array provided in the 2Tr flash memory in accordance with the first embodiment of the invention.
Figure 7:
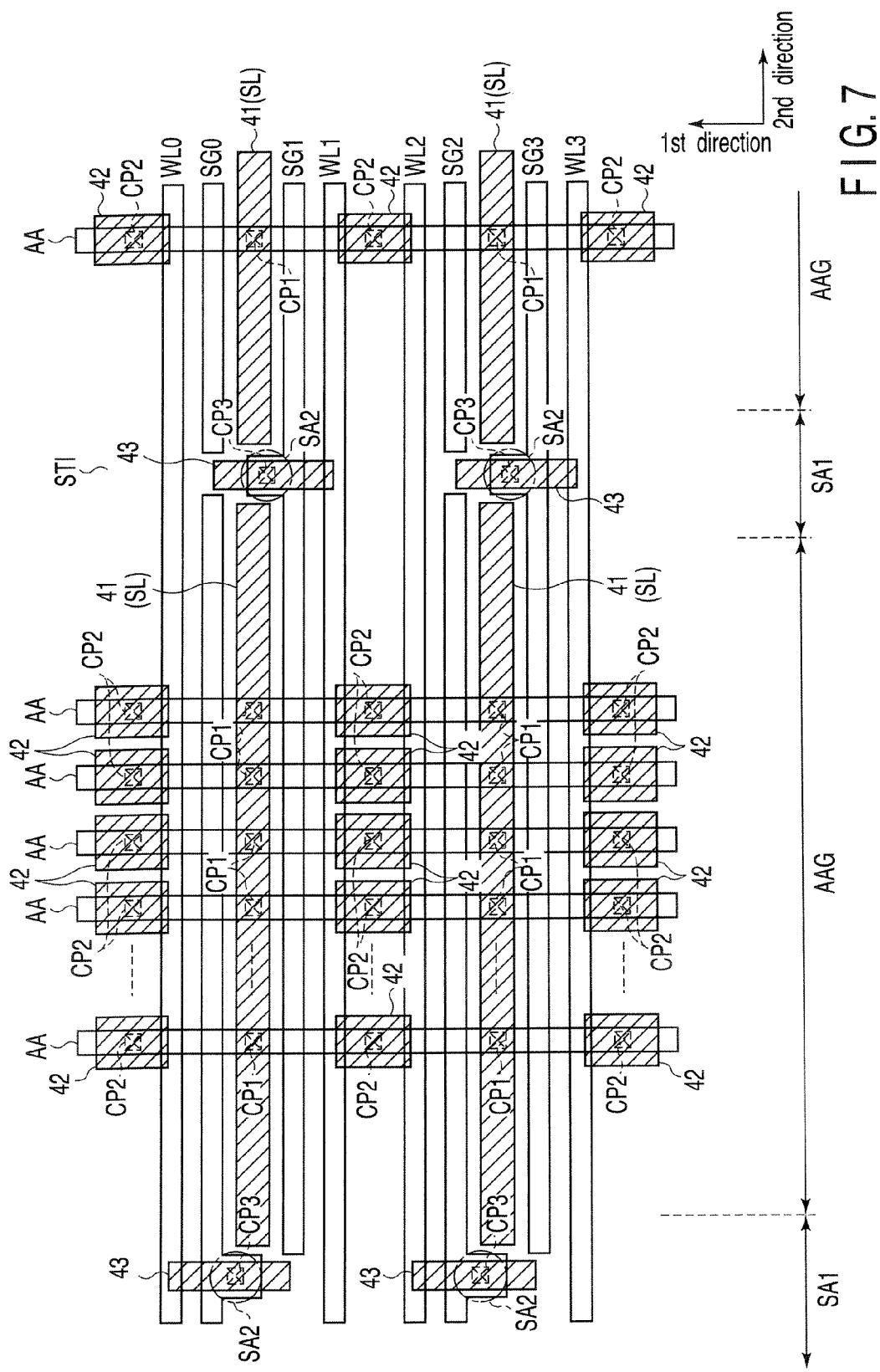
FIG. 7 is a plan view of a cell array provided in the 2Tr flash memory in accordance with the first embodiment of the invention, the view showing a first-layer metal wiring layer.
Figure 8:
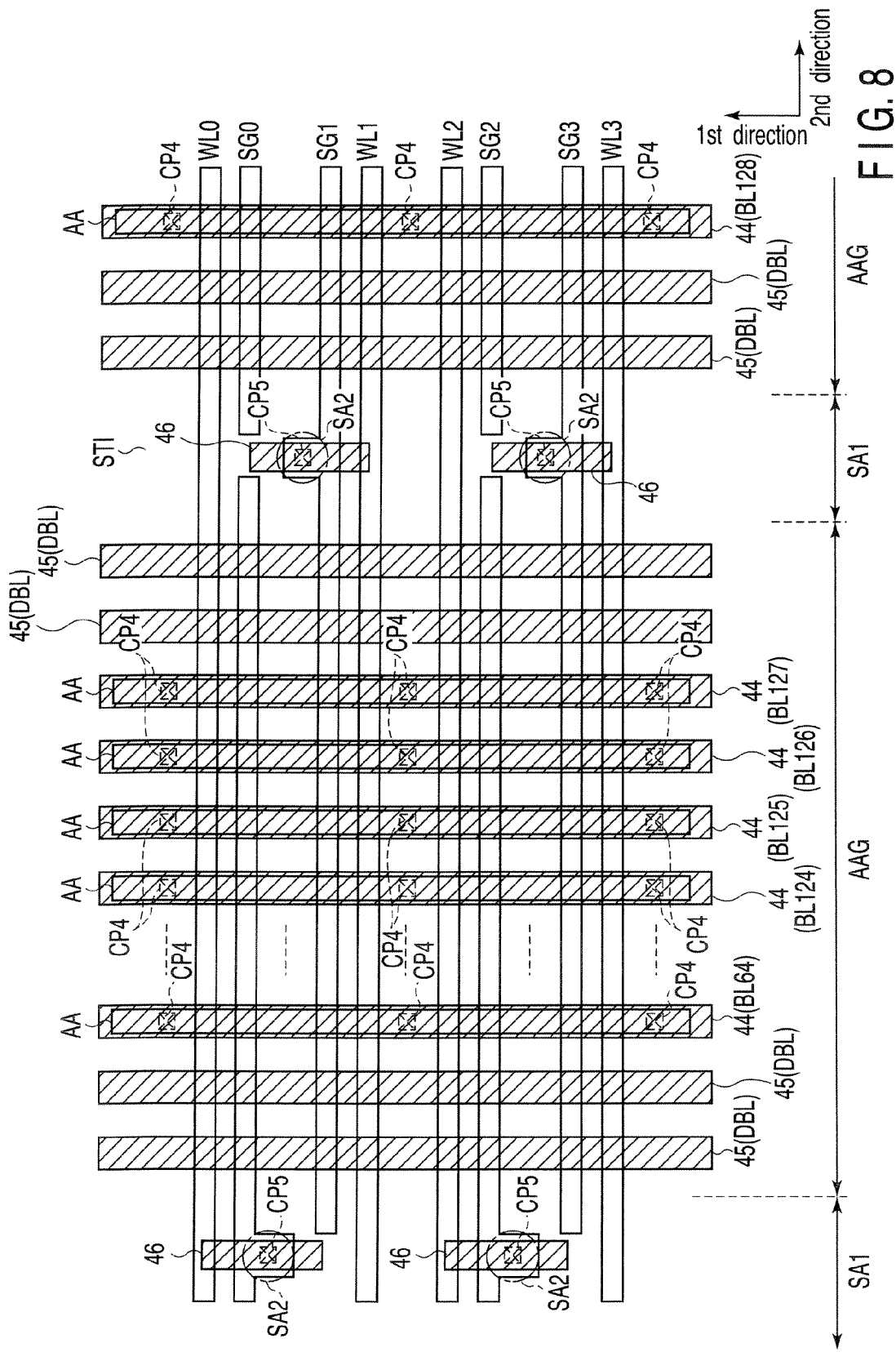
FIG. 8 is a plan view of a cell array provided in the 2Tr flash memory in accordance with the second embodiment of the invention, the view showing a second-layer metal wiring layer.
Figure 9:
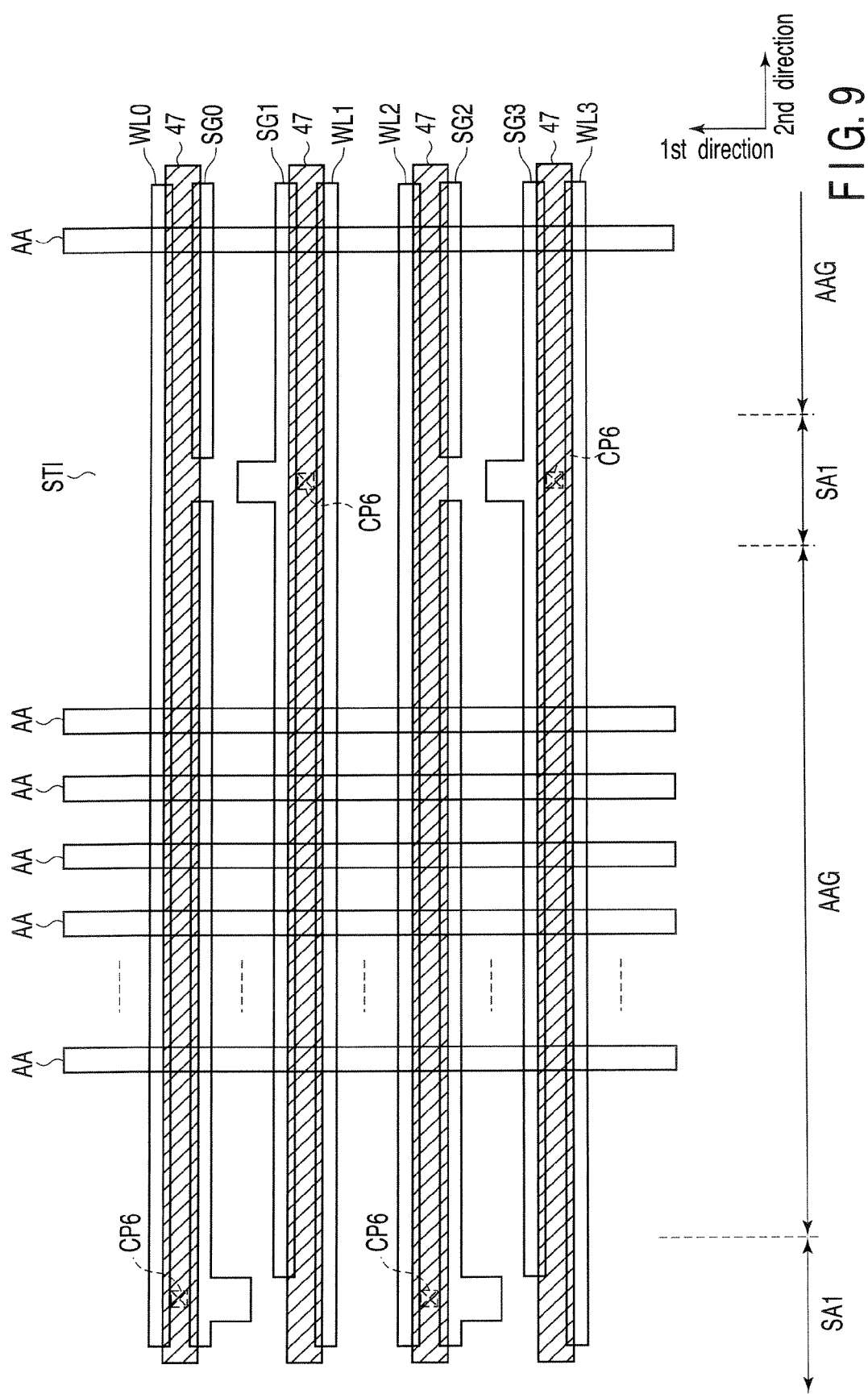
FIG. 9 is a plan view of a cell array provided in the 2Tr flash memory in accordance with the third embodiment of the invention, the view showing a third-layer metal wiring layer.

Now, a plane structure of the arrays 0 to j of the 2Tr flash memory 1 will be described with reference to FIGS. 6 to 9. FIG. 6 is a plan view of a partial region of the memory cell array 10, and particularly, shows a region including the bit lines BL64 to BL128. FIGS. 7 to 9 are plan views showing plane patterns of metal wiring layers of a first to a third layer, respectively, together with element regions, word lines, and select gate lines. In FIGS. 7 to 9, the regions shown correspond to those in FIG. 6.

As shown in FIGS. 6 to 9, in a semiconductor substrate (p-well region) 40, a plurality of strip-shaped element regions AA in a first direction are formed in a second direction perpendicular to the first direction. Strip-shaped word lines WL0 to WL255 and select gate lines SG0 to SG255, which extend in the second direction, are formed so as to cross the element regions AA. In the regions where the word lines WL0 to WL255 cross the element regions AA, memory cell transistors MT are formed. On the other hand, in the regions where the select gate lines SG0 to SG255 cross the element regions AA, select transistors ST are formed.

The memory cell transistors MT have floating gates (not shown) separated from each other on a memory cell transistor MT basis. Like the memory cell transistors MT, the select transistors ST have control gates and floating gates. However, unlike the memory cell transistors MT, the select transistors ST have their floating gates connected in such a manner that select transistors ST adjoining in the second direction share a floating gate. Adjacent memory cells have their select gate lines SG or word lines WL adjoining each other.

Hereinafter, in a cell array, a region where a block of 64 bit lines BL has been formed is referred to as an element region group AAG. That is, each of the cell arrays 0 to j having 255 bit lines comprises (256/64)=4 element region groups AAG, and each element region group AAG includes bit lines BL0 to BL63, bit lines BL64 to BL127, bit lines BL128 to BL191, and bit lines BL192 to BL255. That is, 64 element regions AA exist in one element region group AAG, and these regions are arranged at equal intervals. A shunt region SA1 is provided between the adjacent element region groups AAG. In the first embodiment, no element region AA is formed in the shunt region SA1. Note that word lines and select gate lines are formed on the shunt region SA1 as well. However, the word lines and select gate lines existing in the shunt region SA1 do not practically constitute the memory cells. In the shunt region SA1, a part of the select gate lines SG0 to SG255 is made wider to be formed a contact plug electrically connected to a metal wiring layers 47 described later. The region made wider in a select gate line is referred to as a shunt region SA2. The shunt regions SA2 are provided in the select gate lines SG0 to SG255 alternately in the second direction. Specifically, in a certain shunt region SA1, a shunt region SA2 is formed in each of the select gate lines SG0, SG2, SG4, . . . SG254, and, in another shunt region SA1 adjacent to the shunt region SA1, a shunt region SA2 is formed in each of the select gate lines SG1, SG3, SG5, . . . SG255. The select gate lines where no shunt region SA2 is formed are partly removed in the shunt regions SA1. The select gate line at the shunt region SA2 is formed so as to project toward the adjacent select gate lines.

Next, using FIGS. 6 and 7, a pattern of a first-layer metal wiring layer existing on the word lines WL0 to WL255 and select gate lines SG0 to SG255 will be explained. In FIG. 7, the shaded region is the first-layer metal wiring layer.

As shown in FIG. 7, between adjacent select gate lines SG (between SG0 and SG1, between SG2 and SG3, . . . ), a strip-shaped metal wiring layer 41 extending in the second direction is formed. The metal wiring layer 41 functions as a source line SL. The metal wiring layers 41 are separated from one another by the shunt regions SA1 in its longitudinal direction (or the second direction). That is, the metal wiring layers 41 are independent on an element region group AAG basis. Each of the metal wiring layers 41 is connected to the source region of the select transistor ST by a contact plug CP1. Above the drain region of the memory cell transistor MT, an island pattern of metal wiring layer 42 is formed. The metal wiring layers 42 are separated from one another. Each of the metal wiring layers 41 is connected to the drain region of the corresponding memory cell transistor MT by a contact plug CP2. Therefore, a plurality of grouped metal wiring layers 42 arranged in the second direction and a plurality of strip-shaped metal wiring layers 41 arranged in the second direction are provided alternately in the first direction. Further, above the shunt region SA2, an island pattern of metal wiring layer 43 is formed. The metal wiring layer 43 is connected to the shunt region SA2 of the corresponding select gate line SG by a contact plug CP3. The metal wiring layer 43 is extended in the first direction from the top of the corresponding select gate line SG to the top of the region from which the adjacent select gate line SG has been removed.

Next, using FIGS. 6 and 8, a pattern of a second-layer metal wiring layer existing on first-layer metal wiring layers 41 to 43 will be explained. In FIG. 8, the shaped region is the second-layer metal wiring layer As shown in FIG. 8, in an element region group AAG, strip-shaped metal wiring layers 44 are formed in the first direction above the element regions AA. The metal wiring layers 44 function as bit lines LBL0 to LBL3. The metal wiring layers 44 are connected to the first-layer metal wiring layer 42 by contact plugs CP4. Therefore, each of the element region groups AAG comprises 64 metal wiring layers 44. In addition, a plurality of metal wiring layers 45 are provided to be adjacent to the metal wiring layers 44. The metal wiring layers 45 are formed as dummy bit lines DBL, and are provided on a two by two basis in a region adjacent to the shunt region SA1 in the element region group AAG. The metal wiring layers 45 have a strip shape in the first direction, and have the same plane pattern as that of the metal wiring layers 44. Any number of dummy bit lines CBL may be provided without being limited to two. In the shunt region SA1, a island pattern of metal wiring layer 46 is formed. The metal wiring layers 46 are formed so as to correspond to the first-layer metal wiring layers 43. The metal wiring layers 46 are connected to the metal wiring layers 43 by contact plugs CP5. While in FIGS. 6 and 8, the contact plugs CP5 are directly above the shunt regions SA2, the present embodiment is not limited to this, as long as the contact plugs CP5 are provided in positions where the metal wiring layers 43 and 46 can be connected.

Next, using FIGS. 6 and 9, a pattern of a third-layer metal wiring layer existing on the second-layer metal wiring layers 44 to 46 will be explained. In FIG. 9, the shaded region is the third-layer metal wiring layer.

As shown in FIG. 9, strip-shaped metal wiring layers 47 are formed in the second direction. The metal wiring layers 47 are formed for sets of word line and select gate line (a set of WL0 and SG1 and a set of WL1 and SG1, . . . ) in a one-to-one correspondence. The metal wiring layers 47 are connected by contact plugs CP6 to the second-layered metal wiring layers 46 electrically connected to the corresponding select gate lines. Specifically, each of the metal wiring layers 47 functions as a shunt wire for each of the select gate wires SG0 to SG255. Each of the metal wiring layers 47 is formed in a region between the central part of a word line WL and the central part of the select gate line SG corresponding to the word line WL. In other words, the metal wiring layer 47 runs through the central part of the memory cell MC. Therefore, the metal wiring layers 47 are arranged at equal intervals in the first direction.

In the above-described configuration, the word lines WL0 to WL255, select gate lines SG0 to SG255, and shunt wire 47 are connected commonly among the cell arrays 0 to j and ECC cell arrays 0 to k.

As described above, in the element region group AAG of the memory cell array 10, the stripe-shaped element regions AA are cyclically repeatedly formed in the semiconductor substrate in a bit line direction. Memory cells are formed on this element region. The shunt region SA1 is provided between the adjacent element region groups AAG. The element isolating region is formed in the shunt region SA1, and its width is greater than a width between the adjacent element regions AA in the element region group AAG.

Next, a sectional structure of the flash memory configured as described above will be explained. First, using FIGS. 10 to 14, a sectional structure of the element region group AAG will be explained. FIGS. 10 to 13 are sectional views taken along line 10-10, along line 11-11, along line 12-12, and along line 13-13 in FIG. 6, respectively. FIG. 14 is a sectional view taken along line 14-14 in FIG. 6.

As shown in the figures, at the surface of the p-type semiconductor substrate 40, an n-well region 50 is formed. At the surface of the n-well region 50, a p-well region 51 is formed. In the p-well region 51, an element isolating region STI is formed. The region surrounded by the element isolating region STI is formed as an element region AA. On the element region AA of the p-well region 51, a gate insulation film 52 is formed. On the gate insulating film 52, the gate electrodes of a memory cell transistor MT and a select transistor ST are formed. Each of the gate electrodes of the memory cell transistor MT and the select transistor ST includes a polysilicon layer 53 formed on the gate insulating film 52, an inter-gate insulating film 54 formed on the polysilicon layer 53, and a polysilicon layer 55 formed on the inter-gate insulating film 54. The inter-gate insulating film 54 is made of, for example, a silicon oxide film or an ON film, NO film, or ONO film having a stacked structure of a silicon oxide film and a silicon nitride film.

Figure 10:
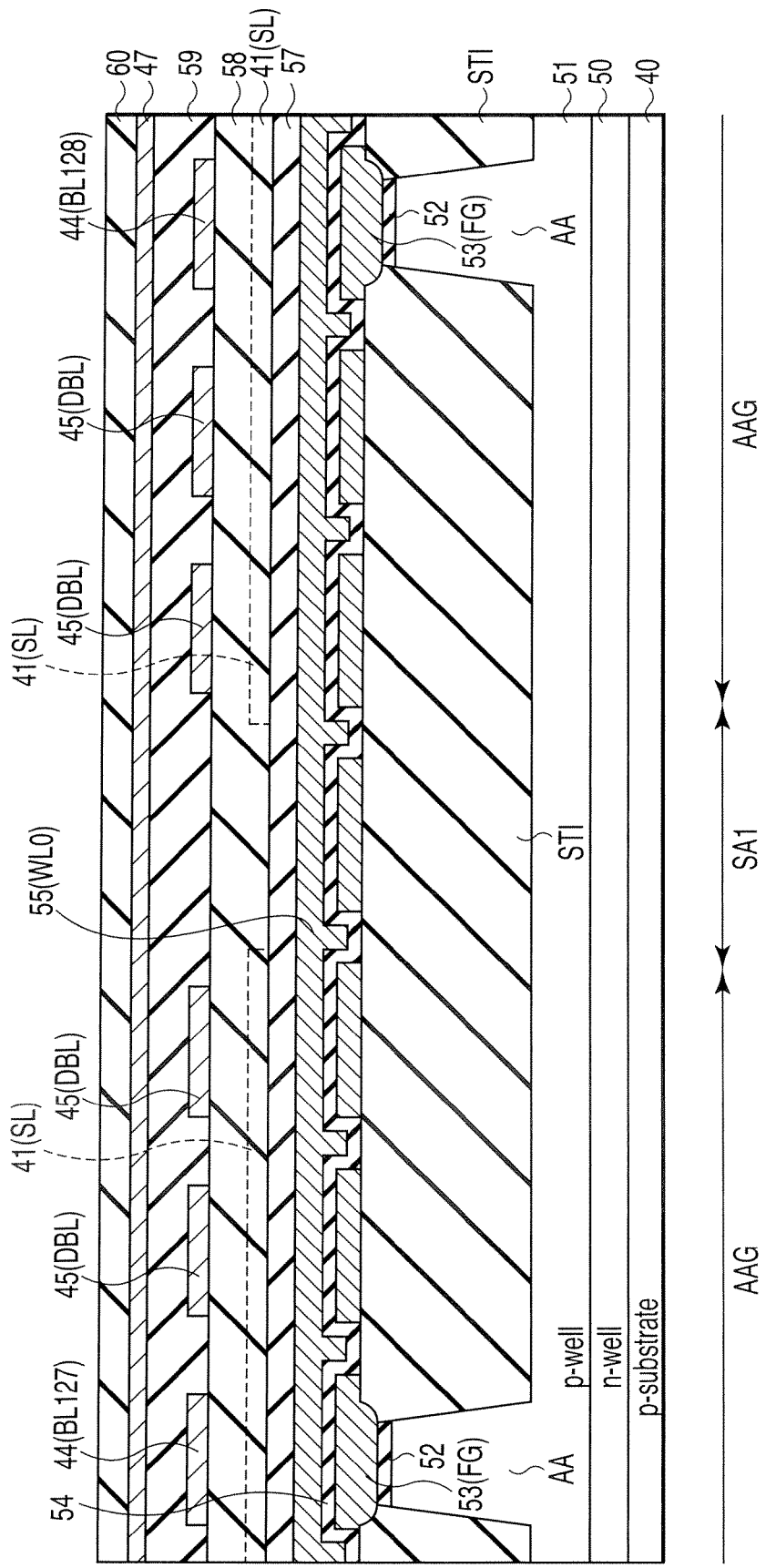
FIG. 10 is a sectional view of a cell array provided in the 2Tr flash memory in accordance with the first embodiment of the invention, and is a sectional view taken along line 10-10 in FIG. 6.

As shown in FIG. 10, in a memory cell transistor MT, the polysilicon layers 53, which are isolated from each other between adjacent element regions AA along the second direction, function as floating gates (FG). In contrast, the polysilicon layers 55 are connected commonly to each other, the layers being adjacent to each other in the second direction, and function as control gates (or word lines WL).

Figure 11:
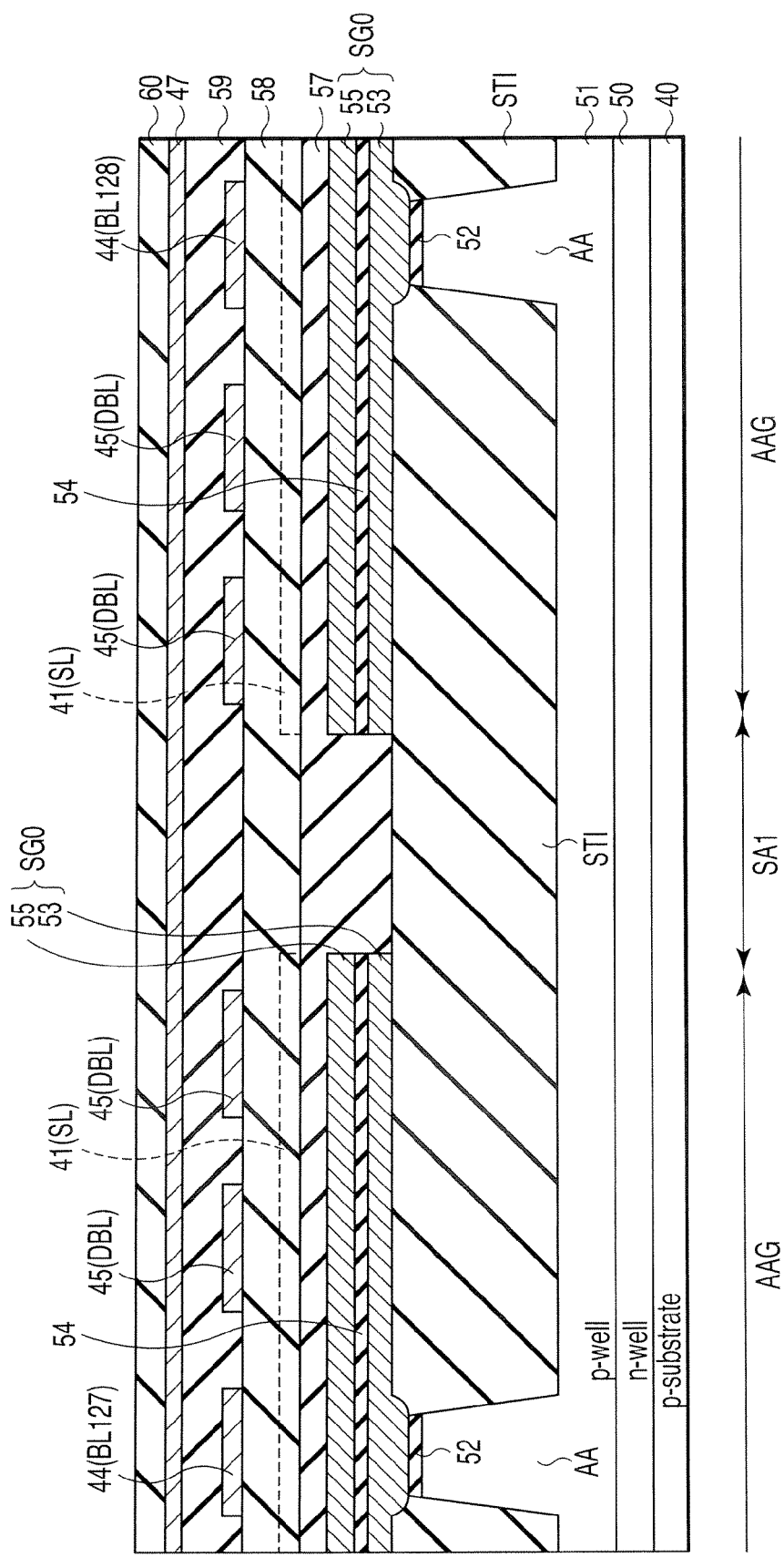
FIG. 11 is a sectional view of a cell array provided in the 2Tr flash memory in accordance with the first embodiment of the invention, and is a sectional view taken along line 11-11 in FIG. 6.
Figure 12:
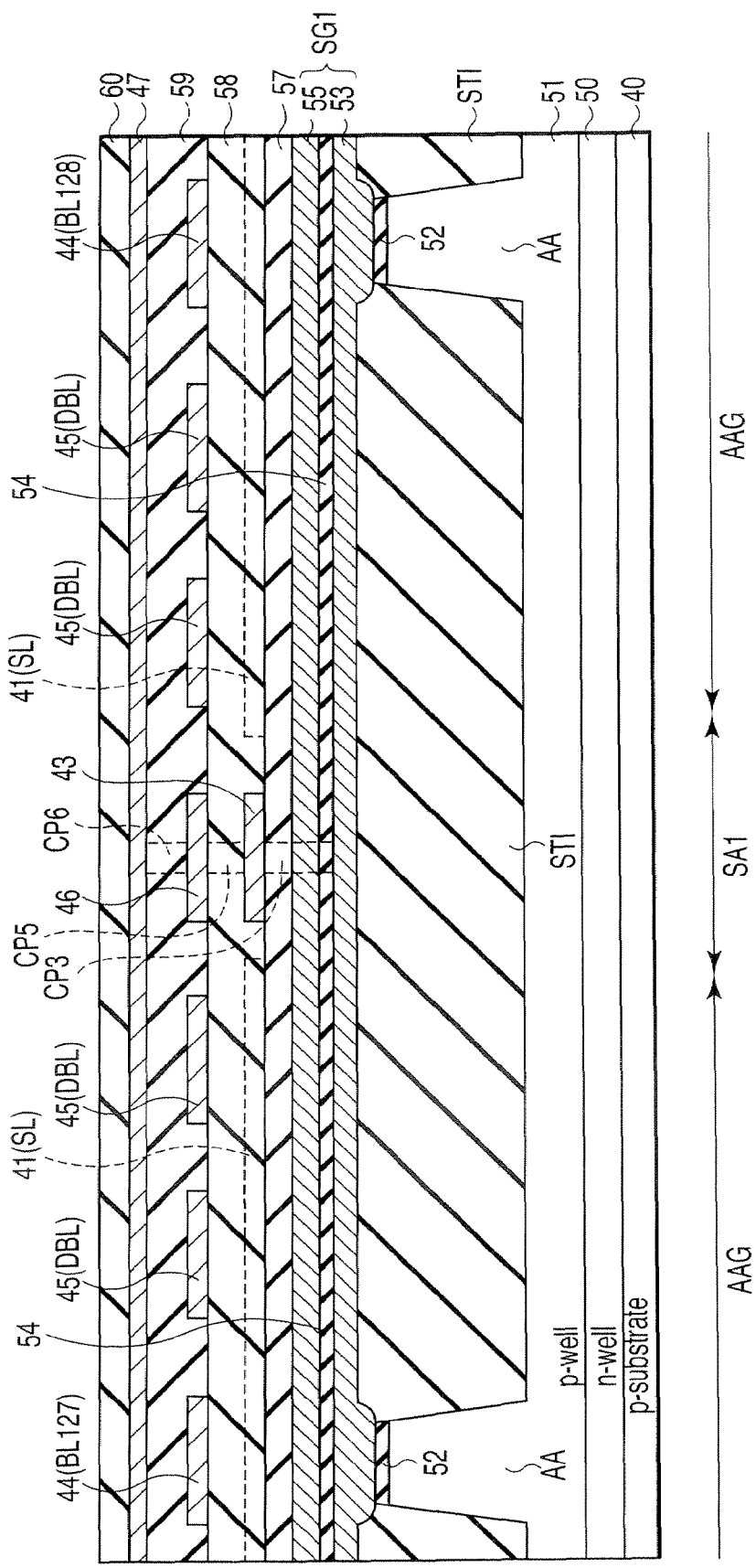
FIG. 12 is a sectional view of a cell array provided in the 2Tr flash memory in accordance with the first embodiment of the invention, and is a sectional view taken along line 12-12 in FIG. 6.

As shown in FIGS. 11 and 12, in a select transistor ST, the polysilicon layers 53 and 55 are connected commonly to each other, the layers being adjacent to each other in the second direction. Then, the polysilicon layers 53 and 55 function as select gate lines SG. Of these polysilicon layers, it is only the polysilicon layers 53 that practically function as select gate lines (a detailed description will be given later).

Figure 13:
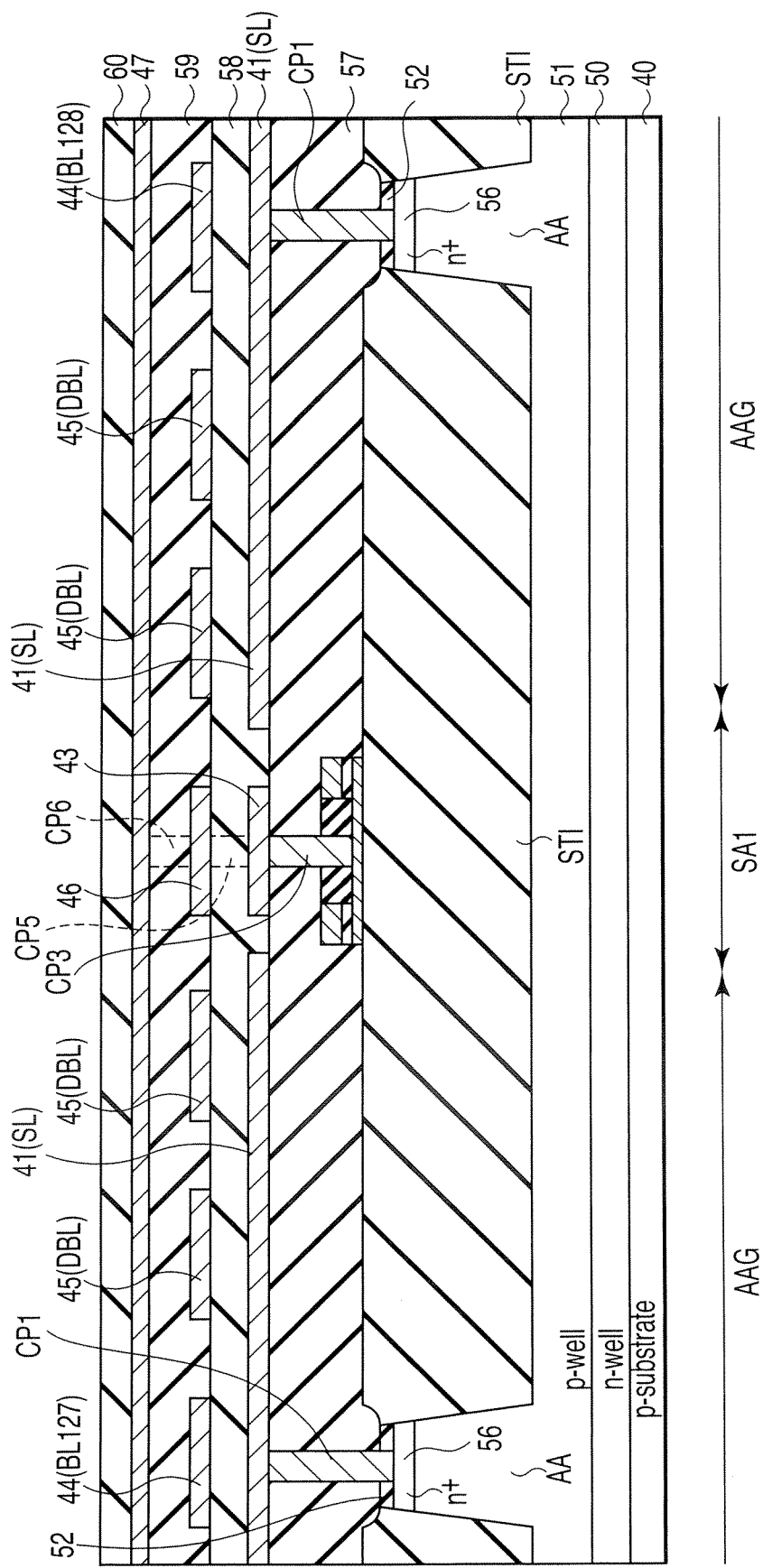
FIG. 13 is a sectional view of a cell array provided in the 2Tr flash memory in accordance with the first embodiment of the invention, and is a sectional view taken along line 13-13 in FIG. 6.
Figure 14:
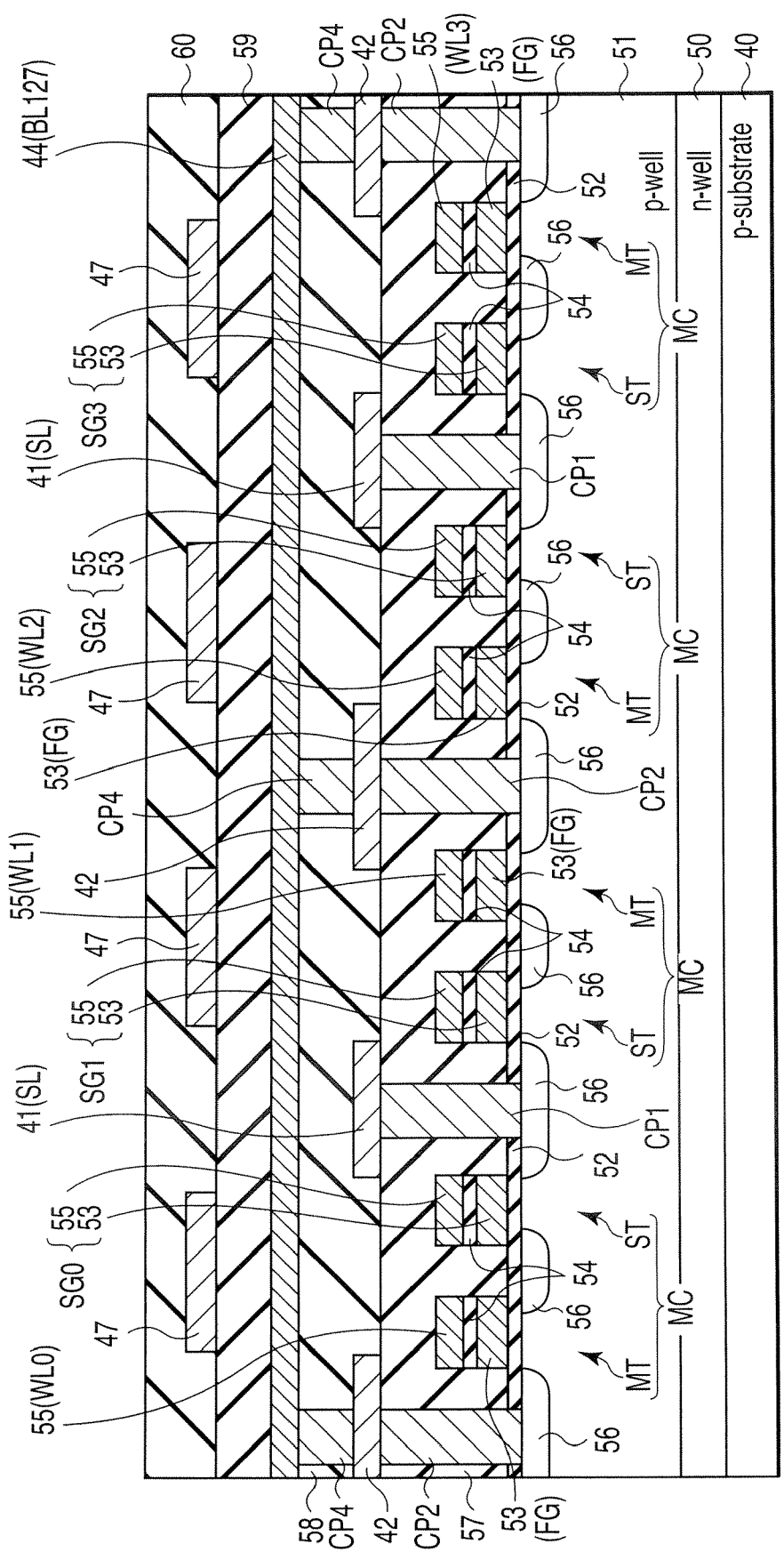
FIG. 14 is a sectional view of a cell array provided in the 2Tr flash memory in accordance with the first embodiment of the invention, and is a sectional view taken along line 14-14 in FIG. 6.

In addition, at the surface of the p-well region 51 between the adjacent gate electrodes in the first direction, an n$^+$ type impurity diffused layer 56 is formed (see FIGS. 13 and 14). The impurity diffused layer 56 is shared between the adjacent transistors, and function as a source or a drain.

A memory cell MC including a memory cell transistor MT and a select transistor ST is formed so as to have the following relationship. Specifically, in adjacent memory cells MC, their select transistors or their memory cell transistors are adjacent to each other. The adjacent transistors or memory cell transistors share the impurity diffused layer 56. Therefore, two adjacent memory cells MC, MC, when their select transistors are adjacent to each other, are arranged symmetrically with the impurity diffused layer (or source region) 56 shared by the two select transistors ST, ST. Conversely, when their memory cell transistors MT are adjacent to each other, two adjacent memory cells MC, MC are arranged symmetrically with the impurity diffused layer (or drain region) 56 shared by the two memory cell transistors MT, MT.

In addition, on the p-well region 51, an interlayer insulating film 57 is formed so as to cover the memory cell transistor MT and select transistor ST. In the interlayer insulating film 57, a contact plug CP1 is formed which reaches the impurity diffused layer (or source region) 56 shared by two select transistors ST, ST (see FIGS. 13 and 14). On the interlayer insulating film 57, a metal wiring layer 41 to be connected to the contact plug CP1 is formed. The metal wiring layer 41 functions as a source line SL. In the interlayer insulating film 57, a contact plug CP2 is formed which reaches the impurity diffused layer (or drain region) 56 shared by two memory cell transistors MT, MT (see FIG. 14). On the interlayer insulating film 57, a metal wiring layer 42 to be connected to the contact plug CP2 is formed.

On the interlayer insulating film 57, an interlayer insulating film 58 is formed so as to cover the metal wiring layers 41 and 42. In the interlayer insulating film 58, a contact plug CP4 reaching the metal wiring layer 42 is formed (see FIG. 14). On the interlayer insulating film 58, a metal wiring layer 44 connected commonly to a plurality of contact plugs CP5 is formed. The metal wiring layer 44 functions as a bit line BL. Further, on the interlayer insulating film 58, a metal wiring layer 45 serving as a dummy bit line DBL is formed. In the present embodiment, although an element region AA is not provided in the region where the dummy bit line DBL is formed, of course, such an element region AA may be formed.

On the interlayer insulating film 58, an interlayer insulating film 59 is formed so as to cover the metal wiring layers 44 and 45. On the interlayer insulating film 59, a metal wiring layer 47 is formed. The metal wiring layers 47, which function as shunt wires for the select gate lines, are arranged at equal intervals. On the interlayer insulating film 59, an interlayer insulating film 60 is formed so as to cover the metal wiring layer 47.

Next, using FIGS. 10 to 13 and 15, a sectional structure of a shunt region SA1 will be explained. FIG. 15 is a sectional view taken along line 15-15 in FIG. 6.

As shown in FIG. 15, an element isolating region STI is formed in the p-well region 51. On the element isolating region STI, the floating gate 53 and control gate 55 of a memory cell transistor MT are formed. The polysilicon layers 53 and 55 have been removed from the select gate lines which have no shunt region SA2 in the shunt region SA1 (see FIGS. 11 and 15). That is, the select gate lines are divided by the shunt regions SA1. In each of the select gate lines which have a shunt region SA2, a stacked gate including the polysilicon layers 53 and 55 is formed in the shunt region SA1 as well. The stacked gate is formed so as to project toward the adjacent select gate lines (see FIG. 15).

As shown in FIGS. 13 and 15, in a shunt region SA2, the polysilicon layer 55 and inter-gate insulating film 54 are removed, thereby exposing the polysilicon layer 53. Then, a contact plug CP3 is formed so as to contact the top of the polysilicon layer 53 in the region. An insulating film 61 electrically isolates the contact plug CP3 from the polysilicon layer 54. The contact plug CP3 is formed from the surface of the interlayer insulating film 57 so as to reach the polysilicon layer 53.

On the interlayer insulating film 57, a metal wiring layer 43 is formed. The metal wiring layer 43 is connected to the corresponding select gate line (polysilicon layer 53) by the contact plug CP3. On the interlayer insulating film 57, an interlayer insulating film 58 is formed so as to cover the metal wiring layer 43. In the interlayer insulating film 58, a contact plug CP5 reaching the metal wiring layer 43 is formed. On the interlayer insulating film 58, a metal wiring layer 46 connected to the contact plug CP5 is formed. On the interlayer insulating film 58, an interlayer insulating film 59 is formed. In the interlayer insulating film 59, a contact plug CP6 reaching the metal wiring layer 46 is formed. As shown in FIG. 15, the contact plug CP6 is in the central part of a memory cell. In other words, it is formed on a region between the central part of the stacked gate of a memory transistor MT and the central part of the gate electrode of a select transistor ST. On the interlayer insulating film 59, a metal wiring layer 47 connected to the contact plug CP6 is formed. As shown in FIG. 15, a plurality of metal wiring layers 47 are arranged at equal intervals on the interlayer insulating film 59. Then, on the interlayer insulating film 59, an interlayer insulating film 60 is formed so as to cover the metal wiring layers 47.

Figure 16:
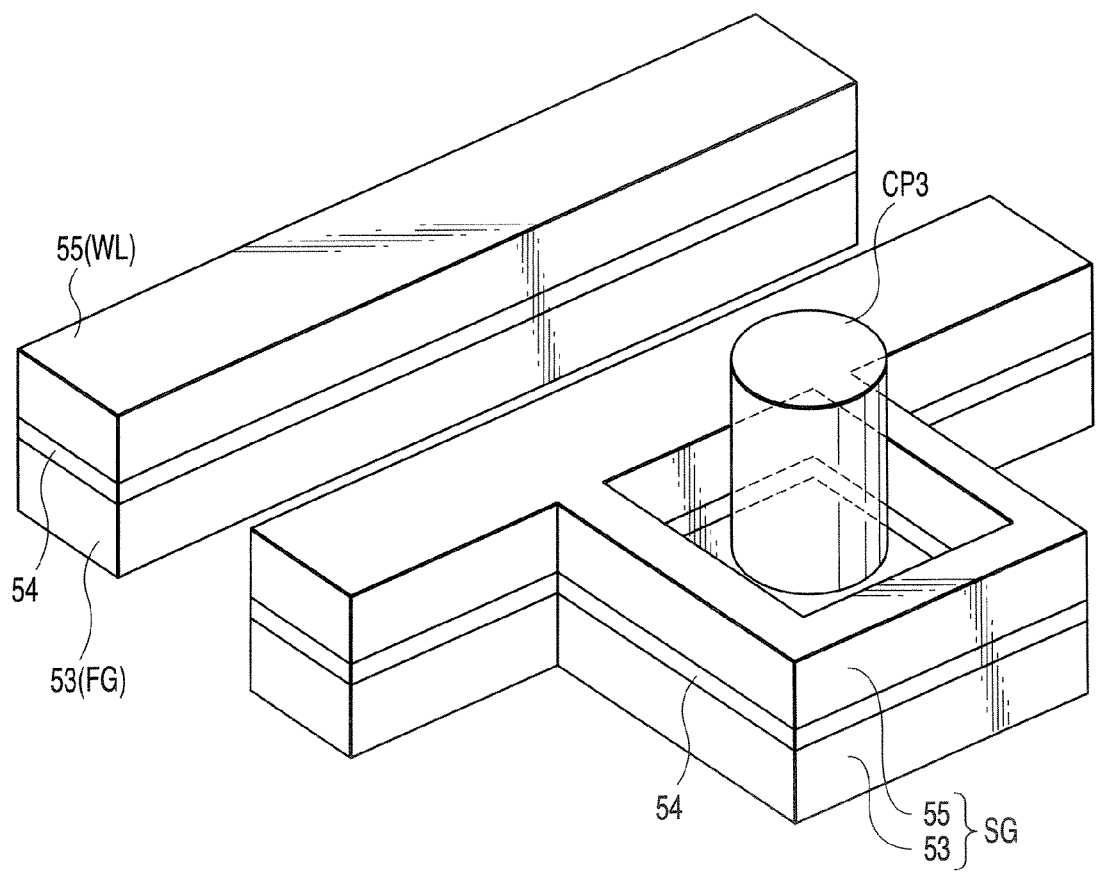
FIG. 16 is a perspective view at a shunt region, of the cell array provided in the 2Tr flash memory in accordance with the first embodiment of the invention.

FIG. 16 is a perspective view of a shunt region SA2. As shown in FIG. 16, each of a stacked gate structure of a word line and that of a select gate line is made wider in part. In a shunt region SA2, the polysilicon layer 55 and inter-gate insulating film 54 in a part of the wider region are removed, thereby exposing the polysilicon layer 53. A contact plug CP3 is formed so as to contact the exposed polysilicon layer 53. Further, the contact plug CP3 is electrically isolated from the polysilicon layer 55. That is, the polysilicon layer 55 is electrically isolated from the shunt wire 47.

Figure 17:
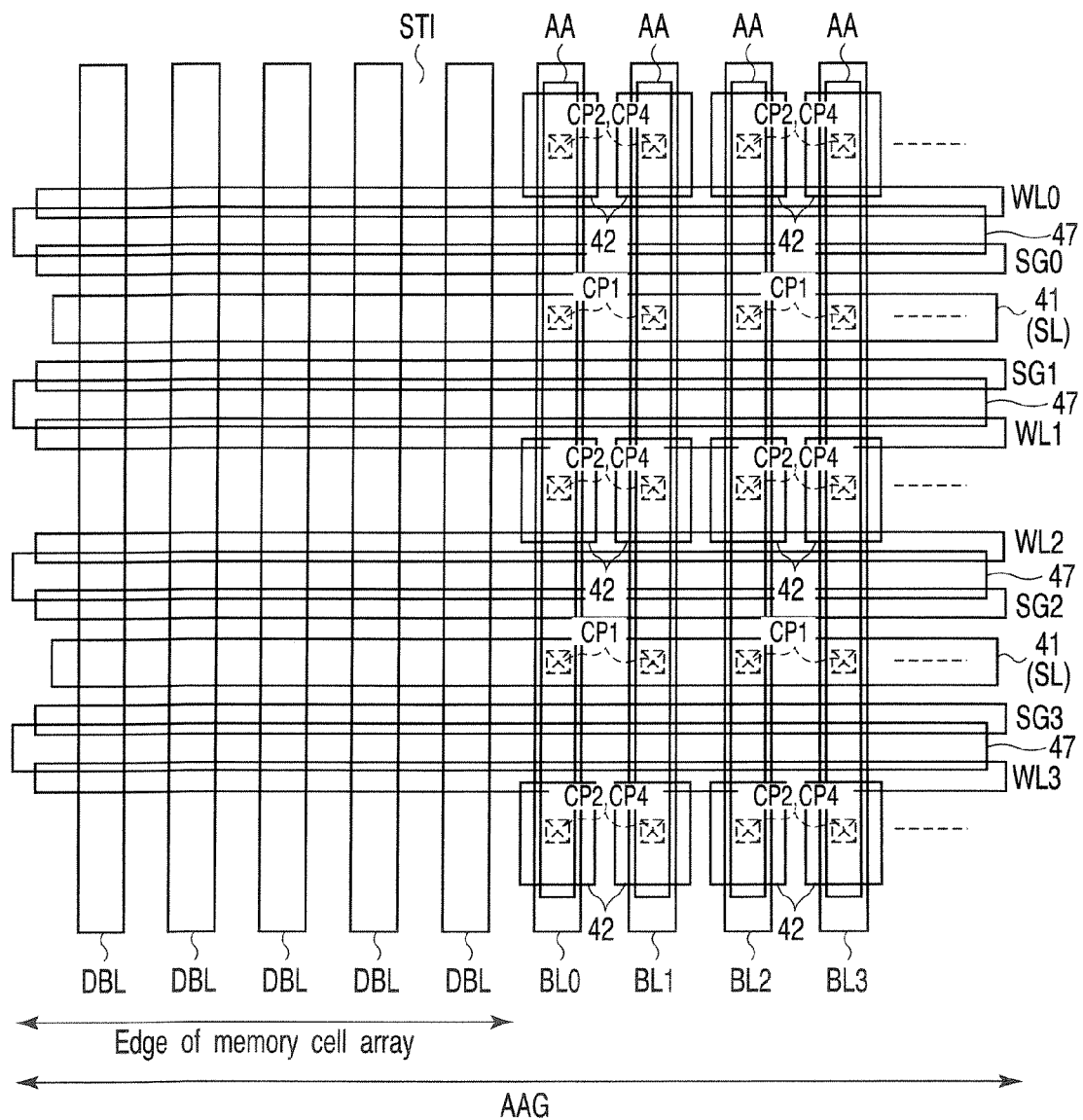
FIG. 17 is a plan view at an edge of a memory cell array, of the cell array provided in the 2Tr flash memory in accordance with the first embodiment of the invention.

FIG. 17 is a plan view of a region including an edge of a memory cell array of a cell array 0. As shown in FIG. 17, like a shunt region SA1, a dummy bit line DBL is provided at an edge of the memory cell array 10. For example, although five dummy bit lines DBL are provided, they are provided as a mere example. Therefore, a bit line BL0 (or BL255) positioned at the edge of the memory cell array 10 is adjacent to the row decoder 11 or the source line driver 12 with a plurality of dummy bit lines DBL interposed therebetween.

FIG. 18 shows how a shunt region SA1 and a dummy bit line DBL (dummy pattern) are arranged in cell arrays 0 to j. As described previously, the shunt region SA1 is arranged on a 64 by 64 bit line basis, and thus, three shunt regions per cell array are provided. At both sides of the shunt region SA1, dummy bit lines DBL are provided. Dummy bit lines DBL are also provided in a region positioned at the edge of the memory cell array 10. Therefore, the memory cell array 10 has a pattern such that the shunt regions SA1 sandwiched between the dummy patterns are cyclically repeated on a 64 by 64 bit line basis. One block in which memory cells and shunt regions SA1 are repeated is sandwiched between the dummy patterns at the end part of the memory cell array 10. In FIGS. 6 to 18, this also applies to ECC cell arrays 0 to j.

Next, a description will be given with respect to how column addresses are assigned to bit lines BL0 to BL255 in the 2Tr flash memory configured as described above. In the following, for the purpose of simplification, a case in which j=3 (the number of cell arrays is 4) and a first column gate 24 is provided by a four by four bit line basis will be described by way of example. FIGS. 19 to 22 show cell arrays 0 to 3 and a first column gate 24. 256 column addresses assigned to 256 bit lines are referred to as C0 to C255. From among them, the least significant two bits are referred to as CA0 to CA3.

Figure 19:
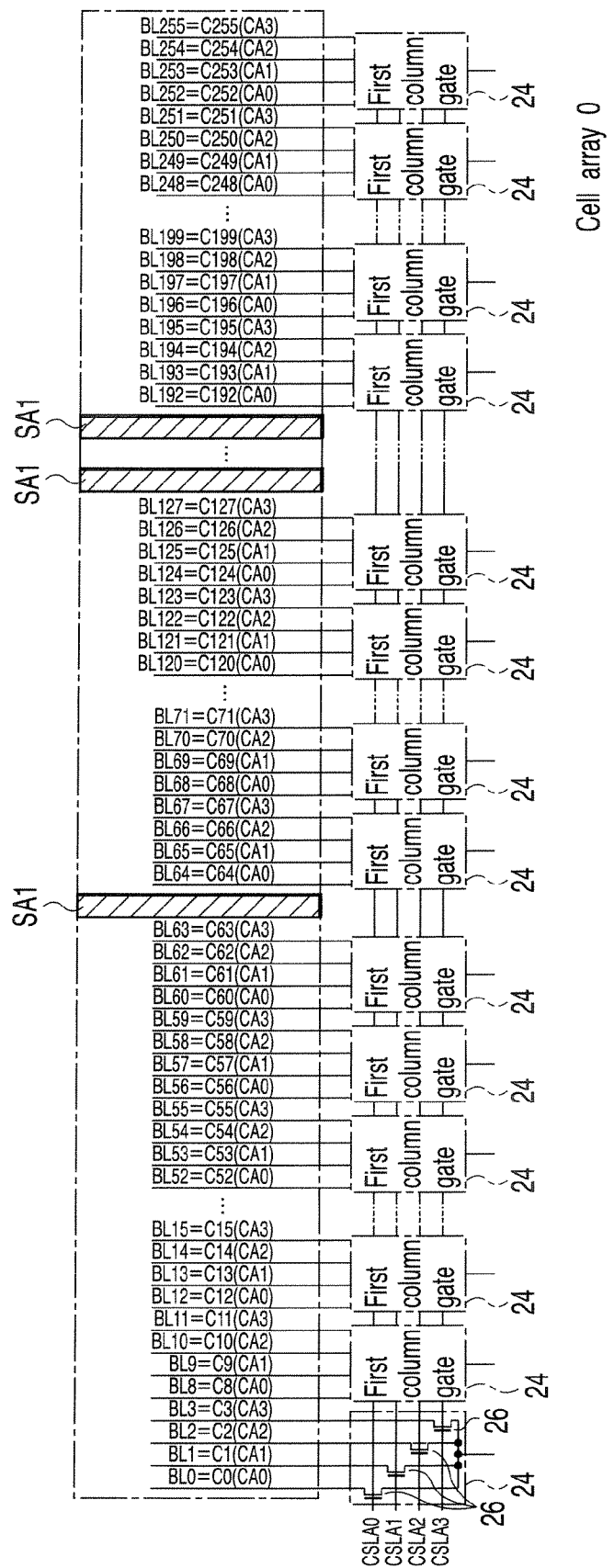

First, a cell array 0 will be described with reference to FIG. 19. As shown in FIG. 19, in the cell array 0, column addresses C0 to C255 are sequentially assigned to bit line BL0 to BL255. That is, the least significant two bits CA0 to CA3 of the column addresses are repeated by a four by four bit line basis. Therefore, the column addresses of the bit line BL0 adjacent to the end part of the memory cell array and the bit lines BL63, BL64, BL127, BL128, BL191, BL192, and BL255 adjacent to the shunt regions SA1 are C0, C63, C64, C127, C128, C191, C192, and C255, respectively, and the least significant bit of these column addresses is either of CA0 and CA3.

Next, a cell array 1 will be described with reference to FIG. 20. In the cell array 1, the column addresses of the bit lines adjacent to the shunt regions SA1 are assigned so as to be different from those of the bit lines adjacent to the shunt regions SA1 and the edge of the memory cell array in the cell array 0. More specifically, the column addresses of the bit lines BL0, BL63, BL64, BL127, BL128, BL191, BL192, and BL255 adjacent to the shunt regions are C3, C62, C67, C126, C131, C190, CA195, and CA254, respectively, and the least significant bit of these column addresses is either of CA2 and CA3. Thus, the column addresses of the bit lines selected by the column select lines CSLA0 to CSLA3 in cell array 1 is different from those selected by same column select lines in the cell array 0. For example, the column addresses of the bit lines BL0 to BL3 are C3 (CA3), C0 (CA0), C1 (CA1), and C2 (CA2), respectively. That is, the least significant two bits of the column addresses assigned to the four bit lines adjacent to the shunt regions are CA3, CA0, CA1, and CA2 in order of bit lines. The other bit lines are identical to those in the cell array 0.

Figure 21:
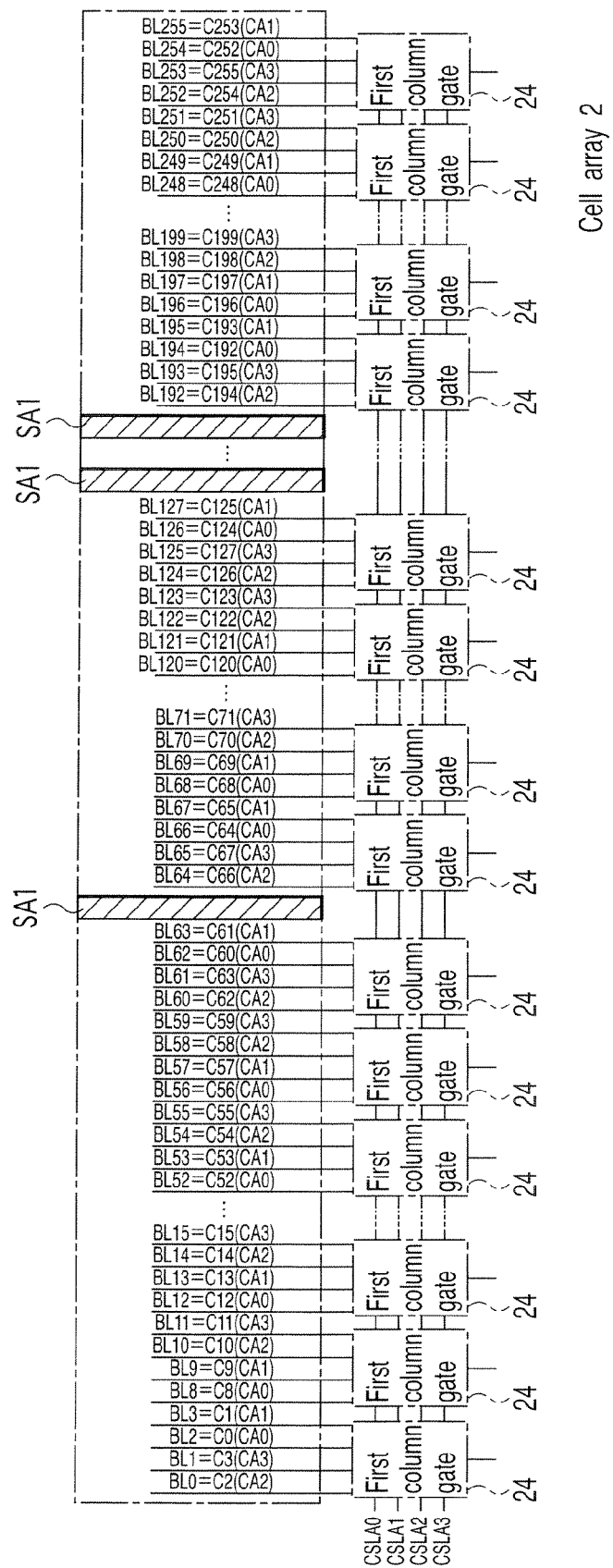

Next, a cell array 2 will be described with reference to FIG. 21. In the cell array 2, the column addresses of the bit lines adjacent to the shunt regions SA1 are assigned so as to be different from those of the bit lines adjacent to the shunt regions SA1 and the edge of the memory cell array in the cell array 0 and different from those of the bit lines adjacent to the shunt regions SA1 in the cell array 1. More specifically, the column addresses of the bit lines BL0, BL63, BL64, BL127, BL128, BL191, BL192, and BL255 adjacent to the shunt regions are C2, C61, C66, C125, C130, C189, CA194, and CA253, respectively, and the least significant bit of these column addresses is either of CA1 and CA2. Thus, the column addresses of the bit lines selected by column select lines CSLA0 to CSLA3 in the cell array 2 are different from those selected by same column select lines in the cell arrays 0 and 1. For example, the column addresses of the bit lines BL0 to BL3 are C2 (CA2), C3 (CA3), C0 (CA0), and C1 (CA1), respectively. That is, the least significant two bits of the column addresses assigned to the four bit lines adjacent to the shunt regions are CA2, CA3, CA0, and CA1 in order of bit lines. The other bit lines are identical to those in the cell arrays 0 and 1.

Figure 22:
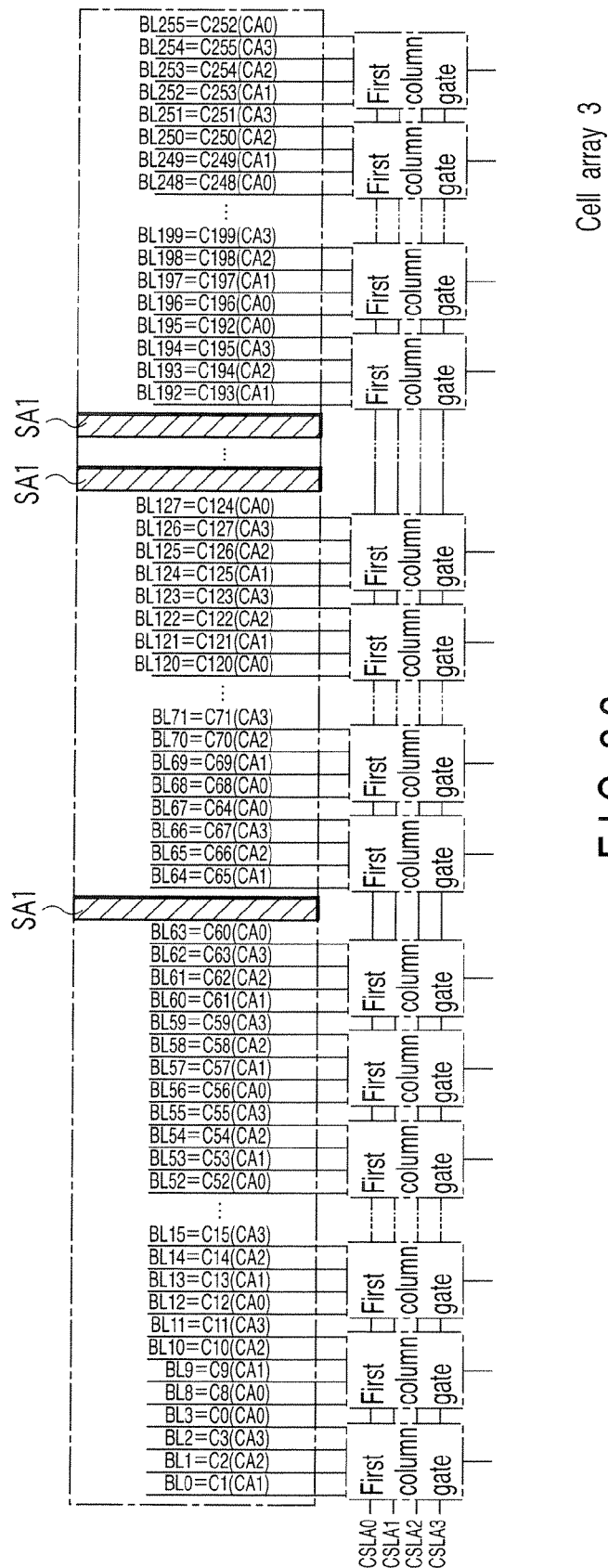

Next, a cell array 3 will be described with reference to FIG. 22. In the cell array 3, the column addresses of the bit lines adjacent to the shunt regions SA1 are assigned so as to be different from those of the bit lines adjacent to the shunt regions SA1 and the edge of the memory cell array in the cell array 0 and different from those of the bit lines adjacent to the shunt regions SA1 in the cell arrays 1 and 2. More specifically, the column addresses of the bit lines BL0, BL63, BL64, BL127, BL128, BL191, BL192, and BL255 adjacent to the shunt regions are C1, C60, C65, C124, C129, C188, CA193, and CA252, respectively, and the least significant bit of these column addresses is either of CA0 and CA1. Thus, the column addresses of the bit lines selected by column select lines CSLA0 to CSLA3 in the cell array3 are different from those selected by same column select lines in the cell array 0 to 2. For example, the column addresses of the bit lines BL0 to BL3 are C1 (CA1), C2 (CA2), C3 (CA3), and C0 (CA0), respectively. That is, the least significant two bits of the column addresses assigned to the four bit lines adjacent to the shunt regions are CA1, CA2, CA3, and CA0 in order of bit lines. The other bit lines are identical to those in the cell arrays 0 to 2.

Figure 23:
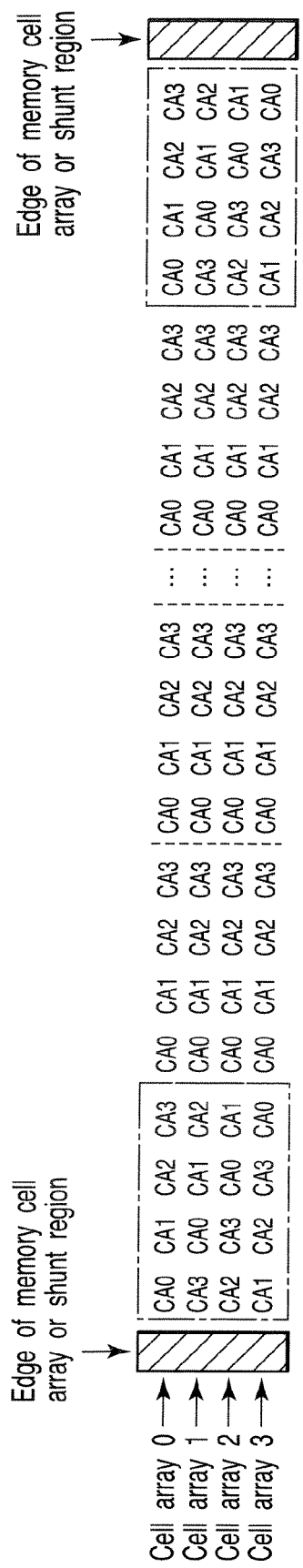
FIG. 23 is a conceptual view showing a relationship between each of the cell arrays provided in the 2Tr flash memory in accordance with the first embodiment of the invention and a column address thereof.

FIG. 23 shows the least significant two bits of the column addresses assigned to bit lines with respect to the cell arrays 0 to 3. In each of the cell arrays 0 to 3, column addresses are assigned to each of the bit lines in a pattern as shown in FIG. 23. Thus, the column addresses of the bit lines adjacent to the edge of the memory cell array and shunt regions are different from one another among the cell arrays 0 to 3. For example, in FIG. 23, the least significant two bits of the column addresses assigned to the bit lines adjacent to a left side shunt region (or edge of memory cell array) are CA0 in the cell array 0; CA1 in the cell array 1; CA2 in the cell array 2; and CA3 in the cell array 3. The least significant two bits of the column addresses assigned to the bit lines adjacent to a right side shunt region (or edge of memory cell array) are CA3 in the cell array 0; CA2 in the cell array 1; CA1 in the cell array 2; and CA0 in the cell array 3. Therefore, in the case where a bit line adjacent to a shunt region or a edge of the memory cell array has been selected in any cell array, a bit line which is not adjacent to the shunt region and the edge of the memory cell array is selected in another cell array.

Next, an operation of the 2Tr flash memory 3 configured as described above will be explained. In the following description, a state in which no electrons are implanted in a floating gate and a threshold voltage is negative is defined as a state in which data "1" is written; and a state in which electrons are implanted in a floating gate and a threshold voltage is positive is defined as a state in which data "0" is written.

<Write Operation>

First, a write operation will be described here. Data writing is carried out with respect to all memory cell blocks in a same row at a time.

Upon the write operation, the voltage generating circuit 19 generates a negative potential VBB1 (−7 V) and a positive potential VPP (12 V). Then, the negative potential VBB1 is applied to a selected bit line as a write voltage, and 0 V is applied to a unselected bit line as a write inhibit voltage VPI.

Then, the row decoder 11 selects any word line, and applies the positive voltage VPP to the selected word line. The row decoder 11 also applies the negative potential VBB1 to the substrate (p-well region 51) on which a memory cell is formed.

As a result, in a memory cell transistor MT connected to the selected word line and selected bit line, electrons are charged into a floating gate by FN tunneling because a potential difference between a gate and a channel is sufficient (VPP−VBB1=19 V). As a result, the threshold value of the memory cell transistor MT changes to a positive value. That is, data "0" is written. In a memory cell transistor MT connected to the unselected word line and unselected bit line, no electrons are charged into a floating gate because a potential difference between a gate and a channel is not sufficient (VPP−VPI=12 V). Specifically, a memory cell MC maintains a negative threshold value. That is, data "1" is written.

As described above, data is written in a one-page memory cell transistor at a time.

<Read Operation>

Next, a read operation will be described here. Upon the data read operation, the voltage generating circuit 19 generates a positive potential Vcc2 (3 V). In addition, the column gate 20 selects any bit line, and the selected bit line is pre-charged to, for example, about 1 V.

After the selected bit line has reached a pre-charge level, the row decoder 11 selects any select gate line, applies Vcc2 to the selected select gate line, and applies 0 V to other unselected select gate lines and all the word lines. Further, the row decoder 11 sets a potential of the p-well region 51 to 0 V. The source line driver 12 turns on the MOS transistor 23. Therefore, the potential of a source line is obtained as 0 V.

Then, a select transistor ST connected to the selected select gate line is turned on. Since a threshold voltage Vth of a memory cell transistor MT of a memory cell for retaining data "1" is 0 V or less, the transistor is turned on, and a current flows in the memory cell. Since a threshold value Vth of a memory cell transistor MT of a memory cell for retaining data "0" is a positive value, the transistor is turned off, and no current flows in the memory cell.

The sense amplifier 64 amplifies a potential change of a global bit line due to the flow of a current in the memory cell MC. That is, data retained by a memory cell is converted to digital data depending on whether or not a cell current flows.

As described above, the data read operation is carried out.

<Erase Operation>

Next, an erase operation will be described here. Data erasing is carried out from all of the memory cells MC to which the p-well region 51 is common at a time. The erase operation is carried out by withdrawing electrons from a floating gate through FN tunneling.

Upon the erase operation, the voltage generating circuit 19 generates a negative potential VBB2 (−8 V) and a positive VPP (12 V). Then, the row decoder 11 applies the negative voltage VBB2 to all the word lines. The row decoder 11 also applies the positive potential VPP to the p-well region 51. As a result, from a floating gate of a memory cell transistor of a memory cell MC, electrons are withdrawn to a semiconductor substrate through FN tunneling. In this manner, the data contained in all the memory cells MC is erased, and as a result, a threshold voltage of a memory cell transistor MT becomes negative.

As described above, data is erased at a time.

As described above, the semiconductor memory device in accordance with the first embodiment of the invention can attain advantageous effect described in item (1) below.

(1) Efficiency of recovery using ECC of a memory cell can be improved.

As described in FIG. 23, in the case of a 2Tr flash memory according to the present embodiment, the column addresses of the bit lines adjacent to an edge of a memory cell array and a shunt region are assigned so as to different from one another among all the cell arrays included in the memory cell array 10.

Therefore, with respect to the same column addresses, it is possible to restrict occurrences of a plurality of faults and improve the efficiency of memory cell recovery. A detailed description will be given below.

For example, assume that a memory cell array includes four cell arrays 0 to 3, and the number of bit lines in each cell array is 256. In this case, it is general that the column addresses are assigned in order of bit lines BL0 to BL255. That is, the column addresses of all the cell arrays 0 to 3 are assigned as shown in FIG. 19 described above.

It is general that bit lines in each of the cell arrays 0 to 3 are arranged so that their repetition patterns are identical to each other. For example, as described above, a shunt region SA1 is provided on a 64 by 64 bit line basis. The bit lines are thus arranged, whereby, in all the cell arrays 0 to 3, 64 bit lines are obtained as a repetition pattern. As a result, the reliability of a lithography process is improved.

Figure 24:
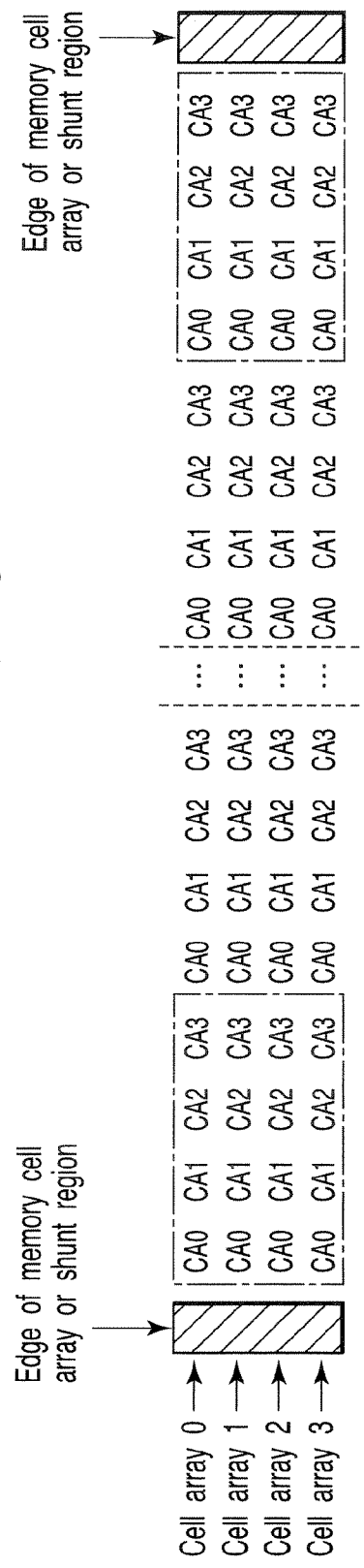
FIG. 24 and FIG. 25 are conceptual views showing a relationship between each of cell arrays provided in a flash memory and a column address thereof.

As described above, assuming that column addresses are assigned in order of bit lines BL0 to BL255 and a shunt region SA1 is provided on a 64 by 64 bit line basis in each cell array, the column addresses in each cell array are assigned as shown in FIG. 24. That is, the column addresses of the bit lines BL0 to BL255 are identical to one another among the cell arrays 0 to 3, and the column addresses of the bit lines adjacent to an edge of a memory cell array and shunt regions SA1 are also identical to one another among the cell arrays 0 to 3. More specifically, in all of the cell arrays 0 to 3, the bit lines adjacent to the edge of the cell array or shunt regions SA1 are BL0, BL63, BL64, BL127, BL128, BL191, BL192, and BL255, and their column addresses are C0, C63, C64, C127, C128, C191, C192, and C255, respectively. In addition, the least significant bit of these column addresses is CA0 or CA3.

In the meantime, as described in the Background of the Invention section, an edge of a memory cell array or shunt region is also regions in which the regularity of a wiring pattern is distorted. In such a region, pattern dimensions are likely to be distorted from the viewpoint of a lithography technique or a processing technique, and a shape error is likely to occur. In addition, such a shape error may cause a fault. Therefore, it is general to restrict an occurrence of a fault by providing dummy bit lines adjacent to an edge of a memory cell array or shunt region. However, if the number of dummy bit lines is increased, there occurs a disadvantage from the standpoint of space reduction. In the case where a process distortion occurs significantly, a fault may occur even if dummy bit lines are provided. Further, even if a degree of a shape error is low, there is a high possibility that an unreliable bit line hides, and there is a high possibility that a subsequent fault occurs. In order to recover such a fault, an ECC circuit or the like is used. However, in the case where a large number of faults have occurred, it becomes difficult to carry out fault recovery even by an ECC circuit. This is because an ECC circuit corrects an error by solving a matrix. Therefore, if an increased number of bits can be corrected, the number of circuit configurations required for the correction increases in an exponential manner. Therefore, it is general that one or two correction bits of the ECC circuit can be mounted in reality.

Figures 25, 26:
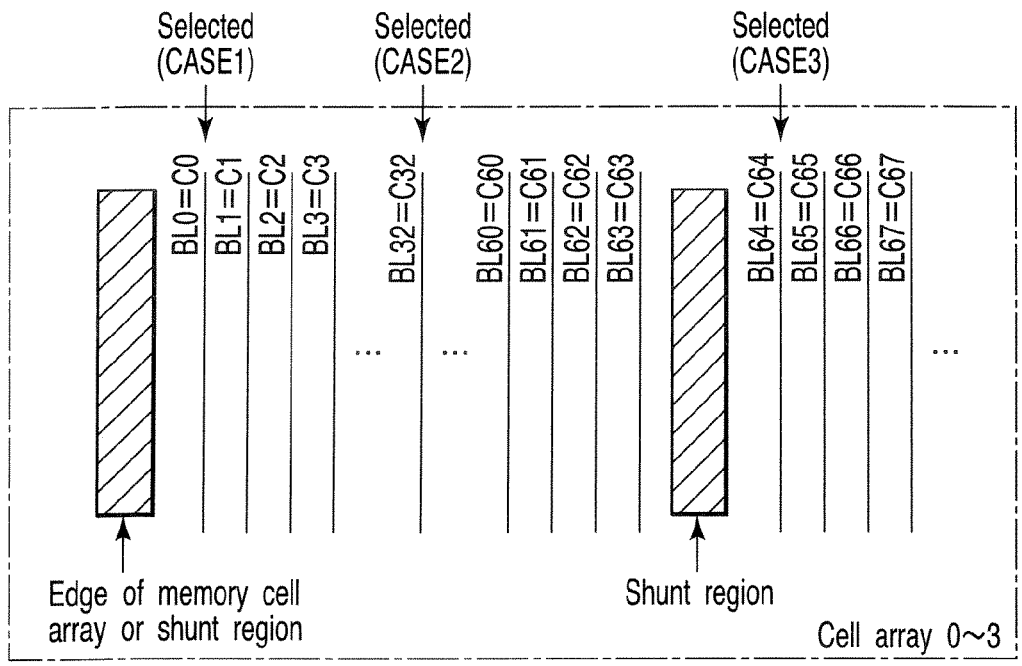
FIG. 26 is a diagram depicting a relationship between a selected column and a possibility of ECC correction in the cell arrays provided in the flash memory.
Figure 27:
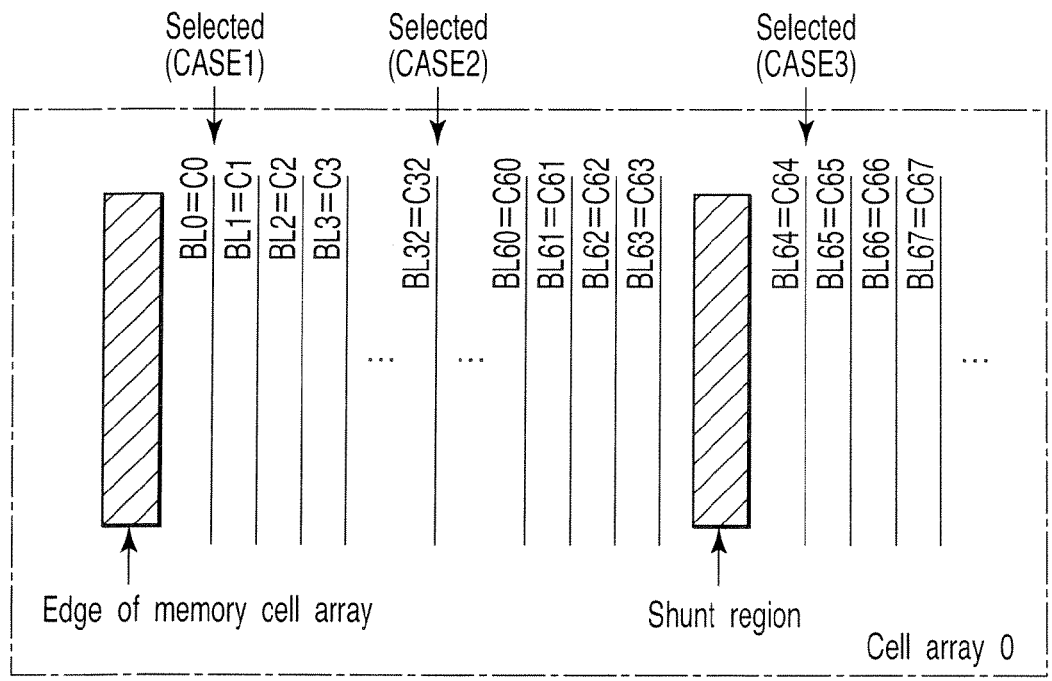
FIG. 27 to FIG. 30 are conceptual views showing a relationship between a cell array provided in the flash memory in accordance with the first embodiment of the invention and a column address thereof.
Figure 28:
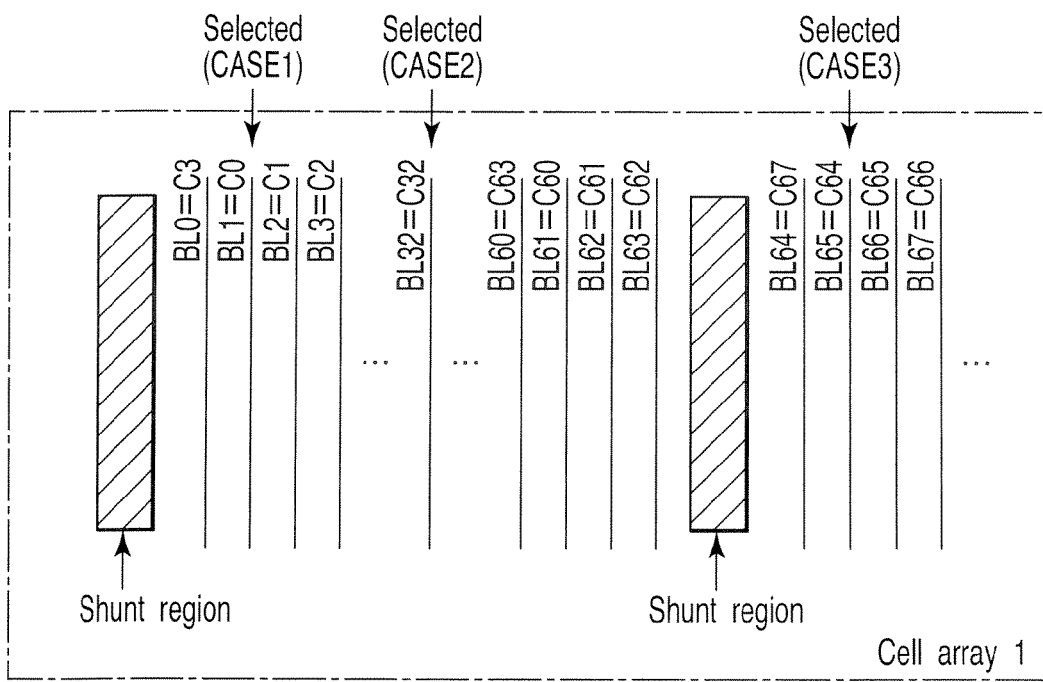
Figure 29:
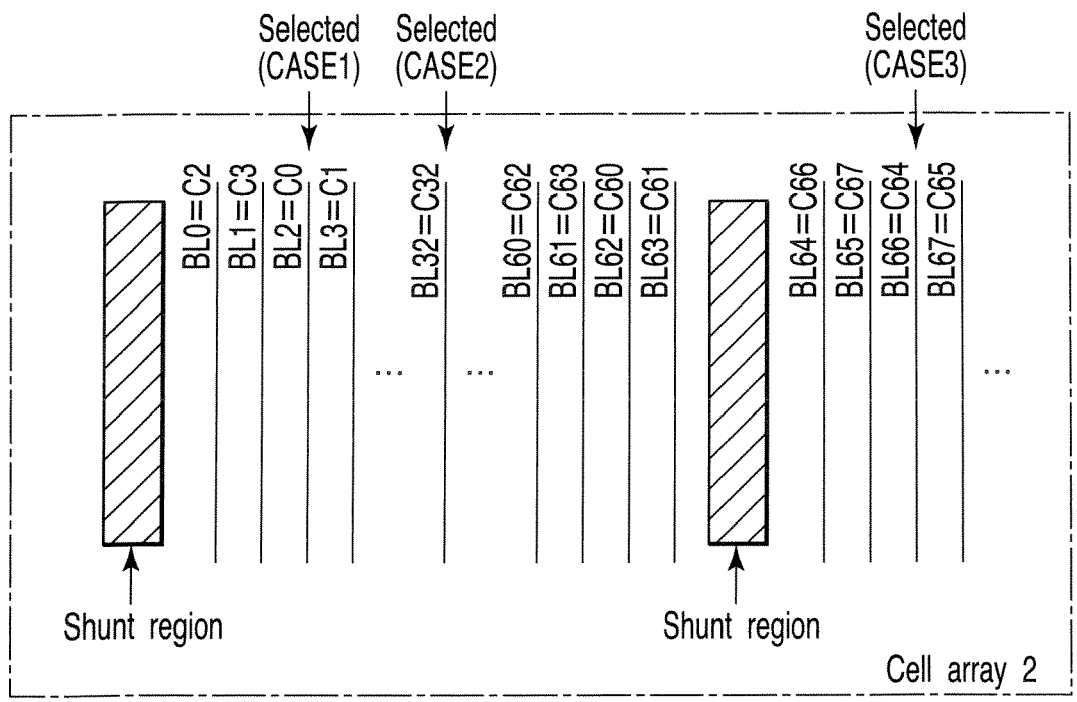
Figure 30:
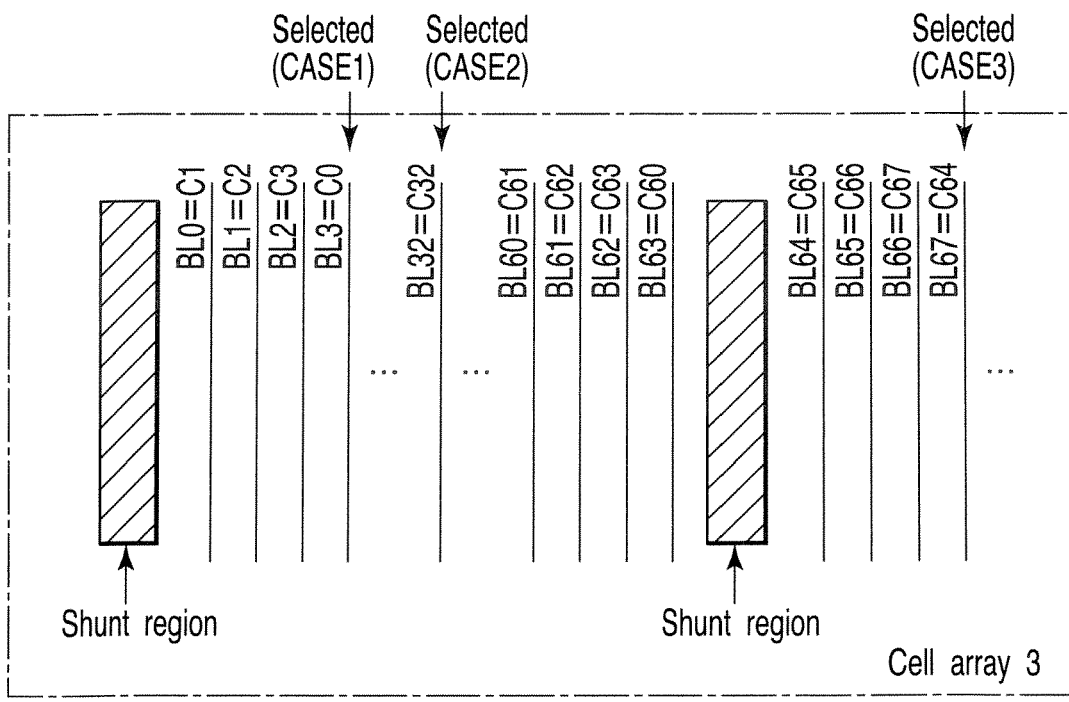

From the viewpoint of the above, in the address assignment shown in FIG. 24, a plurality of bit faults are likely to occur in a same column address, and the efficiency of recovery using the ECC circuit is degraded. A description will be given with reference to FIGS. 25 and 26. FIG. 25 shows bit lines and a shunt region SA1 of cell arrays 0 to 3 due to general address assignment. FIG. 26 shows a table indicating a relationship between a selected column and a fault. In FIG. 25, no dummy bit lines are shown.

As described previously, the column addresses C0 to C255 are assigned to the bit lines BL0 to BL255, respectively, and a shunt region SA1 is provided on a 64 by 64 bit line basis. Here, a case in which the bit lines BL0, BL32, and BL64 are selected will be described as CASE1, CASE2, and CASE3.

<CASE1>

In CASE1, a bit line corresponding to a column address C0 is selected. That is, a bit line BL0 is selected in each of cell arrays 0 to 3. In all of the cell arrays 0 to 3, the bit line BL0 is adjacent to an edge of a memory cell array or a shunt region SA1.

That is, all of the selected four bit lines BL0 are arranged in location in which a fault is likely to occur. Therefore, as shown in FIG. 26, there is a possibility that all the bit lines BL0 are faulty. In this case, fault recovery cannot be carried out by a one-bit correcting ECC circuit.

<CASE2>

In CASE2, a bit line corresponding to a column address C32 is selected. That is, a bit line BL32 is selected in each of the cell arrays 0 to 3. In all of the cell arrays 0 to 3, the bit line BL32 is not adjacent to an edge of a memory cell array or a shunt region SA1. Therefore, a fault hardly occurs, and, as shown in FIG. 26, there is a high possibility that a fault can be recovered by a one-bit correcting ECC circuit.

<CASE3>

In CASE3, a bit line corresponding to a column address C64 is selected. That is, a bit line BL64 is selected in each of the cell arrays 0 to 3. In all of the cell arrays 0 to 3, the bit line BL64 is adjacent to a shunt region SA1. That is, as in CASE1, all of the selected four bit lines BL64 are arranged in location in which a fault is likely to occur. Therefore, as shown in FIG. 26, there is a high possibility that a fault of 2 bits or more occurs, and fault recovery cannot be carried out by a one-bit correction ECC circuit.

However, as described with reference to FIGS. 19 to 23, with the configuration according to the present embodiment, column addresses are assigned so that the addresses of the bit lines adjacent to an edge of a memory cell array and a shunt region are different from one another among the cell arrays 0 to 3. Therefore, in the case where a bit line adjacent to an edge of a memory cell array or a shunt region has been selected in any cell array, a bit line adjacent to an edge of a memory cell array or shunt region is not selected in the other cell arrays. Thus, a possibility that a plurality of faulty bit lines is selected can be reduced. This matter will be described with respect to the above CASE1 to CASE3. FIGS. 27 to 30 each show bit lines and shunt regions SA1 of the cell arrays 0 to 3. FIG. 31 shows a table indicating a relationship between a selected column and a fault. In FIGS. 27 to 30, no dummy bit lines are shown. It is assumed that the shunt region SA1 is provided on a 64 by 64 bit line basis.

<CASE1>

In CASE1, a bit line corresponding to a column address C0 is selected. As shown in FIGS. 27 to 30, a bit line BL0 is selected in the cell array 0; a bit line BL1 is selected in the cell array 1; a bit line BL2 is selected in the cell array 2; and a bit line BL3 is selected in the cell array 3. The bit line BL0 of the cell array 0 is adjacent to an edge of a memory cell array, whereas the bit lines BL1 to BL3 of the cell arrays 1 to 3 are not adjacent to the memory cell array end part. That is, only the bit line BL0 selected in the cell array 0 is arranged in location in which a fault is likely to occur. Therefore, as shown in FIG. 31, there is a low possibility that bit lines other than the bit line BL0 selected in the cell array 0 are faulty, and fault recovery can be carried out by using a one-bit correction ECC circuit.

<CASE2>

In CASE2, a bit line corresponding to a column address C32 is selected. That is, a bit line BL32 is selected in each of the cell arrays 0 to 3. This case is identical to a case in which column addresses C0 to C255 have been sequentially arranged with respect to bit lines BL0 to BL255 of all the cell arrays 0 to 3.

<CASE3>

In CASE3, a bit line corresponding to a column address C64 is selected. As shown in FIGS. 27 to 30, a bit line BL64 is selected in the cell array 0; a bit line BL65 is selected in the cell array 1; a bit line BL66 is selected in the cell array 2; and a bit line BL67 is selected in the cell array 3. The bit line BL64 of the cell array 0 is adjacent to a shunt region SA1, whereas the bit lines BL65 to BL67 of the cell arrays 1 to 3 are not adjacent to the edge of the memory cell array or the shunt region. That is, only the bit line BL64 selected in the cell array 0 is arranged in location in which a fault is likely to occur. Therefore, as shown in FIG. 31, there is a low possibility that bit lines other than the bit line BL64 selected in the cell array 0 are faulty, and fault recovery can be carried out by using a one-bit correction ECC circuit.

As described above, simultaneous selection of a plurality of faulty bit lines can be effectively avoided, thus making it possible to improve the efficiency of recovery of faulty bit lines by using the ECC circuit 16. In the foregoing, a description has been given by way of example of sequentially assigning the column addresses C0 to C255 to the bit lines BL0 to BL255. However, this also applies a case of assigning the column addresses C255 to C0 to the bit lines BL0 to BL255; a case of sequentially assigning the column address C0 to C255 in even-numbered cell arrays and sequentially assigning the column addresses C255 to C0 in odd-numbered cell arrays or vice versa. In these cases as well, the addresses of the bit lines adjacent to the edge of the memory cell array or shunt region are identical to one another among cell arrays.

(2) Reliability of 2Tr Flash Memory can be Improved.

The advantageous effect described in item (1) above can be significantly attained in a 2 Tr flash memory, in particular. Using FIGS. 32 to 34, this advantageous effect will be described in comparison with a NAND flash memory. FIG. 32 is a circuit diagram of a NAND cell, FIG. 33 is a plan view of a NAND cell, and FIG. 34 is a plan view of a memory cell of a 2Tr flash memory (hereinafter, referred to as a 2Tr flash cell).

The NAND flash memory has a plurality of NAND cells in a memory cell array. Each NAND cell comprises: select transistors ST1 and ST2, and a plurality of memory cell transistors connected in series between a source of the select transistor ST1 and a drain of the select transistor ST2. While FIGS. 32 and 33 each show a case in which eight memory cell transistors MT are provided, of course, 16 or 32 memory cell transistors may be provided without being limited thereto. Each memory cell transistor MT has a stacked gate including a floating gate and a control gate, and the control gate functions as a word line. Gates of the select transistors ST1 and ST2 function as select gate lines SGD and SGS, respectively. Then, a drain of the select transistor ST1 is connected to the bit line BL, and a source of the select transistor ST2 is connected to a source line.

Figure 34:
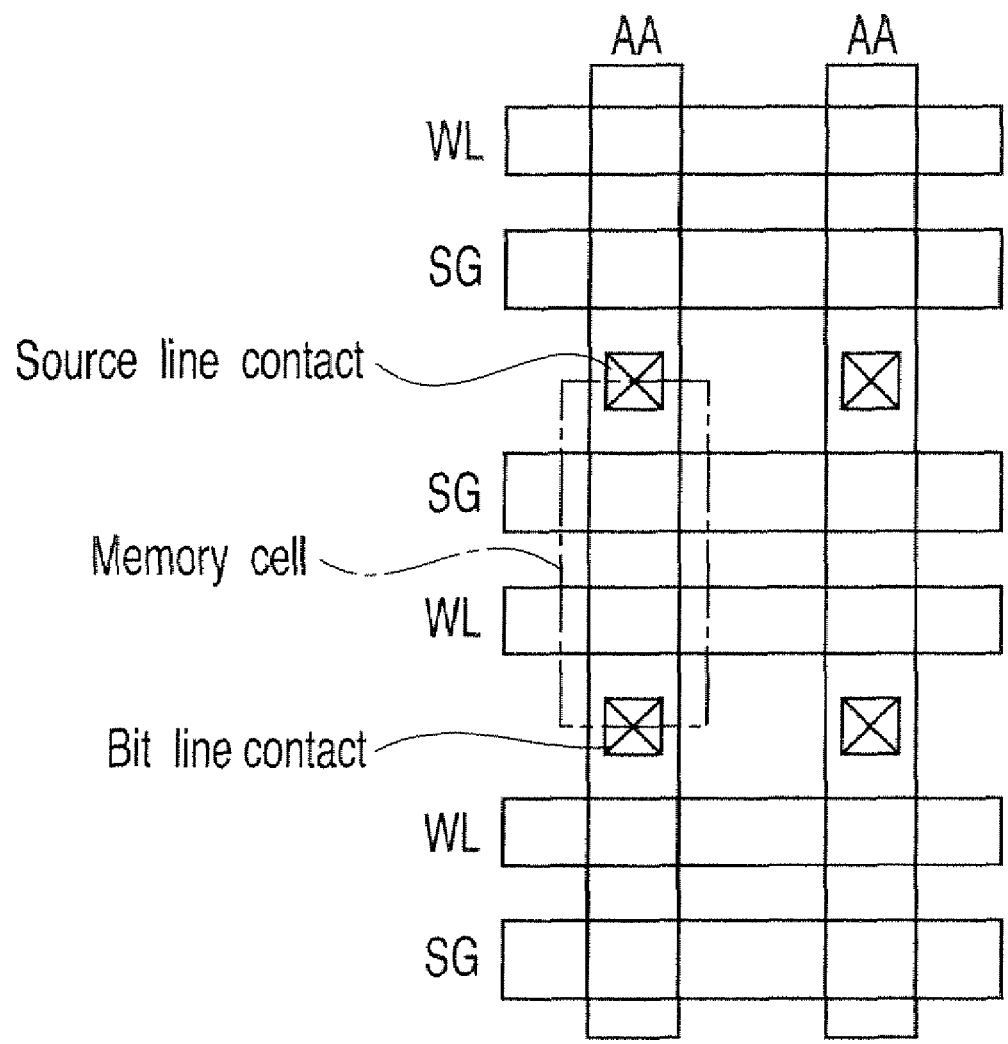
FIG. 34 is a plan view of a memory cell provided in the 2Tr flash memory in the first embodiment of the invention.
Figure 35:
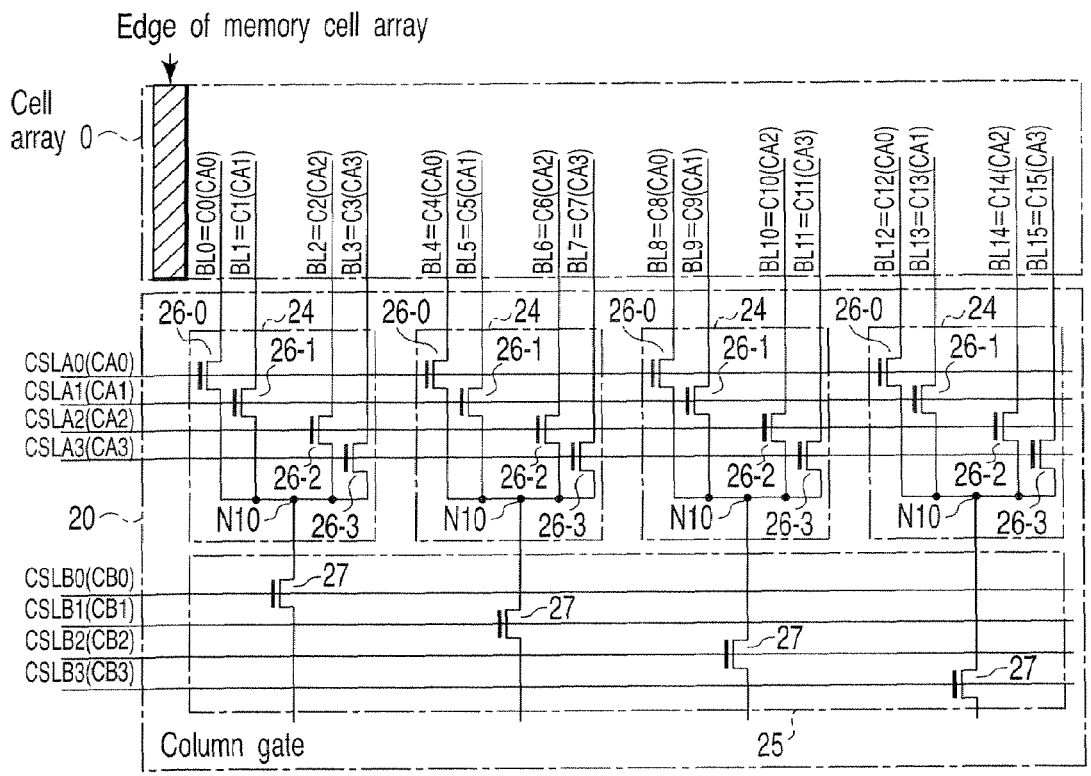
Figure 36:
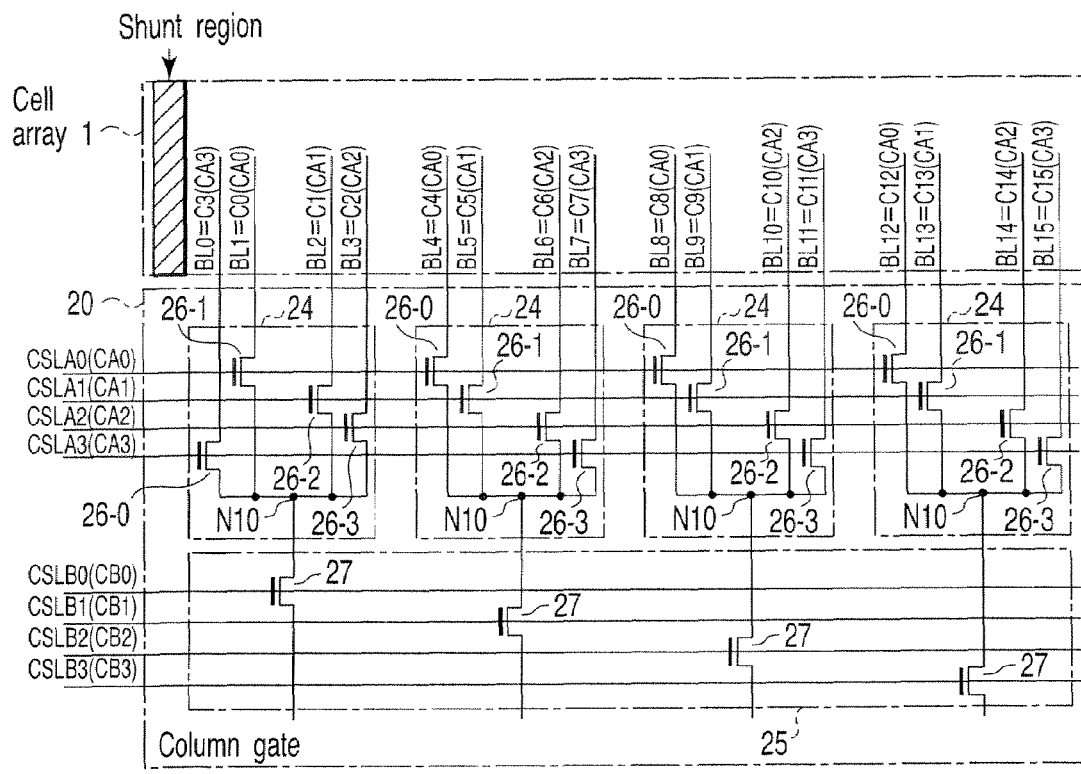

As shown in FIGS. 33 and 34, each NAND cell includes a plurality of word lines, and has higher regularity of wiring patterns than that of the 2Tr flash memory. In other words, in the NAND cell, a ratio of a region where the same pattern is repeated is high as compared with the 2Tr flash memory. A region where such a repetition pattern is generated is a region where a word line has been formed. In the repetition pattern, lithography precision can be enhanced, thus making it possible to reduce a word line width and a word line gap. Since a portion at which the regularity is distorted is a potion of a select gate line, a select gate line width and a select gate line gap must be increased as compared with the word line width and word line gap. However, the number of select gate lines and the number of word lines are obtained as a ratio of 2:8, a ratio of 2:16, or a ratio of 2:32, for example. Therefore, even if the size of the periphery of the select gate line has increased, such an increase hardly affects an area of the whole memory cell array. Accordingly, dimensions of the select gate line can be designed with a comparatively sufficient margin.

In contrast, in the 2Tr flash cell, a word gate line and a word line are provided as 1:1. Therefore, a bit line direction is hardly obtained as a repetition pattern. Thus, there is a need for providing a margin to a select gate line width and a gap between select gate lines in view of an out of alignment on lithography. However, unlike the NAND cell, one select transistor is provided on one by one memory cell transistor basis, and thus, a large-sized select gate line periphery directly affects a large-sized memory cell array. Therefore, from the viewpoint of a cell size, the size of the periphery of the select gate line does not have a margin too much. As a result, a condition for the size of the periphery of the select gate line becomes very severe.

As described above, the 2Tr flash cell does not have a margin in its cell size with respect to an occurrence of a shape error, as compared with the NAND cell. As a result, a structure in which a fault is likely to occur is obtained as compared with the NAND cell. Therefore, a fault may occur in the vicinity of the edge of the memory cell array or shunt region. However, by applying a method of assigning addresses in accordance with the present embodiment, a fault can be effectively recovered by an ECC circuit even if a fault frequently occurs.

Next, a description will be given with respect to a semiconductor memory device in accordance with a second embodiment of the invention. The present embodiment relates to the configuration of column gates for achieving a method of assigning column addresses in the above first embodiment. Therefore, constituent elements other than column gates are identical to those according to the first embodiment, and a description is omitted here. Hereinafter, a description will be given with respect to a case in which four cell arrays are provided or a case in which one first column gate 24 is provided by a four by four bit line basis. FIGS. 35 to 38 are circuit diagrams each showing memory cell arrays 0 to 3 and a column gate 20.

As shown in FIGS. 35 to 38, the column gate 20 comprises: first column gates 24 provided on a four by four bit line basis and one second column gate 25. Each of the first column gates 24 has four MOS transistors 26-0 to 26-3. One end of a current path of each of the MOS transistors 26-0 to 26-3 is connected to each of bit lines BL($4i$), BL($4i+1$), BL($4i+2$), and BL($4i+3$), and the other end is connected commonly to the other ends of the current paths of the other MOS transistors 26 in the same first column gates 24. Here, i is a natural number of 0 or more. The gates of the MOS transistors 26-0 to 26-3 are connected to any of four first column select lines CSLA0 to CSLA3. The first column select lines CSLA0 to CSLA3 each are selected when the least significant bits of the column addresses are CA0 to CA3.

In the cell array 0, the gates of the MOS transistors 26-0 to 26-3 are connected to the first column select lines CSLA0 to CSLA3, respectively.

In the cell array 1, the gates of the MOS transistors 26-0 to 26-3 in the first column gates 24 adjacent to the shunt region SA1 are connected to the first column select lines CSLA3, CSLA0, CSLA1, and CSLA2, respectively. The remaining gates of the MOS transistors 26-0 to 26-3 are connected to the first column select lines CSLA0 to CSLA3, respectively.

In the cell array 2, the gates of the MOS transistors 26-0 to 26-3 in the first column gates 24 adjacent to the shunt region SA1 are connected to the first column select lines CSLA2, CSLA3, CSLA0, and CSLA1, respectively. The remaining gates of the MOS transistors 26-0 to 26-3 are connected to the first column select lines CLSA0 to CSLA3, respectively.

In the cell array 3, the gates of the MOS transistors 26-0 to 26-3 in the first column gates 24 adjacent to the shunt region SA1 are connected to the first column select lines CSLA1, CSLA2, CSLA3, and CSLA0, respectively. The remaining gates of the MOS transistors 26-0 to 26-3 are connected to the first column select lines CSLA0 to CSLA3, respectively.

The second column gate 25 comprises MOS transistors 27 each provided on a first column gate 24 basis. One end of a current path of a MOS transistor 27 is connected to a node N10 in the corresponding first column gate 24, and the other end is connected commonly to a sense amplifier. The gates of the MOS transistors 27 are connected to the second column select lines CSLB0 CSLB(m−1), respectively. Here, m denotes the number of first column gates 24. If 25 bit lines are provided and a first column gate 24 is provided by a four by four bit line basis, m=64. The second column select lines CSLB0 to CSLB(m−1) are selected when the least significant bits of the column addresses are CB0 to CB(m−1), respectively.

Next, using FIGS. 39 to 42, a plane configuration of the above column gate 20 will be explained. FIGS. 39 to 42 are plan views of a first column gate 24 and a second column gate 25 corresponding to each of the cell arrays 0 to 3.

As shown in FIGS. 39 to 42, in a column gate, a plurality of element regions AA are provided in a (5×m) matrix. Each element region is used to form any of the MOS transistors 26-0 to 26-3 and 27. That is, impurity diffused layers (source regions or drain regions) isolated from each other are formed in the element regions AA, and a gate electrode 70 is formed in the element region AA between the adjacent impurity diffused layers. From among the element regions AA provided in the above (5×m) matrix, the first column gate 24, i.e., the MOS transistors 26-0 to 26-3 are formed on (4×m) element regions AA close to the memory cell array 10. In addition, the second column gate 25, i.e., the MOS transistor 27 is formed on the remaining (1×m) element regions AA distant from the memory cell array 10.

First, the configuration of the second column gate 25 will be described here. Ones of the sources and the drains of m MOS transistors 27 are connected commonly to a second-layer metal wiring layer 72 with a first-layer metal wiring layer 71 and a contact plug 10 interposed therebetween. The metal wiring layer 72 is connected to a sense amplifier. Gate electrodes 70 of the MOS transistors 27 are electrically isolated from one another. The gate electrodes 70 are connected to second-layer metal wiring layers 74 isolated from one another with a contact plug CP11, a first-layer metal wiring layer 73 and a contact plug CP12 interposed therebetween. The metal wiring layers 74 function as the second column lines CSLB0 to CSLB(m−1). In addition, the others of the sources and the drains of the MOS transistors 27 are connected to the first-layer metal wiring layer 74 with a contact plug CP13 interposed therebetween. The metal wiring layer 74 functions as the node N10.

Now, the configuration of the first column gate 24 will be described here. Any of the MOS transistors 26-0 to 26-3 belonging to the same first column gate is formed in four element regions AA in a same column. Gate electrodes 70 on the element regions AA in a same row are connected commonly to each other, and the four-line gate electrodes 70 function as the first column select lines CSLA0 to CSLA3, respectively. In addition, either one of the source and the drain of each of the MOS transistors 26-0 to 26-3 in a same column is connected to the other one of the source and the drain of each of the MOS transistors 27 in a same column with a contact plug CP14, a metal wiring layer 74, and a contact plug CP13 interposed therebetween. Further, the other one of the source and the drain of each of the MOS transistors 26-0 to 26-3 is connected to any of the bit lines BL0 to BL255 with a contact plug CP15 interposed therebetween. The four MOS transistors 26-0 to 26-3 in a same column belong to the same first column gate 24. Then, the four MOS transistors 26-0 to 26-3 existing in the column are connected to bit lines BL(4$i$), BL(4$i$+1), BL(4$i$+2), and BL(4$i$+3), respectively.

Figure 39:
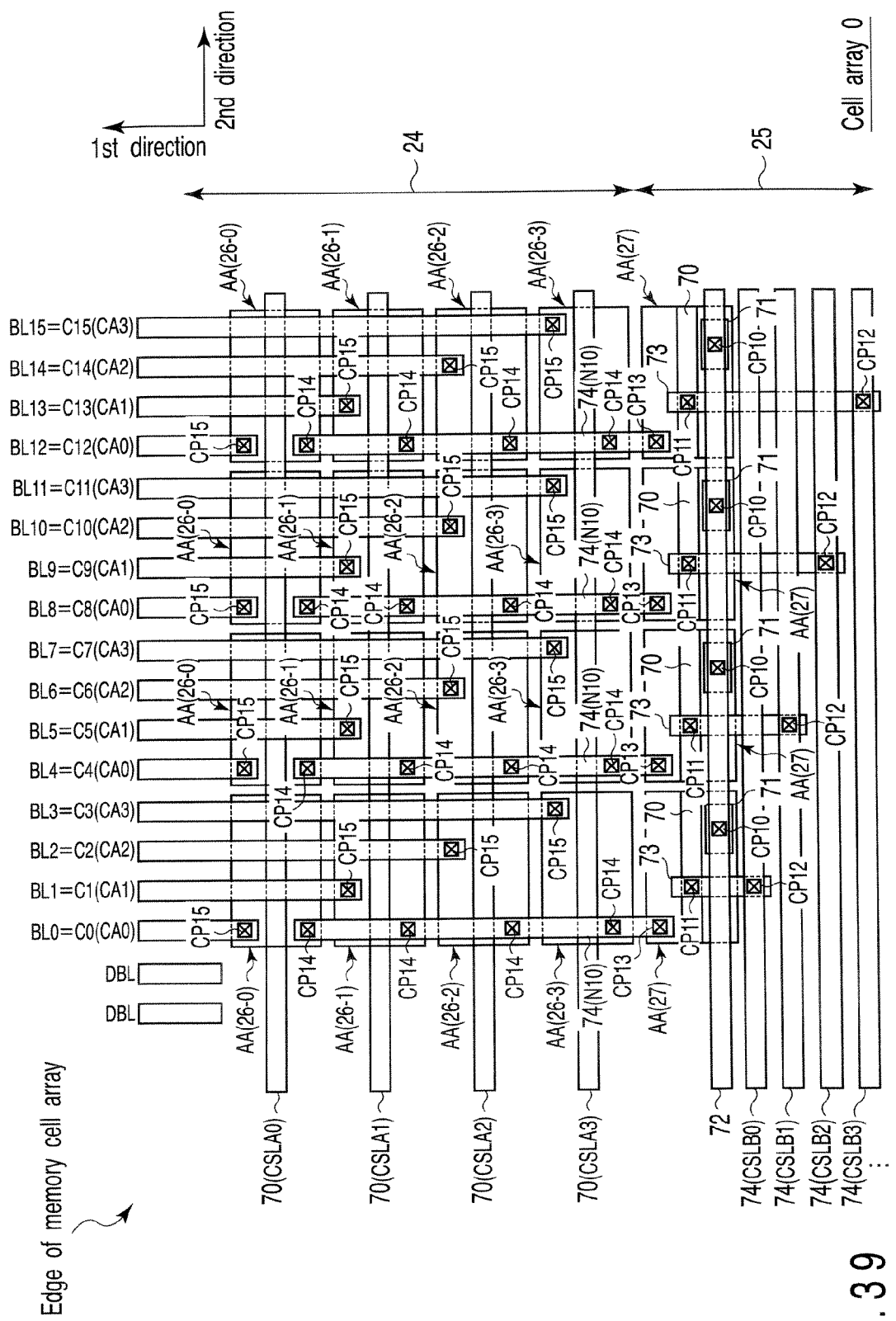
FIG. 39 to FIG. 42 are plan views of a column gate provided in the 2Tr flash memory in accordance with the second embodiment of the invention.

As shown in FIG. 39, in the cell array 0, in all the first column gates 24, MOS transistors 26-0 to 26-3 are formed, respectively, on element regions AA in which gate electrodes 70 serving as the first column select lines CSLA0 to CSLA3 are formed. That is, the MOS transistors 26-0 to 26-3 each are formed on the element regions AA in a same row. Therefore, wiring patterns of bit line BL(4$i$) to BL(4$i$+3) are identical to one another among the first column gates 24.

Figure 40:
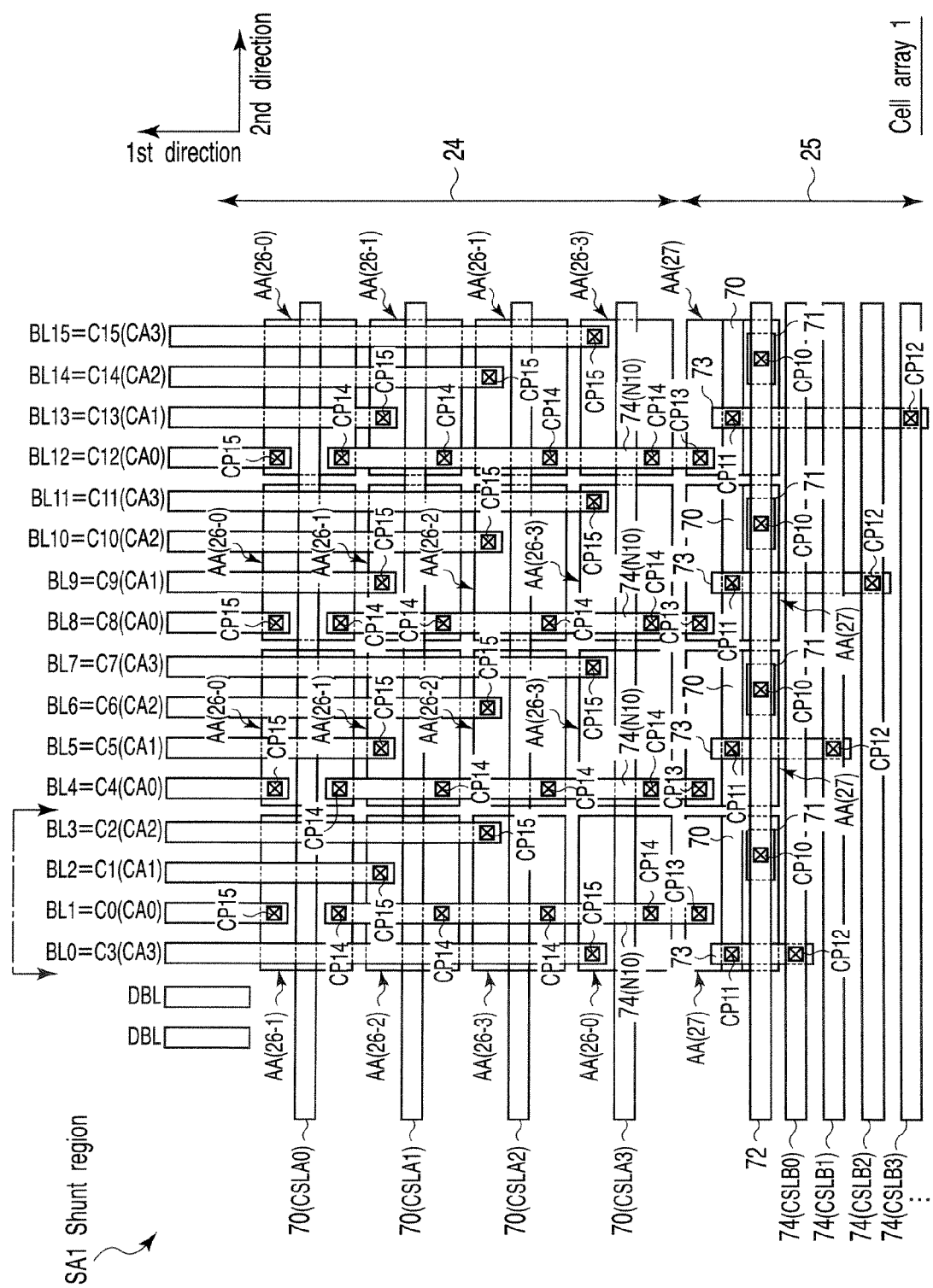

Now, the cell array 1 will be described here. As shown in FIG. 40, in all of the first column gates 24 other than those adjacent to the shunt region SA1 (i.e., dummy bit line), MOS transistors 26-0 to 26-3 are formed, respectively, on element regions AA in which gate electrodes 70 serving as the first column select lines CSLA0 to CSLA3 are formed, as in the cell array 0. On the other hand, in the first column gates 24 adjacent to the shunt region SA1, MOS transistors 26-1 to 26-3 and 26-0 are formed, respectively, on the element regions AA on which gate electrodes 70 serving as the first column select lines CSLA0 to CSLA3 are formed. Therefore, the wiring patterns of bit lines BL(4$i$) to BL(4$i$+3) are different from one another depending on whether or not the first column gates 24 are adjacent to the shunt region SA1. More specifically, a pattern is formed such that four bit lines in the first column gates 24 which are not adjacent to the shunt region SA1 are shifted to the significant bits by one bit line.

Figure 41:
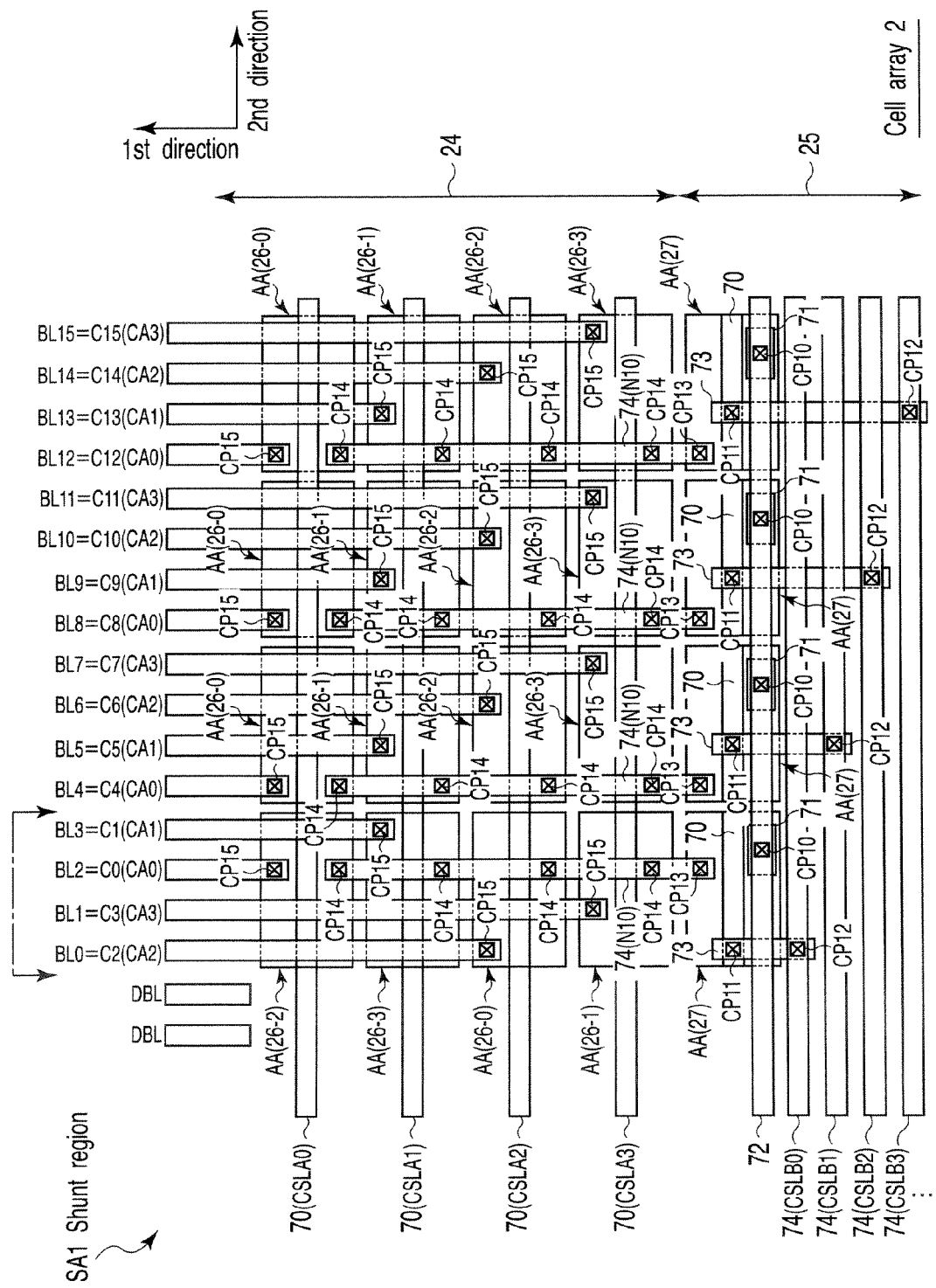

Next, the cell array 2 will be described here. As shown in FIG. 41, in all of the first column gates 24 other than those adjacent to the shunt region SA1, MOS transistors 26-0 to 26-3 are formed, respectively, on element regions AA in which gate electrodes 70 serving as the first column select lines CSLA0 to CSLA3 are formed, as in the cell arrays 0 and 1. On the other hand, in the first column gates 24 adjacent to the shunt region SA1, MOS transistors 26-2, 26-3, 26-0, and 26-1 are formed, respectively, on element regions AA in which gate electrodes 70 serving as the first column select lines CSLA0 to CSLA3 are formed. Therefore, the wiring patterns of bit lines BL4($i$) to BL(4$i$+3) are different from one another depending on whether or not the first column gates 24 are adjacent to the shunt region SA1. More specifically, four bit lines in the first column gates 24 which are not adjacent to the shunt region SA1 are shifted to the significant bits by two bit lines.

Figure 42:
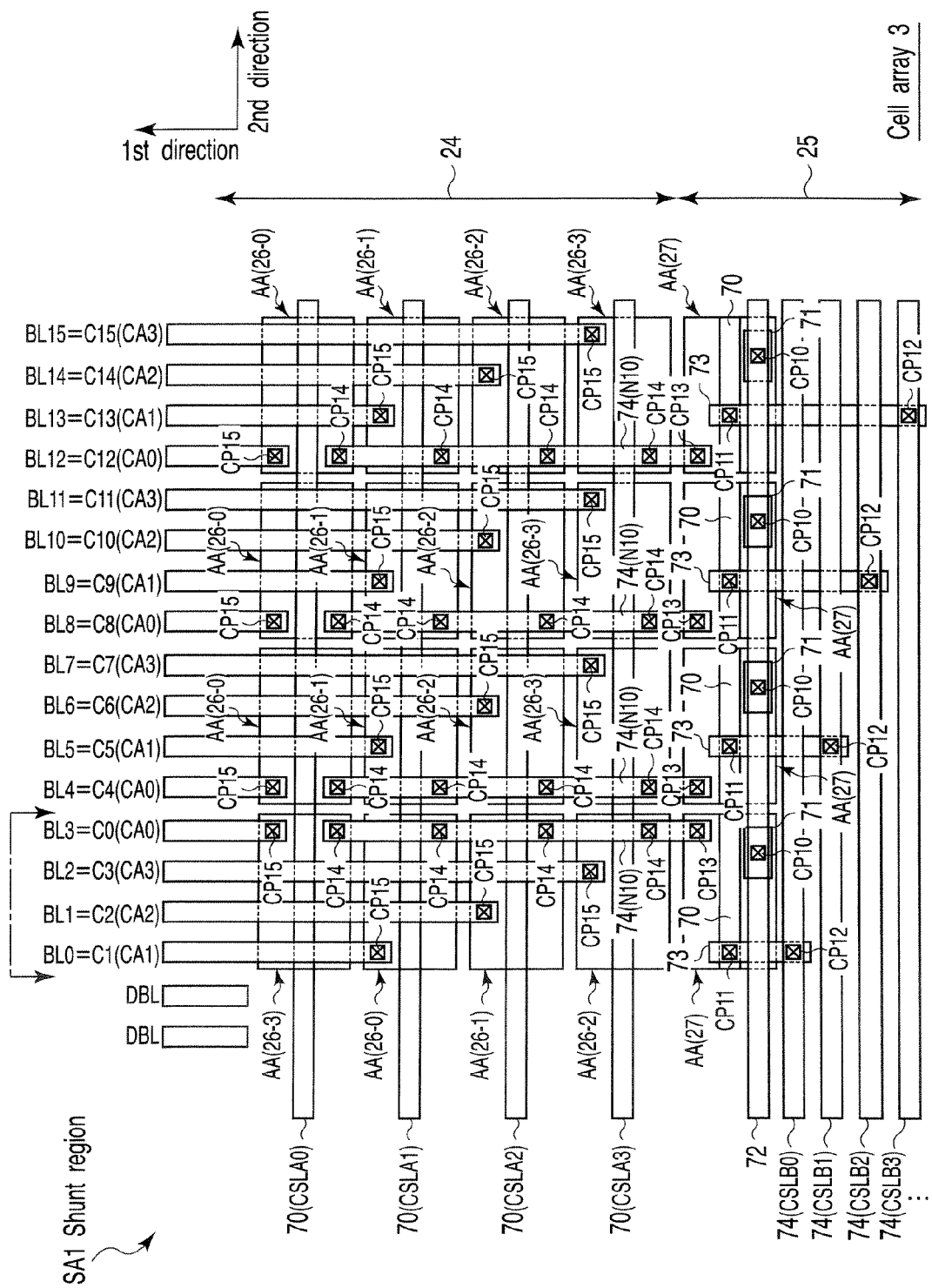

Next, the cell array 3 will be described here. As shown in FIG. 42, in all of the first column gates 24 other than those adjacent to the shunt region SA1, MOS transistors 26-0 to 26-3 are formed, respectively, on element regions AA in which gate elements 70 serving as the first column select lines CSLA0 to CSLA3 are formed, as in the cell arrays 0 to 2. On the other hand, in the first column gates 24 adjacent to the shunt region SA1, MOS transistors 26-2, 26-3, 26-0, and 26-1 are formed, respectively, on element regions AA in which gate elements 70 serving as the first column select lines CSLA0 to CSLA3 are formed. Therefore, the wiring patterns of bit lines BL4($i$) to BL(4$i$+3) are different from one another depending on whether or not the first column gates 24 are adjacent to the shunt region SA1. More specifically, four bit lines in the first column gates 24 which are not adjacent to the shunt region SA1 are shifted to the significant bits by three bit lines.

In the above configuration, assuming that the number of bit lines in each cell array is 256, any of the first column select lines CSLA0 to CSLA3 is selected by the least significant bits CA0 to CA3 of the column addresses. Further, any of the second column select lines CSLB0 to CSLB63 is selected by the significant six bits CB0 to CB63 of the column addresses. As a result, any one of the bit lines BL0 to BL255 is connected to a sense amplifier.

Using FIGS. 35 to 38, an operation of the above column selector 20 will be described by way of example in which a column address C0 has been input. Since the least significant two bits of the column address C0 are CA0, the first column select line CSLA0 is made high, and the other first column select lines CSLA1 to CSLA3 are made low. In addition, since the significant sixth bits are CB0, the second column select line CSLA0 is made high, and the other second column select lines CSLB1 to CSLB3 are made low.

Then, in the cell array 0, MOS transistors 26-0 are turned on in all the first column gates 24. In the second column gate, a MOS transistor 27 which is the closest to an edge of a memory cell array is turned on. Therefore, only a bit line BL0 adjacent to the edge of the memory cell array is selected and is connected to a sense amplifier.

In the cell array 1, in all the first column gates 24 which are not adjacent to a shunt region SA1, MOS transistors 26-0 are turned on. In the first column gates 24 adjacent to a shunt region SA1, MOS transistors 26-0 are turned off, and instead, MOS transistors 26-1 are turned on. In the second column gate, a MOS transistor 27 which is the closest to an edge of a memory cell array end part is turned on. Therefore, a bit line BL0 adjacent to the shunt region is unselected, and only a bit line BL1 which is not adjacent thereto is selected, and is connected to a sense amplifier.

In the cell array 2, in all the first column gates 24 which are not adjacent to a shunt region SA1, MOS transistors 26-0 are turned on. In the first column gates 24 adjacent to a shunt region SA1, MOS transistors 26-0 are turned off, and instead, MOS transistors 26-2 are turned on. In addition, in the second column gate, a MOS transistor 27 which is a closest to a memory cell array end part is turned on. Therefore, a bit line BL0 adjacent to the shunt region is unselected, and only a bit line BL2 which is not adjacent thereto is selected, and is connected to a sense amplifier.

In the cell array 3, in all the first column gates 24 which are not adjacent to a shunt region SA1, MOS transistors 26-0 are turned on. In the first column gates 24 adjacent to a shunt region SA1, MOS transistors 26-0 are turned off, and instead, MOS transistors 26-3 are turned on. In the second column gate, a MOS transistor 27 which is the closest to a memory cell array end part is turned on. Therefore, a bit line BL0 adjacent to the shunt region is unselected, and only a bit line BL3 which is not adjacent thereto is selected, and is connected to a sense amplifier.

As described above, with the configuration according to the present embodiment, a connection relationship between a column gate 20 and a bit line is changed among the cell arrays 0 to 3, thereby making it possible to achieve a method of assigning column addresses described in the foregoing first embodiment. Therefore, advantageous effects described in items (1) and (2) in the first embodiment can be attained. Further, advantageous effect described in item (3) below can be attained.

(3) The First Embodiment can be Achieved Without Causing a Complicated Manufacturing Process.

With the configuration according to the present embodiment, wiring patterns are identical to one another with respect to all cell arrays, and there is no need for making a design change relevant to a conventional structure. As shown in FIGS. 39 to 42, MOS transistors in a column gate 20 may be arranged in the same manner as conventionally. With respect to part of the second column gates, a contact position between each of the MOS transistors 26-0 to 26-3 and a bit line BL may be changed. That is, patterns of a metal wiring layer 44 and a metal wiring layer 74 serving as bit lines may be partially changed, making it possible to reduce a change of a manufacturing process to the minimum.

Figure 43:
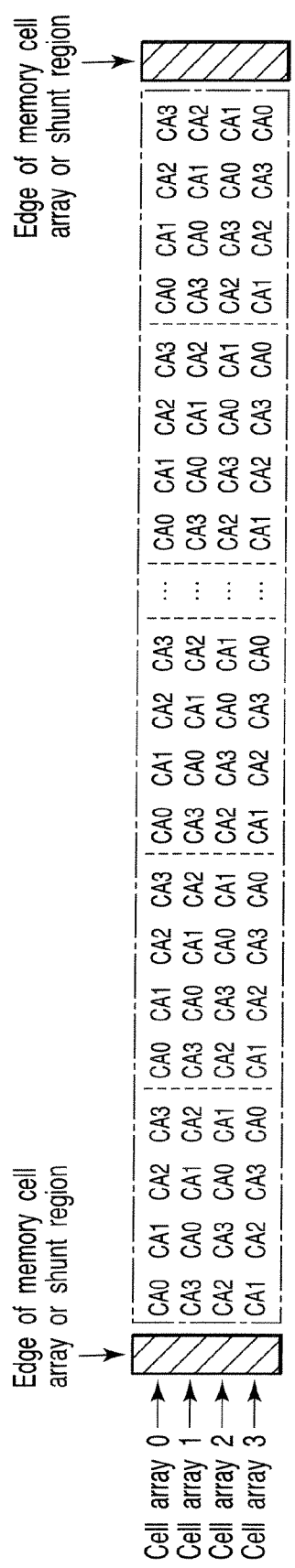
FIG. 43 is a conceptual view showing a relationship between each of cell arrays provided in a 2Tr flash memory in accordance with a third embodiment of the invention and a column address thereof.

Next, a semiconductor memory device in accordance with a third embodiment of the invention will be described here. While only the column addresses of bit lines adjacent to the edge of the memory cell array and shunt region are replaced with the replacement column addresses in the foregoing first and second embodiments, column addresses of all bit lines in cell arrays are replaced with the replacement column addresses in the present embodiment. Hereinafter, a description will be given with respect to a case in which four cell arrays are provided and one first column fate 24 is provided by a four by four bit line basis. FIG. 43 shows, with respect to cell arrays 0 to 3, the least significant two bits of column addresses assigned to bit lines in regions sandwiched between an edge of a memory cell array and a shunt region or between adjacent shunt regions SA1.

As shown in the figure, in the cell array 0, column addresses are assigned by a four by four bit line basis such that the least significant bits are CA1 to CA3. This assignment is identical to those according to the first and second embodiments.

In the cell array 1, in addition to four bit lines adjacent to the shunt region SA1, column addresses are assigned to all bits of the cell array 1 such that the least significant two bits are CA3, CA0, CA1, and CA2. That is, the least significant two bits of the column addresses assigned to bit lines are repetitions of CA3, CA0, CA1, and CA2 in all the regions of the cell array 1. In other words, the least significant two bits of the column addresses of all the bit lines BL(4$i$), BL(4$i$+1), BL(4$i$+2), and BL(4$i$+3) are CA3, CA0, CA1, and CA2, respectively.

In the cell array 2 as well, in addition to four bit lines adjacent to the shunt region SA1, column addresses are assigned to all bits of the cell array 2 such that the least significant two bits are CA2, CA3, CA0, and CA1. That is, the least significant two bits of the column addresses assigned to bit lines are repetitions of CA2, CA3, CA0, and CA1 in all the regions of the cell array 2. In other words, the least significant two bits of the column addresses of all the bit lines BL(4$i$), BL(4$i$+1), BL(4$i$+2), and BL(4$i$+3) are CA2, CA3, CA0, and CA1, respectively.

In the cell array 3 as well, in addition to four bit lines adjacent to the shunt region SA1, column addresses are assigned to all bits of the cell array 3 such that the least significant two bits are CA1, CA2, CA3, and CA0. That is, the least significant two bits of the column addresses assigned to bit lines are repetitions of CA1, CA2, CA3, and CA0 in all the regions of the cell array 3. In other words, the least significant two bits of the column addresses of all the bit lines BL(4$i$), BL(4$i$+1), BL(4$i$+2), and BL(4$i$+3) are CA1, CA2, CA3, and CA0, respectively.

Figure 44:
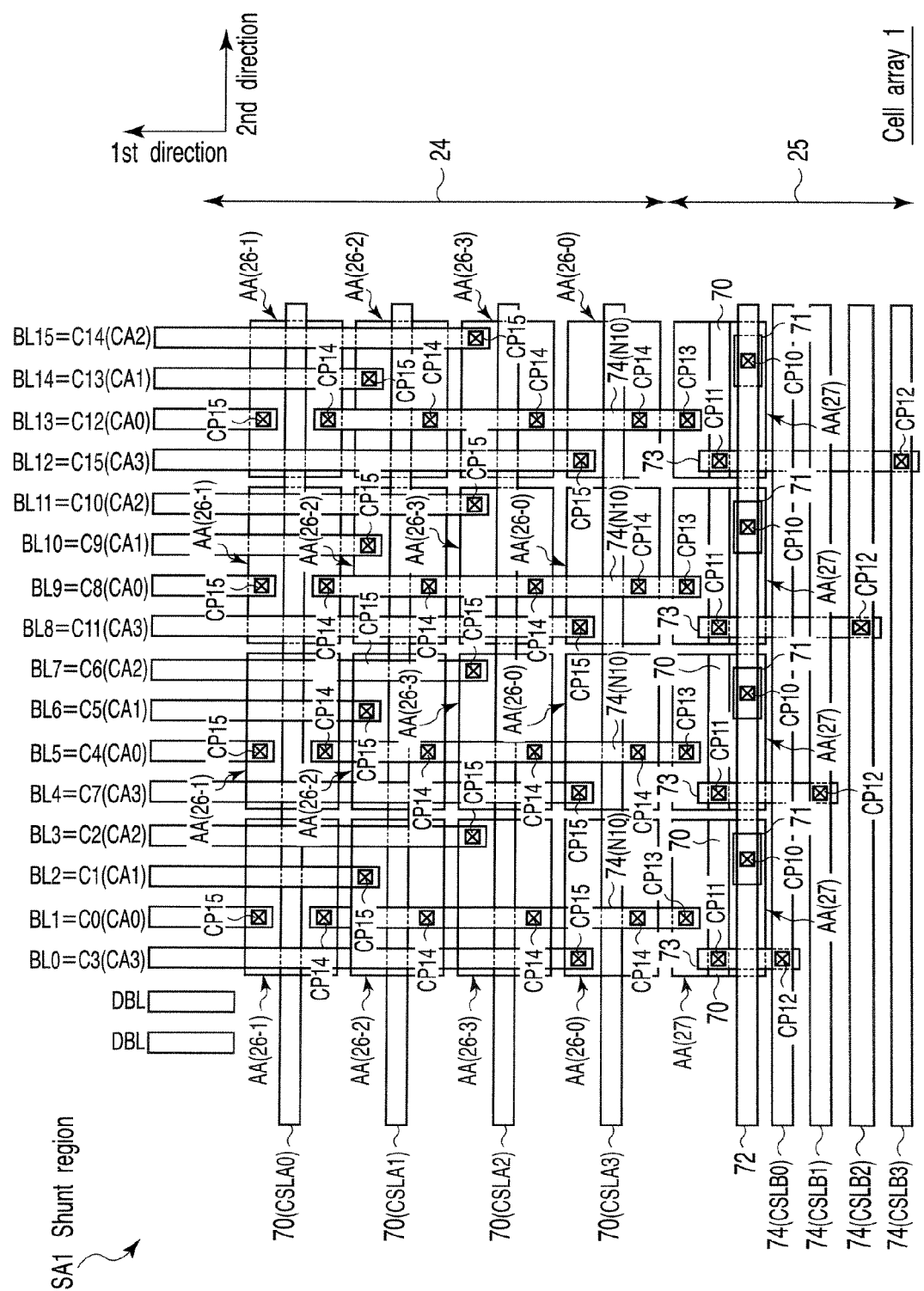
FIG. 44 to FIG. 46 are a plan views of a column gate provided in the 2Tr flash memory in accordance with the third embodiment of the invention.
Figure 45:
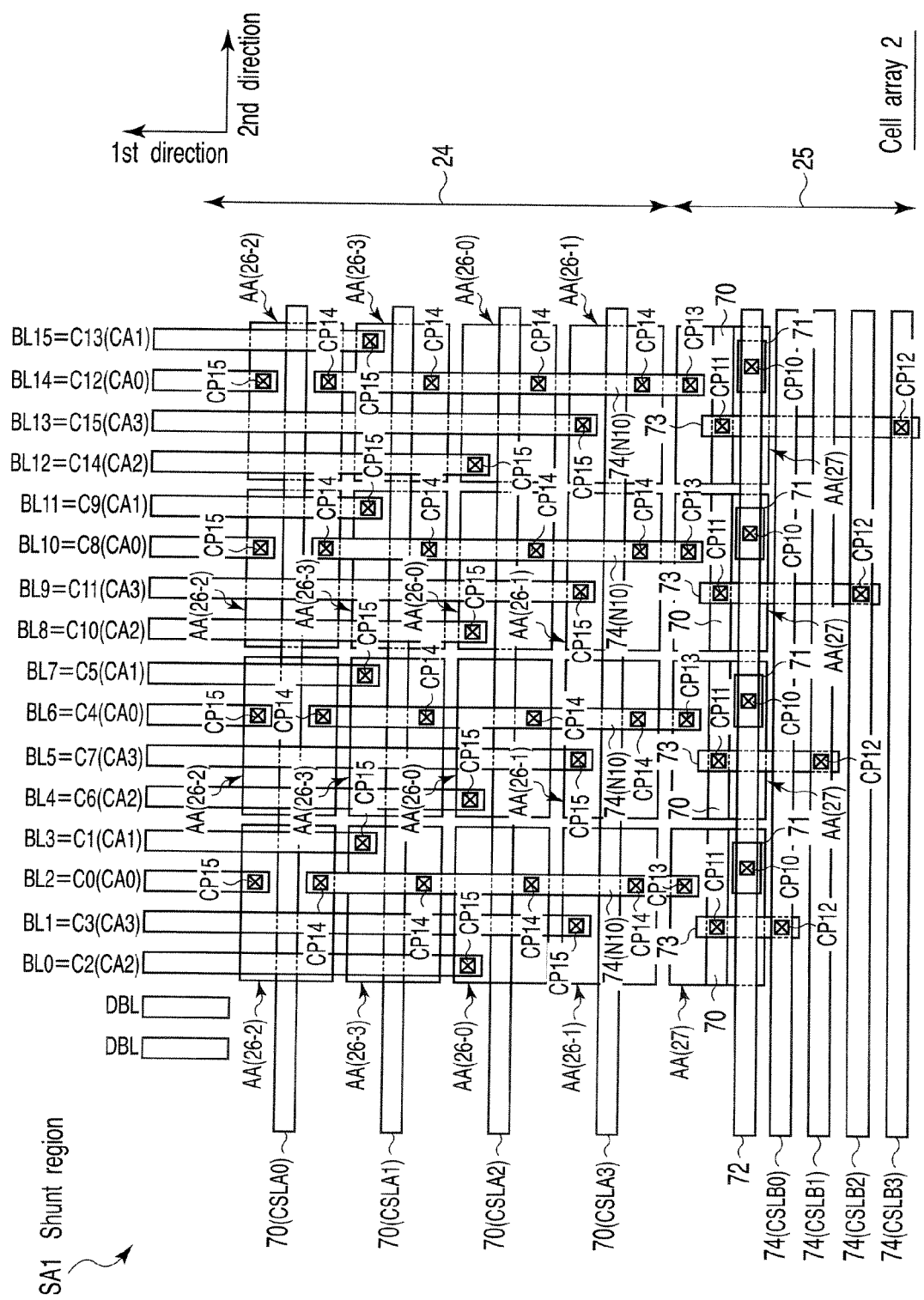
Figure 46:
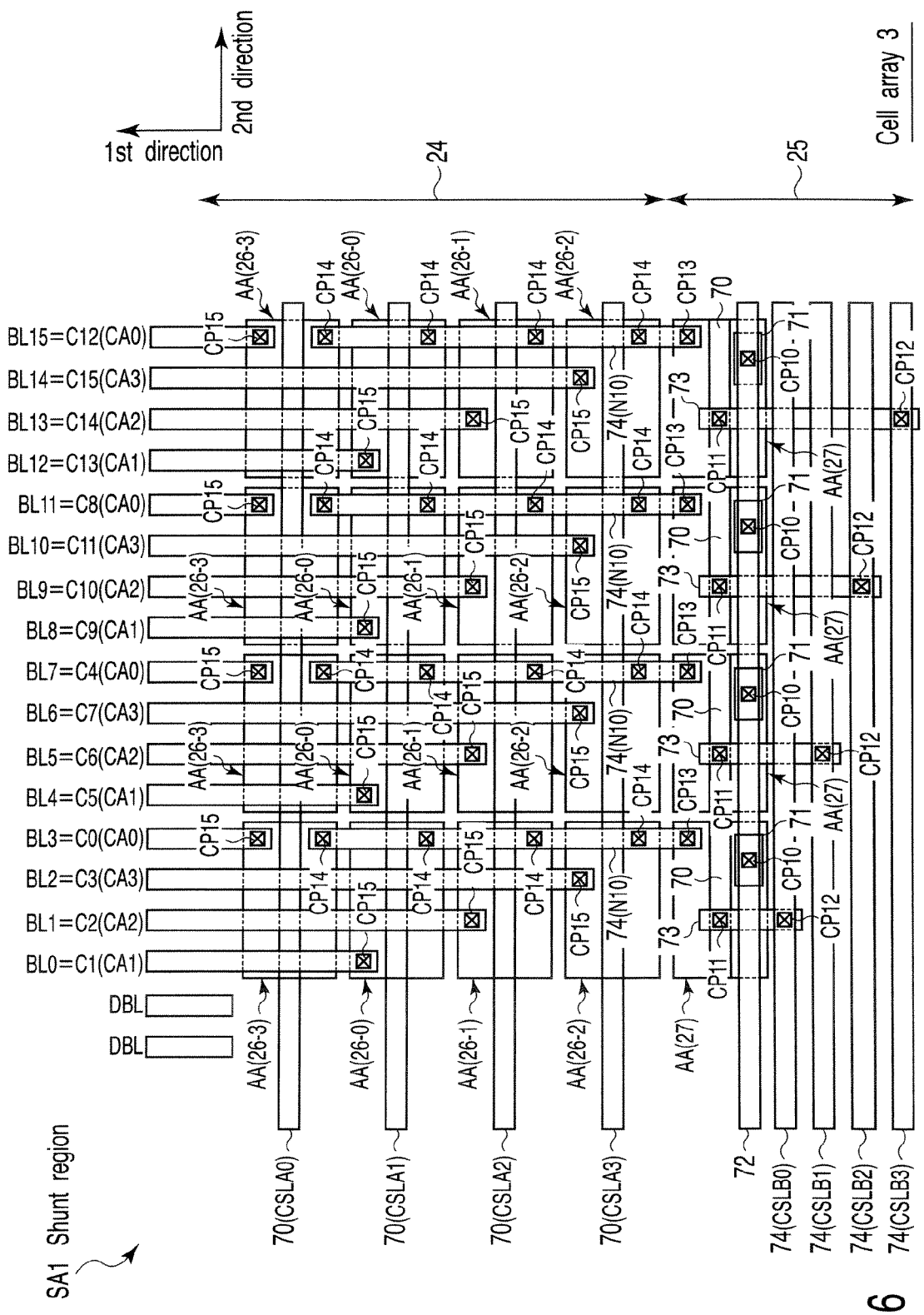

FIGS. 44 to 46 are plan view of cell arrays 1 to 3 and a column gate 20. The cell array 0 is identical to that shown in FIG. 39 described in the foregoing second embodiment. With the cell arrays 1 to 3, the wiring patterns of the first column gates 24 adjacent to the shunt region described in the foregoing second embodiment are applied for all of the first column gates 24. That is, with respect to the cell array 1, a MOS transistor 26-1 is formed on an element region AA in which a gate electrode 70 serving as a first column select line CSLA0 is formed. A MOS transistor 26-2 is formed on an element region AA in which a gate electrode 70 serving as a first column select line CSLA1 is formed. A MOS transistor 26-3 is formed on an element region AA in which a gate electrode 70 serving as a first column select line CSLA2 is formed. A MOS transistor 26-0 is formed on an element region AA in which a gate electrode 70 serving as a first column select line CSLA3 is formed. In addition, the MOS transistors 26-0 to 26-3 are formed on element regions AA in a same row.

With respect to the cell array 2, a MOS transistor 26-2 is formed on an element region AA in which a gate electrode 70 serving as a first column select line CSLA0 is formed. A MOS transistor 26-3 is formed on an element region AA in which a gate electrode 70 serving as a first column select line CSLA1 is formed. A MOS transistor 26-0 is formed on an element region AA in which a gate electrode 70 serving as a first column select line CSLA2 is formed. A MOS transistor 26-1 is formed on an element region AA in which a gate electrode 70 serving as a first column select line CSLA3 is formed. In addition, the MOS transistors 26-0 to 26-3 are formed on element regions AA in a same row.

With respect to the cell array 3, a MOS transistor 26-3 is formed on an element region AA in which a gate electrode 70 serving as a first column select line CSLA0 is formed. A MOS transistor 26-0 is formed on an element region AA in which a gate electrode 70 serving as a first column select line CSLA1 is formed. A MOS transistor 26-1 is formed on an element region AA in which a gate electrode 70 serving as a first column select line CSLA2 is formed. A MOS transistor 26-2 is formed on an element region AA in which a gate electrode 70 serving as a first column select line CSLA3 is formed. The MOS transistors 26-0 to 26-3 are formed on element regions AA in a same row.

As described above, with the configuration according to the present embodiment, in addition to advantageous effects (1) and (2) described in the first embodiment, the following advantageous effect (4) can be attained.

(4) The Advantageous Effects (1) and (2) can be Attained Without Causing a Complicated Manufacturing Process.

According to the present embodiment, unlike the foregoing second embodiment, the wiring patterns of the first column gates 24 are identical to one another with respect to each cell array. That is, in view of only the first column gates 24 corresponding to the same cell array, their wiring pattern is a repetition of the same patterns over all the regions. Therefore, a manufacturing process is not complicated, and the reliability of a patterning process can be improved.

Figure 47:
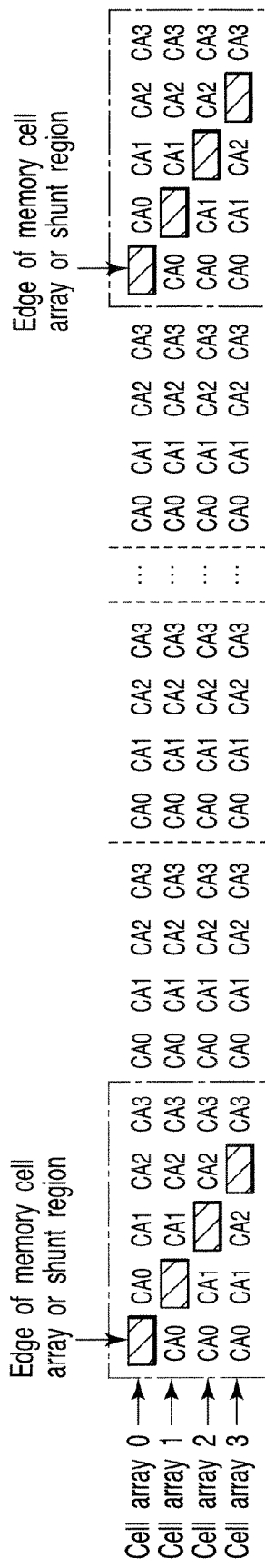
FIG. 47 is a conceptual view showing a relationship between each of cell arrays provided in a 2Tr flash memory in accordance with a fourth embodiment of the invention and a column address thereof.

Next, a semiconductor memory device in accordance with a fourth embodiment of the invention will be described here. In the present embodiment, a method of assigning column addresses described in the foregoing first embodiment is achieved by a method which is different from that according to the second embodiment. Hereinafter, a description will be given with respect to a case in which four cell arrays are provided and one first column gate 24 is provided on a four by four bit line basis. FIG. 47 shows, with respect to cell arrays 0 to 3, the least significant two bits of column addresses assigned to bit lines of a region sandwiched between memory cell array end parts or shunt regions SA1.

As shown in FIG. 47, in the cell arrays 0 to 3, column addresses are assigned to bit lines such that the least significant two bits are a repetition of CA0 to CA3. In addition, a positional relationship between the edge of the memory cell array or shunt region SA1 and a bit line is different among the cell arrays 0 to 3. That is, in the cell array 0, a shunt region SA1 is provided between a bit line in which the least significant two bits are CA0 and a bit line in which the least significant two bits are CA3. In the cell array 1, a shunt region SA1 is provided between a bit line in which the least significant two bits are CA0 and a bit line in which the least significant two bits are CA1. In the cell array 2, a shunt reason SA1 is provided between a bit line in which the least significant two bits are CA1 and a bit line in which the least significant two bits are CA2. In the cell array 3, a shunt reason SA1 is provided between a bit line in which the least significant two bits are CA2 and a bit line in which the least significant two bits are CA3.

Figure 48:
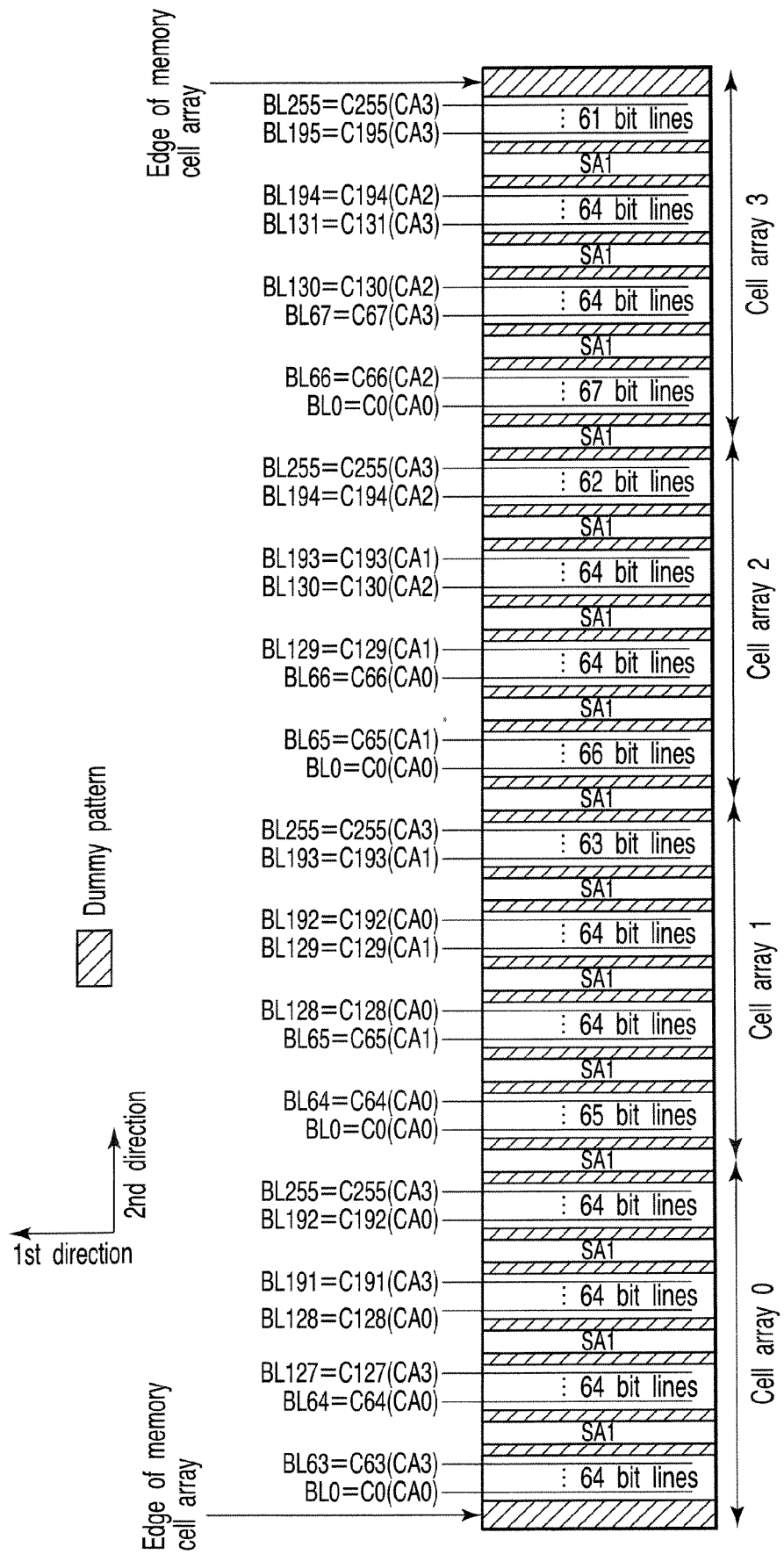
FIG. 48 is a plan view of a memory cell array provided in the 2Tr flash memory in accordance with the fourth embodiment of the invention, and is a view adopted to explain how shunt regions are arranged in the cell array.

A relationship between a shunt region SA1 and a bit line will be described in detail with reference to FIG. 48. FIG. 48 shows how the shunt region SA1 and a dummy bit line DBL (dummy pattern) are arranged in the cell arrays 0 to 3.

As shown in FIG. 48, in each of the cell arrays 0 to 3, column addresses C0 to C255 are assigned, respectively, to bit lines BL0 to BL255. Therefore, in all the cell arrays 0 to 3, the least significant two bits of the column addresses of bit lines BL(4$i$), BL(4$i$+1), BL(4$i$+2), and BL(4$i$+3) are CA0 to CA3, respectively, and CA0 to CA3 are repeated on a four by four bit line basis.

In the cell array 0, a shunt region SA1 is arranged on a 64 by 64 bit line basis. Therefore, the bit lines adjacent to the edge of the memory cell array and the shunt region SA1 are BL0, BL63, BL64, BL127, BL128, BL191, BL192, and BL255.

The shunt region SA1 in the cell array 1 is provided to be shifted to the significant bit side by one bit line as compared with those in the cell array 0. That is, at the least significant bit side in the cell array 1, 65 bit lines are provided between the shunt regions SA1, and 63 bit lines are provided at the significant bit side. In a region between these portions, a shunt region SA1 is provided on a 64 by 64 bit line basis. Therefore, the bit lines adjacent to the shunt region SA1 are BL0, BL64, BL65, BL128, BL129, BL192, BL193, and BL255.

The shunt region SA1 in the cell array 2 is provided to be further shifted to the significant bit side by one bit line as compared with that in cell array 1. That is, at the least significant bit side in the cell array 2, 66 bit lines are provided between the shunt regions SA1, and 62 bit lines are provided at the significant bit side. In a region between these portions, a shunt region SA1 is provided on a 64 by 64 bit line basis. Therefore, the bit lines adjacent to the shunt region SA1 are BL0, BL65, BL66, BL129, BL130, BL193, BL194, and BL255.

The shunt region SA1 in the cell array 3 is provided to be further shifted to the significant bit side by one bit line as compared with that in cell array 2. That is, at the least significant bit side in the cell array 3, 67 bit lines are provided between the shunt regions SA1, and 61 bit lines are provided at the significant bit side. In a region between these portions, a shunt region SA1 is provided on a 64 by 64 bit line basis. Therefore, the bit lines adjacent to the shunt region SA1 are BL0, BL66, BL67, BL130, BL131, BL194, BL195, and BL255.

That is, in the cell arrays 0 to j, the number of bit lines between the adjacent shunt regions or between an edge of a memory cell array and a shunt region is (64+j) at the least significant bit side and is (64−j) at the most significant bit side.

Figure 49:
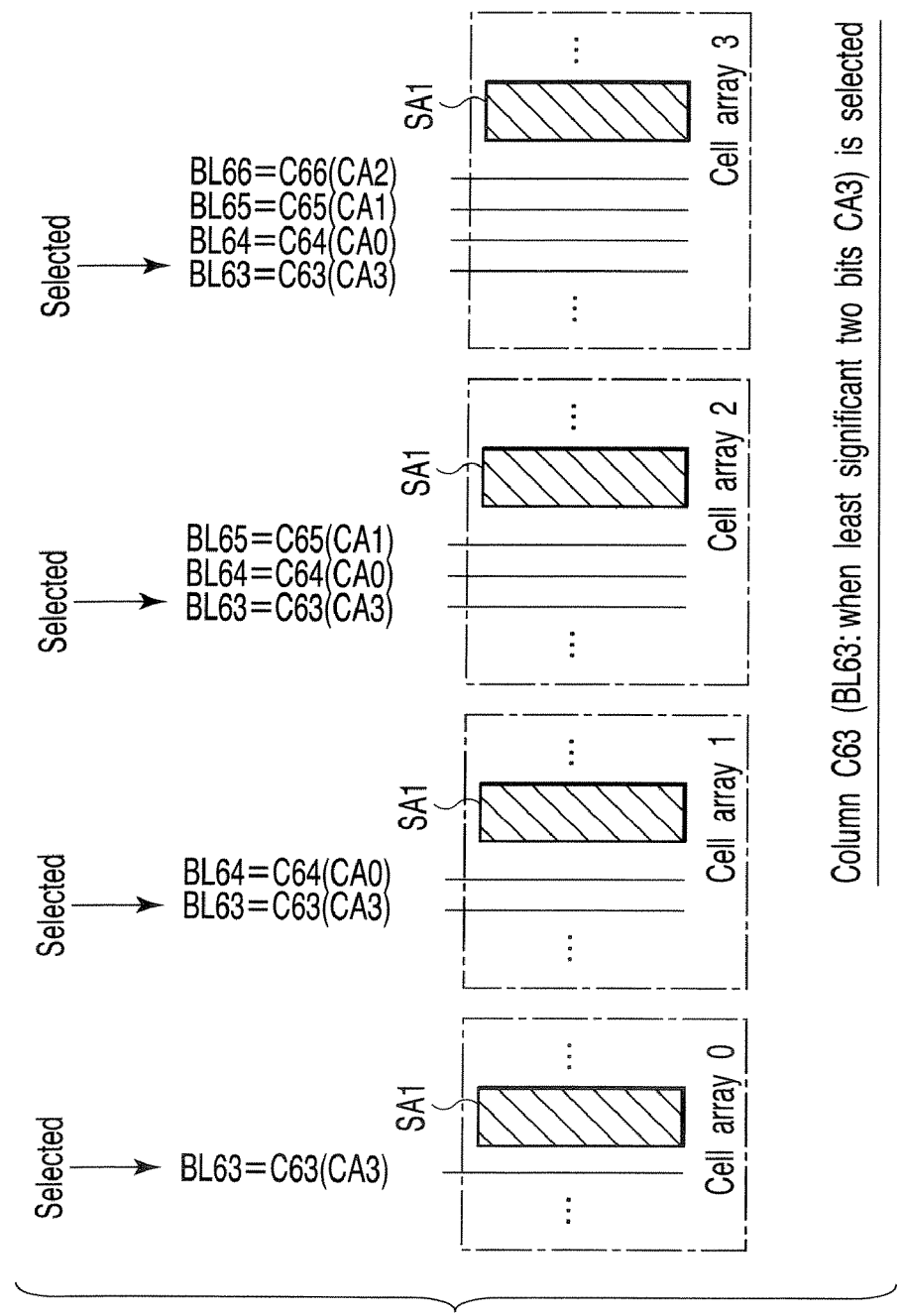
FIG. 49 is a circuit diagram of cell arrays provided in the 2Tr flash memory in accordance with the fourth embodiment of the invention.

Now, an appearance at the time of selection of bit lines in the present embodiment will be described with reference to FIG. 49. FIG. 49 shows an appearance of cell arrays 0 to 3 when a column address C63 has been input.

As shown in FIG. 49, the column address C63 has been input, whereby bit lines BL63 are selected in all of the cell arrays 0 to 3. A bit line BL63 of the cell array 0 comes into contact with a shunt region SA1, whereas bit lines BL63 of the cell arrays 1 to 3 do not contact a shunt region SA1. This is because only the bit lines BL64, BL65, and BL66 come into contact with the shunt region SA1 in the cell arrays 1 to 3.

As described above, even in the configuration according to the present embodiment, the advantageous effects (1) and (2) described in the first embodiment can be attained.

Figure 50:
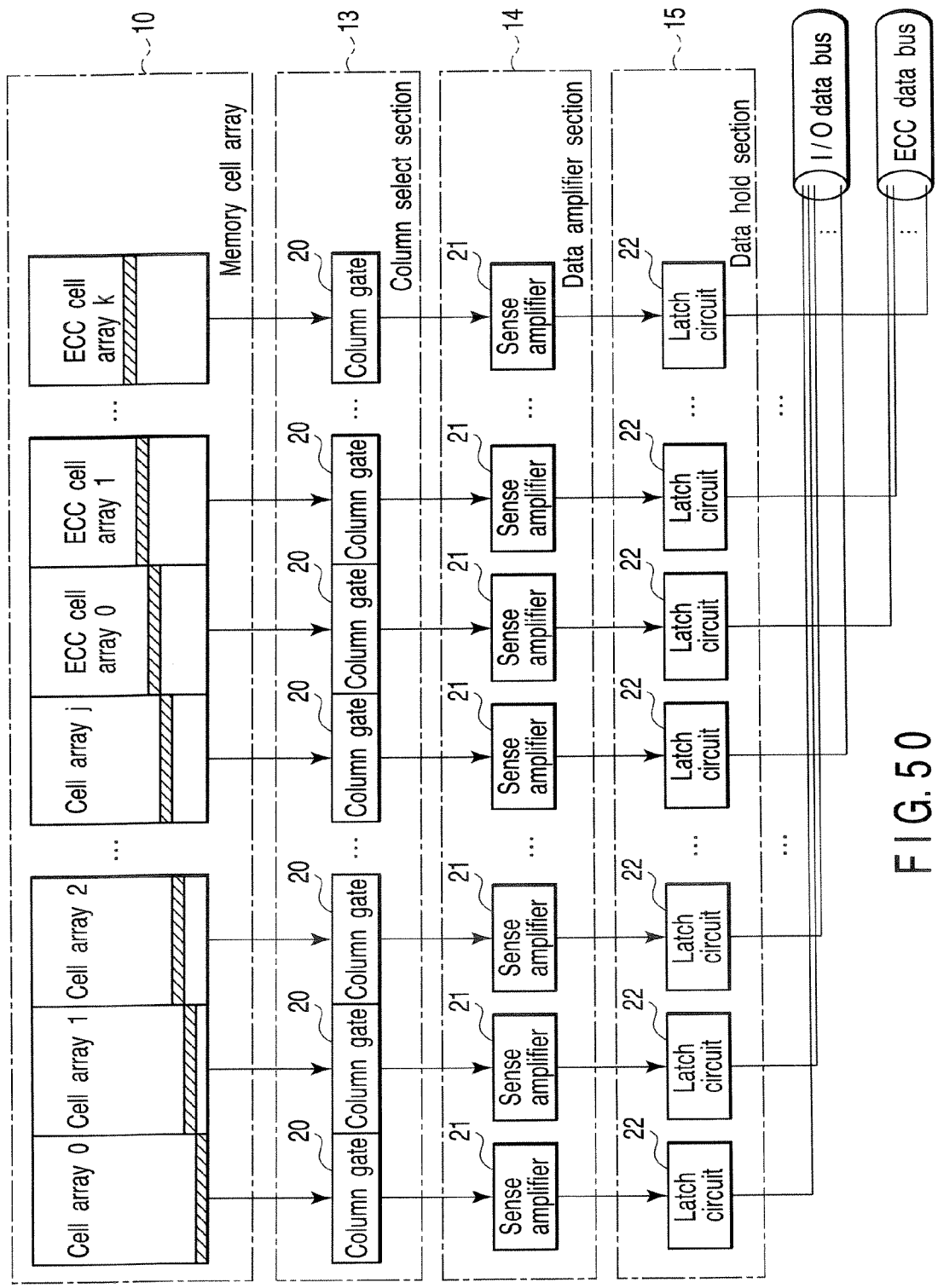
FIG. 50 is a block diagram of a memory cell array, a column select section, a data amplifier section, and a data hold section provided in a 2Tr flash memory in accordance with a fifth embodiment of the invention.

Next, a semiconductor memory device in accordance with a fifth embodiment of the invention will be described with reference to FIG. 50. FIG. 50 is a block diagram of a memory cell array 10, a column select section 13, a data amplifier section 14, and a data hold section 15 of a 2Tr flash memory in accordance with the present embodiment. While the foregoing first embodiment relates to the configuration in which a plurality of bit lines adjacent to an edge of a memory cell array or a shunt region SA1 are not selected at the same time, the present embodiment relates to the configuration in which a plurality of word lines (or select gate lines) adjacent to an edge of a memory cell array are not selected at the same time. In the cell arrays 0 to j and ECC cell arrays 0 to k shown in FIG. 50, the shaded region indicates a word line selected when a certain row address has been input. That is, when a word line which is positioned at the edge of the memory cell array is selected in a certain cell array or ECC cell array, a word line which is not positioned at the memory cell array is selected in the other cell arrays or ECC cell arrays.

Figure 51:
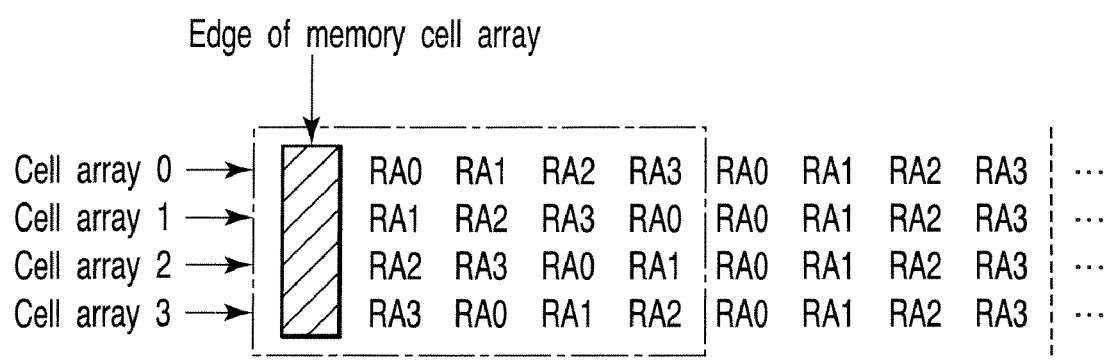
FIG. 51 is a conceptual view showing a relationship between each of cell arrays provided in the 2Tr flash memory in accordance with the fifth embodiment of the invention and a column address thereof.

FIG. 51 shows, with respect to the cell arrays 0 to 3, the least significant two bits of a low address assigned to a word line. In the cell arrays 0 to 3, row addresses are assigned to word lines in a pattern as shown in FIG. 51. The low addresses of the word lines adjacent to the edge of the memory cell array are totally different from one another among the cell arrays 0 to 3. For example, the least significant two bits of a row address assigned to a word line adjacent to the edge of the memory cell array are RA0 in the cell array 0; RA1 in the cell array 1; RA2 in the cell array 2; and RA3 in the cell array 3. Therefore, in the case where a word line adjacent to the edge of the memory cell array has been selected in any cell array, a word line which is adjacent to a shunt region is selected in the other cell arrays.

Figure 52:
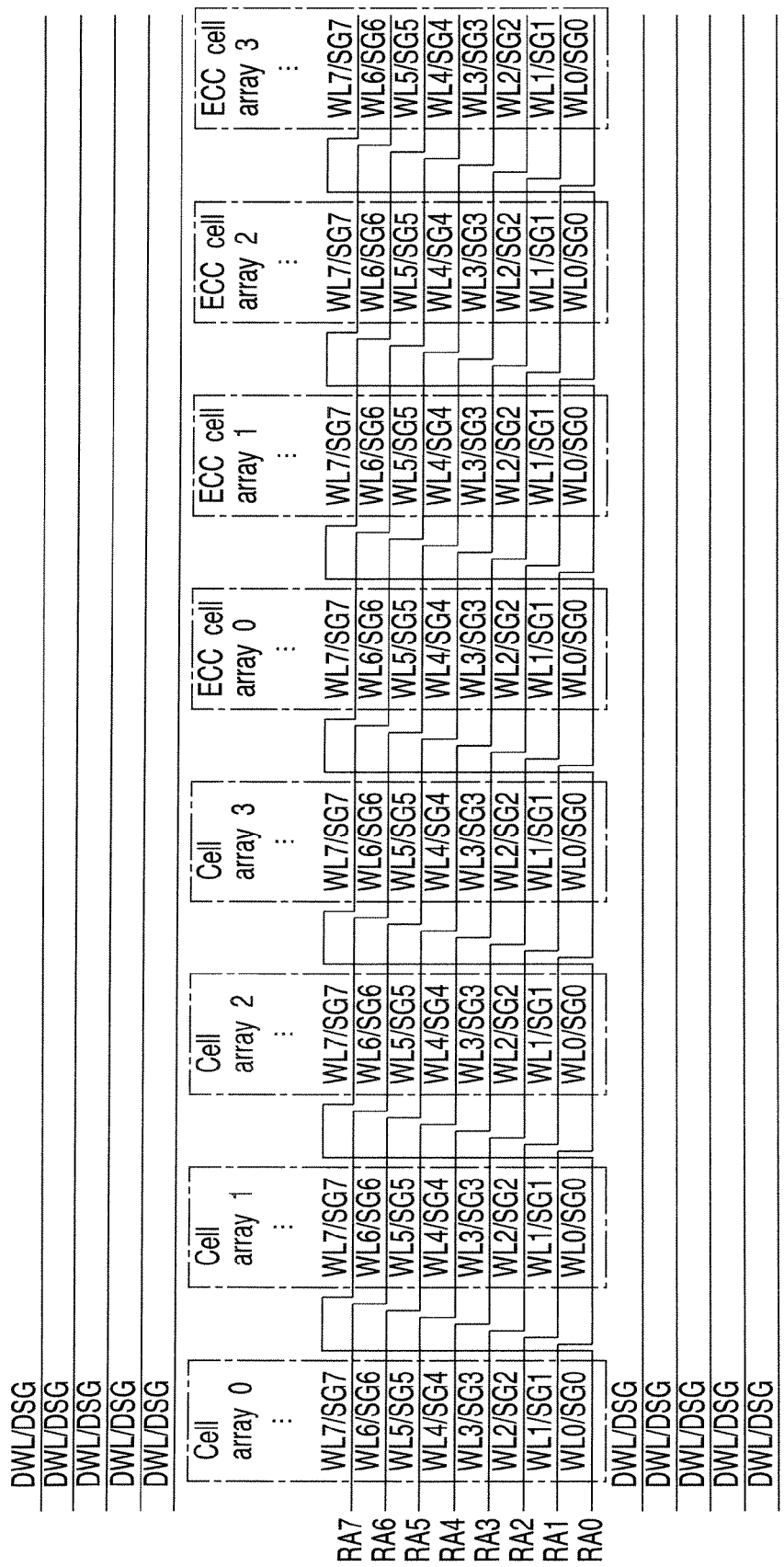
FIG. 52 is a circuit diagram of cell arrays provided in the 2Tr flash memory in accordance with the fifth embodiment of the invention.

Now, a connection relationship between word lines among cell arrays will be described with reference to FIG. 52. FIG. 52 is a schematic view of a memory cell array including four cell arrays 0 to 3 and four ECC cell arrays 0 to 3. In order to avoid duplicate selections of the word lines adjacent to the edge of the memory cell array among the eight cell arrays, it is necessary to switch a row address with respect to eight word lines WL0 to WL7. As shown in FIG. 52, in the cell array 0, the word line WL0 adjacent to the edge of the memory cell array is connected commonly to the word lines WL7 to WL5 in the cell arrays 1 to 3 and the word lines WL4 to WL1 in the ECC cell arrays 0 to 3. The word line WL1 in the cell array 1 is connected commonly to the word lines WL0, and WL7 to WL6 in the cell arrays 1 to 3 and the word lines WL5 to WL2 in the ECC cell arrays 0 to 3. Further, the word line WL2 in the cell array 1 is connected commonly to the word lines WL1, WL0, and WL7 in the cell arrays 1 to 3 and the word lines WL6 to WL3 in the ECC cell arrays 0 to 3. Further, the word line WL3 in the cell array 1 is connected commonly to the word lines WL2 to WL0 and WL7 to WL4 in the cell arrays 1 to 3 and the ECC cell arrays 0 to 3, respectively. Further, the word line WL4 in the cell array 1 is connected commonly to the word lines WL3 to WL1 in the cell arrays 1 to 3 and the word lines WL0, WL7 to WL4 in the ECC cell arrays 0 to 3. The connections are as shown in FIG. 52.

With the configuration according to the present embodiment, the advantageous effect (1) described in the foregoing first embodiment can be attained. Whatever a column direction or a row direction may be, a distortion in dimensions of word lines or select gate lines is likely to occur with the edge of the memory cell array. Therefore, the characteristics of MOS transistors in a memory cell are distorted. As one of the countermeasures against such a distortion, as shown in FIG. 52, there is a technique of providing a dummy word line DWL and a dummy select line DSG as is the case with columns, but there are many cases in which sufficient countermeasures are not taken. As a result, in an ECC circuit in which a correction enable bit is 1 bit or 2 bits, there occurs a problem that the efficiency of recovery of a faulty cell cannot be improved.

However, with the configuration according to the present embodiment, in the case where a word line adjacent to an edge of a memory cell array has been selected in any cell array, a word line selected by another cell array is provided as a word line which is adjacent to an edge of a memory cell array. Therefore, a probability that a plurality of faulty word lines are selected becomes very low, and the efficiency of recovery using an ECC circuit can be effectively improved.

Next, a semiconductor memory device according to a sixth embodiment of the invention will be described here. According to the present embodiment, in the 2Tr flash memory described in the foregoing first to fifth embodiments, a hierarchical bit line system and a word line shunt wire are applied, and further, the row decoder 11 is divided into a write decoder and a readout decoder. Other constituent elements are as described in the first embodiment, and a duplicate description is omitted here.

Figure 53:
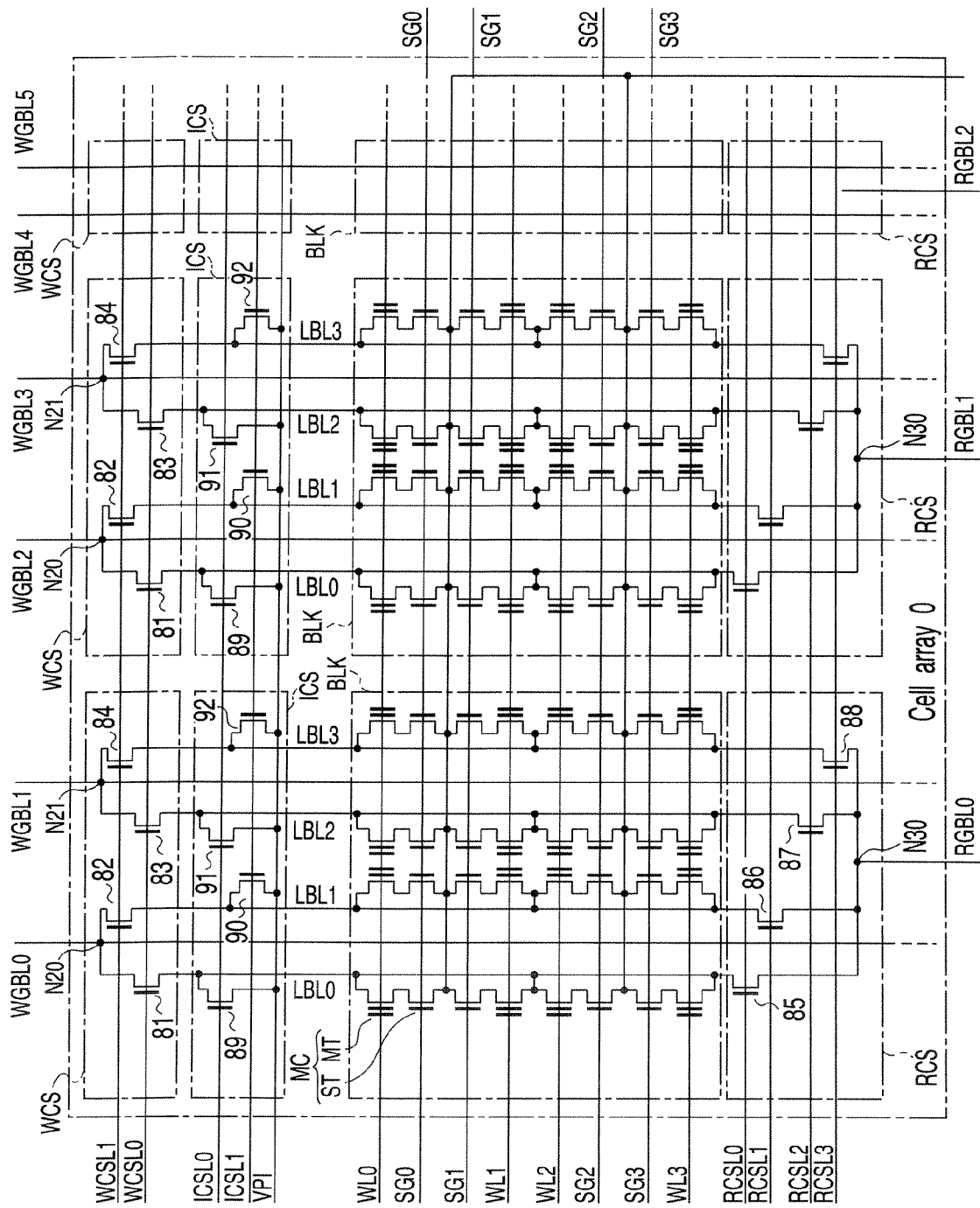
FIG. 53 is a circuit diagram of a cell array provided in a 2Tr flash memory in accordance with a sixth embodiment of the invention.

First, the configuration of a cell array 0 will be described with reference to FIG. 53. FIG. 53 is a circuit diagram of the cell array 0, wherein other cell arrays 1 to j and ECC cell arrays 0 to k each have a similar configuration.

As shown in FIG. 53, the cell array 0 has x×y memory cell blocks BLK (where x and y are natural numbers). The cell array 10 further has write column selectors WCS, read column selectors RCS, and write inhibit column selectors ICS, which are provided for the memory cell blocks BLK in a one-to-one correspondence.

Each the memory cell blocks BLK includes a plurality of memory cells MC. Each memory cell block BLK includes (4×4) memory cells MC. Although the number of memory cells arranged in the column direction is 4 in FIG. 53, this is illustrative and not restrictive. For instance, the number of memory cells MC may be 8 or 16. The drain regions of the memory cell transistors MT of the memory cells MC arranged in four columns are connected to four local bit lines LBL0 to LBL3 in a one-to-one correspondence. One end of each of the local bit lines LBL0 to LBL3 is connected to a write column selector WCS, and the other end is connected to a read column selector RCS. Then, the control gates of the memory cell transistors MT in a same row are connected commonly to any one of word lines WL0 to WL255. The gates of the select transistors ST in a same row are connected commonly to any one of select gate lines SG0 to SG255.

Next, the configuration of a write column selector WCS will be explained. Each of the write column selectors WCS includes four MOS transistors 81 to 84. One end of the current path of each of the MOS transistors 81 to 84 is connected to one end of the corresponding one of local bit lines LBL0 to LBL3. The other ends of the current paths of each of the MOS transistors 81 and 82 are connected to each other, and the other ends of the current paths of the MOS transistors 83 and 84 are connected to each other. Hereinafter, the common junction node of the MOS transistors 81 and 82 is called node N20, and the common junction node of the MOS transistors 83 and 84 is called node N21. The gates of the MOS transistors 81 to 84 are connected to any one of write column select lines WCSL0, WSCL1, . . . . The MOS transistors 82 and 84 included in the write column selector WCS in a same row are connected to the same one of the write column select lines WCSL(i−1) (i: 1, 3, 5, . . . ). The MOS transistors 82 and 84 included in the write column selectors WCS are connected to the same one of the write column select lines WCSLi. One of the write column select lines WCSL is selected by the control circuit 18 in a write operation.

Each of the nodes N10 and N11 in the write column selector WCS is connected to any one of write global bit lines WGBL0, WGBL1, . . . . Each of the write global bit lines WGBL is connected commonly to the nodes N20 or nodes 21 of the write column selectors WCS in a same column.

Next, the configuration of a read column selector RCS will be explained. Each of the read column selectors RCS includes four MOS transistors 85 to 88. One end of the current path of each of the MOS transistors 85 to 88 is connected to the other end of the corresponding one of the local bit lines LBL0 to LBL3. The other ends of the current paths of the MOS transistors 85 to 88 are connected to each other. Hereinafter, the common junction node of the MOS transistors 85 to 88 is called node N30. Each of the gates of the MOS transistors 85 to 88 is connected to a different one of the read column select lines RCSL0, RCSL1, . . . . Each of the MOS transistors 85 to 88 included in the read column selectors RCS in a same row is connected to the same one of the read column select lines RCSL. One of the read column select lines RCSL is selected by the control circuit 18 in a read operation.

The node N30 in the read column selector RCS is connected to any one of the read global bit lines RGBL0, RGBL1, . . . . Each of the read global bit line RGBL is connected commonly to the nodes N30 in the read column selectors RCS in a same column.

Next, the configuration of a write inhibit column selector ICS will be explained. Each of the write inhibit selectors ICS includes four MOS transistors 89 to 92. One end of the current path of each of the MOS transistors 89 to 92 is connected to one end of each of the local bit lines LBL0 to LBL3. A write inhibit voltage VPI is applied commonly to the other end of the current path of each of the MOS transistors 89 to 92. The write inhibit voltage VPI is generated by the voltage generating circuit 19. The gates of the MOS transistors 89 to 92 are connected to any one of the write inhibit column select lines ICSL0, ICSL1, . . . . The MOS transistors 89 and 91 included in the write inhibit column selectors ICS in a same row are connected to the same one of the write column select lines ICSL(i−1) (i: 1, 3, 5, . . . ). The MOS transistors 90 and 92 included in the write inhibit column selectors ICS in a same row are connected to the same one of the write column select line WCSLi. The write inhibit column select lines ICSL is selected by the control circuit 18 in a write operation.

The configuration of a cell array 0 in accordance with the present embodiment can be described as follows. That is, in the cell array 0, a plurality of memory cells MC are arranged in a matrix. Control gates of the memory cell transistors MT of the memory cells MC in a same row are connected commonly to the same word line, and the gates of the select transistors of the memory cells in a same row are connected commonly to the same select gate line. In addition, the drains of the four memory cell transistors in a same row are connected commonly to any one of the local bit lines LBL0 to LBL3. That is, the memory cells MC in the cell array 0 are connected to any one of the local bit lines LBL0 to LBL3 which are different from each other every four memory cells MC arranged in one line. One ends of each of the local bit lines LBL0 in a same row and each of the local bit lines LBL1 in a same row are connected commonly to the same one of the write global bit lines WGBL via the MOS transistors 81 and 82, respectively. One ends of each of the local bit lines LBL2 in a same column and each of the local bit lines LBL3 in a same column are connected commonly to the same one of the write global bit lines WGBL via the MOS transistors 83 and 84, respectively. The other ends of the local bit lines LBL0 to LBL3 in a same column are connected commonly to the same one of the read global bit line RGBL via the MOS transistors 85 to 88, respectively. Further, the local bit lines LBL0 to LBL3 are connected to a write inhibit voltage node via the MOS transistors 89 to 92, respectively. Then, the sources of the select transistors ST of the memory cells MC are connected commonly to the source line driver 12. In the above configured memory cell arrays 0, four memory cells MC connected to the same local bit line are collected in four columns, and one memory cell block BLK is configured. The memory cell blocks in a same column are connected to common write global bit lines and read global bit lines. In contrast, memory cell blocks BLK in columns which are different from each other are connected to a different one of the write global bit lines and read global bit lines. The number of memory cells in memory cell blocks, the number of read global bits RGBL, and the number of write global bit lines WGBL are not limited to the present embodiment.

Figure 54:
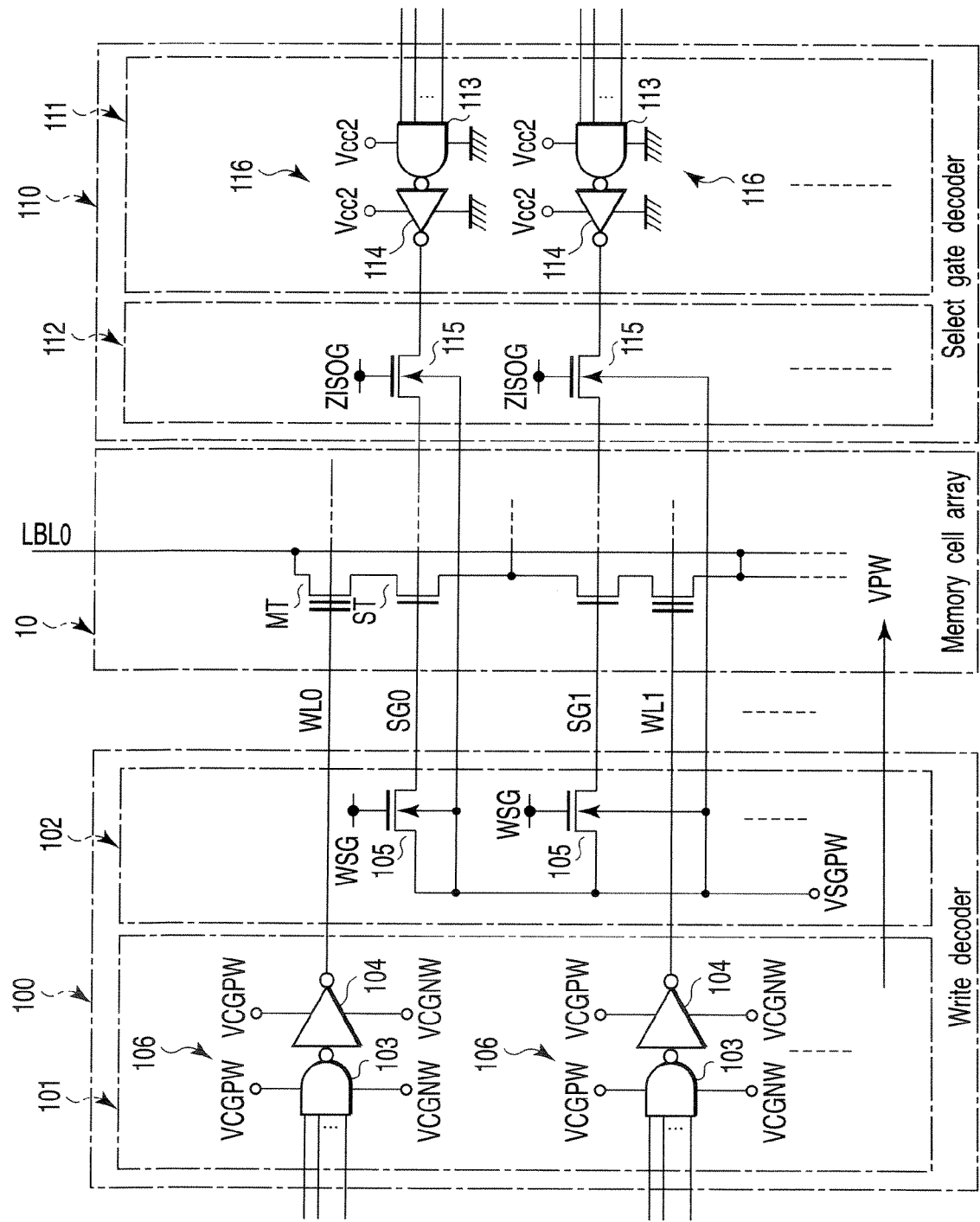
FIG. 54 is a circuit diagram of a memory cell array and a row decoder provided in the 2Tr flash memory in accordance with the sixth embodiment of the invention.

Next, the configuration of the row decoder 11 in accordance with the present embodiment will be described with reference to FIG. 54. FIG. 54 is a circuit diagram of the low decoder 11 and the memory cell array 10 in accordance with the present embodiment. As shown in FIG. 54, the row decoder 11 includes a write decoder 100 and a select gate decoder 110. The write decoder 100 selects any word line in a write operation, and applies the positive potential VPP (12 V) to the selected word line. The write decoder 10 also applies the negative potential VBB1 (−7V) to the p-well region where the memory cell array has been formed and all the select gate lines. Further, in an erase operation, not only is the negative potential VBB2 (−8 V) applied to all of the word lines, but also the positive voltage VPP is applied to the p-well region where the memory cell array has been formed. The select gate decoder 110 selects any select gate line in a read operation, and applies a positive potential Vcc2 to the selected select gate line.

The configurations of the write decoder 100 and select gate decoder 110 will be explained. First, the configuration of the select gate decoder 110 will be explained. The select gate decoder 100 includes an address decode section 111 and a switch element group 112. The address decode section 111 has a plurality of row address decode circuit 116. The row address decode circuits 116 are provided on a select gate by gate basis. The row address decode circuit 116, which operates on the power supply voltage Vcc2, decodes row address signals, thereby producing a row address decode signal. The row address decode circuit 116 has NAND circuits 113 and inverters 114. The NAND circuit 113 performs NAND operation on each bit in the low address signals. Then, the inverter 114 inverts the result of the NAND operation and outputs the inverted value as a row address decode signal.

The switch element group 112 has n-channel MOS transistors 115. The n-channel MOS transistors are provided for select gate lines in a one-to-one correspondence. The outputs of the inverters 114 are supplied to select gate lines via the current paths of the n-channel MOS transistors 115. A control signal ZISOG is input to the gates of the n-channel MOS transistors 115. The control signal ZISOG turns off the MOS transistors 115 in a write operation and an erase operation, and turns on the MOS transistors 115 in a read operation.

Next, the configuration of the write decoder 100 will be explained. The write decoder 100 includes an address decode section 101 and a switch element group 102. The address decode section 101 has a plurality of row address decode circuits 106. The row address decode circuits 106 are provided on a select gate by gate basis. The row address decode circuit 106, which operates on the power supply voltage Vcc2, decodes row address signals, thereby producing a low address decode signal. The row address decode circuit 106 includes NAND circuits 103 and inverters 104. The NAND circuit 103 performs NAND operation on each bit in the row address signals. Then, the inverter 104 inverts the result of the NAND operation and outputs the inverted value as a row address decode signal.

The switch element group 102 has n-channel MOS transistors 105. The n-channel MOS transistors 105 are provided for select gate lines in a one-to-one correspondence. The outputs of the inverters 104 are supplied to select gate lines via the current paths of the n-channel MOS transistors 105. A control signal WSG is input to the gates of the n-channel MOS transistors 105. The control signal WSG turns on the MOS transistors 105 in a write operation and turns off the MOS transistors 105 in a read operation.

Next, using FIGS. 55 and 56, a plane structure of a 2Tr flash memory in accordance with the present embodiment will be explained. FIGS. 55 and 56 are plan views showing flat patterns of first-layer and second-layer metal wiring layers in addition to an element region, a word line, and a select gate line. Hereinafter, a description will be given with respect to matters which are different from those shown in FIGS. 6 to 9 described in the first embodiment. Dummy bit lines provided adjacent to an edge of a memory cell array and a shunt SA1 are not shown in the figures.

First, as shown in FIG. 55, in an element region group AAG, a source contact region SCA is provided by a plurality of bit lines. In the source contact region SCA, one-column element regions AA are formed, and dummy memory cells are formed on the element regions AA. In the shunt region SA1, part of word lines as well as select gate lines are made wider. The region made wider in a word line is referred to as a shunt region SA3. The shunt regions SA3 are provided in word lines WL0 to WL255 alternately in the second direction. Specifically, in a certain shunt region SA1, a shunt region SA3 is formed in each of the word lines WL0, WL2, WL4, . . . , and, in another shunt region SA1 adjacent to the shunt region SA1, a shunt regions SA3 is formed in each of the word lines WL1, WL3, WL5, . . . . The shunt region SA3 is formed so as to project toward the adjacent word lines.

Next, using FIG. 55, a pattern of a first-layer metal wiring layer will be explained. In FIG. 55, the shaded region is the first-layer metal wiring layer. As shown in FIG. 55, in the configuration of FIG. 7 described in the first embodiment, metal wiring layers 120 are further formed. Each of the metal wiring layers 120 functions as a shunt wire for each of the word lines WL0 to WL255. Between the metal wiring layers 41 and 42 which are adjacent to each other in the column direction, the metal wire layer 120 is formed so as to be electrically isolated from the metal wiring layers 41 and 42 in a striped shape in the second direction. The metal wiring layer 120 is formed on a select gate line in an element region group AAG. In a shunt region SA1, the metal wiring layer 120 is bent so as to pass over the shunt region SA3 of a word line. That is, the metal wiring layer 120 has a flat pattern such that the layer becomes protrusive at an opposite side of a face facing the adjacent metal wiring layer 41 in the shunt region SA1. However, a metal wiring layer 120 corresponding to a word line having no shunt region SA3 in the shunt region SA1 is also bent as is a metal wiring layer 120 corresponding to a word line having a shunt region SA3. Therefore, two metal wiring layers 120 adjacent to the metal wiring layer 41 have a flat pattern such that they are axisymmetrical to the metal wiring layer 41. The metal wiring layer 120 is connected to a shunt region SA3 of the corresponding word line WL in the shunt region SA1 by a contact plug CP20.

Next, using FIG. 56, a pattern of a second-layer metal wiring layer will be explained. In FIG. 56, the shaded region is the second-layer metal wiring layer. As shown in FIG. 56, in the configuration of FIG. 8 described in the first embodiment, metal wiring layers 130 are further formed. Each of the metal wiring layers 130 has a pattern similar to that of the metal wiring layer 44, and its line width is equal to that of the metal wiring layer 44. Each of the metal wiring layers 130 functions as part of a source line SL. The wiring layer 130 is connected to the first-layer metal wiring layer 41 by a contact plug CP21. That is, a plurality of metal wiring layers 41 isolated in the first direction are connected commonly to each other by the metal wiring layer 130.

A pattern of a third-layer metal wiring layer is similar to that shown in FIG. 9. Further, in the configuration according to the present embodiment, a write global bit line WGBL and a read global bit line RGBL are formed of a metal wiring layer formed in a fourth layer.

Next, using FIGS. 53 and 54, an operation of a 2Tr flash memory in accordance with the present embodiment will be briefly explained.

First, a write operation will be explained. Data writing is carried out with respect to all the memory cell blocks in a same row at a time. However, in each memory cell block, the memory cells written at the same time are two memory cells, a memory cell connected to any one of the local bit lines LBL0 and LBL1 and a memory cell connected to any one of the local bit lines LBL2 and LBL3.

When data is written into memory cells connected to the local bits LBL0 and LBL2, a write column select line WCSL0 and a write inhibit column select line ICSL1 are selected. As a result, the MOS transistors 81 and 90 are turned on, and the MOS transistors 82 and 89 are turned off. Therefore, a voltage corresponding to write data is imparted from the write global bit WGBL to the selected local bit lines LBL0 and LBL2. On the other hand, the write inhibit voltage VPI is applied to the unselected local bit lines LBL0 and LBL3 by the MOS transistor 90.

Then, the write decoder 100 selects any one of the word lines, and applies the positive voltage VPP to the selected word line. In addition, the signal WSG is made high (0 V to Vcc2), and the disconnecting MOS transistor 105 is turned on, whereby the negative potential VBB1 is applied from the VSGPW node to all the select gate lines. Further, the write decoder 20 applies the negative potential VBB1 to the substrate (p-well region) where the memory cell has been formed. In a write operation, the signal ZISOG is made low, and the address decode section 111 of the select gate decoder 110 is electrically isolated from the select gate lines.

The read column select line RCSL is unselected. In this manner, the MOS transistors 85 to 88 in the all the read column selectors RCS are turned off. Therefore, the read global bit lines RGBL and local bit lines LBL0 to LBL3 are electrically isolated from each other.

Next, an erase operation will be explained. Upon the erase operation, all of the MOS transistors 81 to 92 are turned off. Therefore, the local bit lines LBL0 to LBL3 are electrically isolated from the write global bit lines WGBL, read global bit lines RGBL, and VPI nodes, and a floating state is established.

The write decoder 100 applies the negative voltage VBB2 to all the word lines in a selected block. Further, the write decoder 100 applies the positive potential VPP to the substrate on which the memory cell has been formed. In an erase operation, the signals ZISOG and WSG each are made low, and the address decode section 111 of the select gate decoder 110 is electrically isolated from the select gate lines.

Thus, a voltage stress is hardly applied to a gate insulating film of a select transistor ST. However, in the write decoder 100, VSGPW=VPP is defined, and further, the MOS transistor 105 is turned on, whereby VPP may be applied to a select gate line.

Next, a read operation will be explained. In a read operation, any one of the read column select lines RCSL0 to RCSL3 is selected. In this manner, any one of the local bit lines LBL0 to LBL3 is connected to the corresponding one of the read global bit lines RGBL. The write column select lines WCSL and write inhibit column select lines ICSL are all unselected, and the local bit lines LBL0 to LBL3 are isolated from the write global bit lines WGBL and VPI nodes.

Then, the signal ZISOG is made high and the disconnecting MOS transistor 115 is turned on. The select gate decoder 100 selects any one of the select gate lines, and applies a high level (Vcc2=3 V) to the selected select gate line. The write decoder 100 unselects all the word lines (0 V) and sets the potential VPN of the p-well region 51 to 0 V. Further, the source line driver 12 sets the potential of the source line to 0 V. In a read operation, the signal WSG is made high, and the VSGPW node and select gate line are electrically isolated from each other.

As described above, according to the flash memory of the sixth embodiment of the invention, in addition to the above-described advantageous effects (1) to (4), the following advantageous effects (5) to (8) can be attained.

(5) Performance of Row Decoder can be Improved.

In the flash memory according to the present embodiment, positive and negative high voltages VPP, VBB1, and VBB2 are used in a write operation and an erase operation, and a comparatively low voltage Vcc2 (3 V) is used in a read operation. In this case, in order for a row decoder to cope with both of the write and erase operations and the read operation, it is necessary to ensure that a low decoder is formed of MOs transistors each having a high withstand voltage which can be durable to the high voltages VPP1, VBB1, and VBB2. However, such MOS transistors each having a high withstand voltage causes a readout speed to be lowered because they are merely wastefully high in withstand voltage as long as these transistors are used only in the read operation.

In this regard, with the configuration according to the present embodiment, a row decoder is divided into the write and erasing decoder 100 and the readout decoder 110. In addition, by providing the disconnecting MOS transistors 105 and 115, the select gate line and address decode section 111 are connected to each other in the read operation, and the select gate line and address decode section 111 are electrically isolated from each other in the write/erase operations.

As a result, it is possible to prevent a high voltage such as VPP1, VBB1 or VBB2 from being applied to the readout-based decode circuit 111 using a low voltage. Therefore, the address decode section 111 can be formed of MOS transistors each having a low withstand voltage. In this manner, a read operation can be carried out at high speed. The MOS transistors each having a high withstand voltage may be used for only the write-based address decode circuit 101 and the disconnecting MOS transistors 105 and 115, the number of which can be reduced to its required minimum. Thus, the size of the row decoder can be downsized. In this manner, the improvement of an operating speed and the downsizing of the row decoder can be achieved, and the performance of the row decoder can be improved.

(6) Operating Speed of Flash Memory can be Improved.

With the configuration according to the present embodiment, bit lines are stratified into local bit lines and global bit lines (read global bit lines and write global bit lines). A plurality of memory cells are connected to each of a plurality of local bit lines, and a plurality of local bit lines are connected to each of a plurality of global bit lines.

In a write operation, only a local bit line LBL to which a selected memory cell has been connected is connected to a write global bit line WGBL. A local bit line LBL to which the selected memory cell is not connected is electrically isolated from a write global bit line WGBL by means of a write column selector WCS. Therefore, only one local bit line including the selected memory cells, i.e., only four memory cells can be seen from one write global bit line WGBL. Consequently, only these four memory cells MC will cause a parasitic capacity which exists in the write global bit line WGBL. Deselected memory cells which exist in a same row as the selected memory cells and which are connected to the local bit line LBL will not cause a parasitic capacity of a write global bit line. Therefore, the parasitic capacity of the write block bit line can be significantly reduced. This also applies to a read operation as well.

As described above, the parasitic capacities of the write global bit line and read global bit line can be reduced. As a result, an operating speed of the flash memory can be improved.

(7) Readout Speed can be Improved.

In a flash memory, there is a need for handling a comparatively high voltage such as VPP1 or VBB1 in a write operation. To meet this request, a MOS transistor having a thick gate insulating film and a comparatively high voltage must be used. On the other hand, a voltage for use in a read operation is low as compared with that for use in the write operation. Therefore, in consideration of only the read operation, it is desirable to use a MOS transistor having a thin gate insulating film and a low withstand voltage. From the viewpoint of an operating speed as well, it is desirable to use a MOS transistor having a low withstand voltage.

In this regard, with the configuration according to the present embodiment, local bit lines are connected to write global bit lines and read global bit lines. That is, a signal path for use in the write operation is different from that for use in the read operation. Therefore, in the signal path for use in the read operation, all the circuits which exist between these signal paths can be formed of transistors each having a thin gate insulating film. As a result, a read operation speed can be improved.

(8) Reliability of Write Operation can be Improved.

As has been described in item (6) above, bit lines are stratified. In particular, in view of a write path, a plurality of local bit lines are connected to one write global bit line. In a write operation, only one local bit including selected memory cells is electrically connected to the write global bit line, and other local bit lines are electrically isolated from the write global bit line. Therefore, a voltage according to write data is not applied to a local bit line to which the selected memory cell is not connected. Therefore, an occurrence of incorrect write into memory cells connected to these local bit lines can be effectively prevented, and the reliability of the write operation can be improved.

Figure 57:
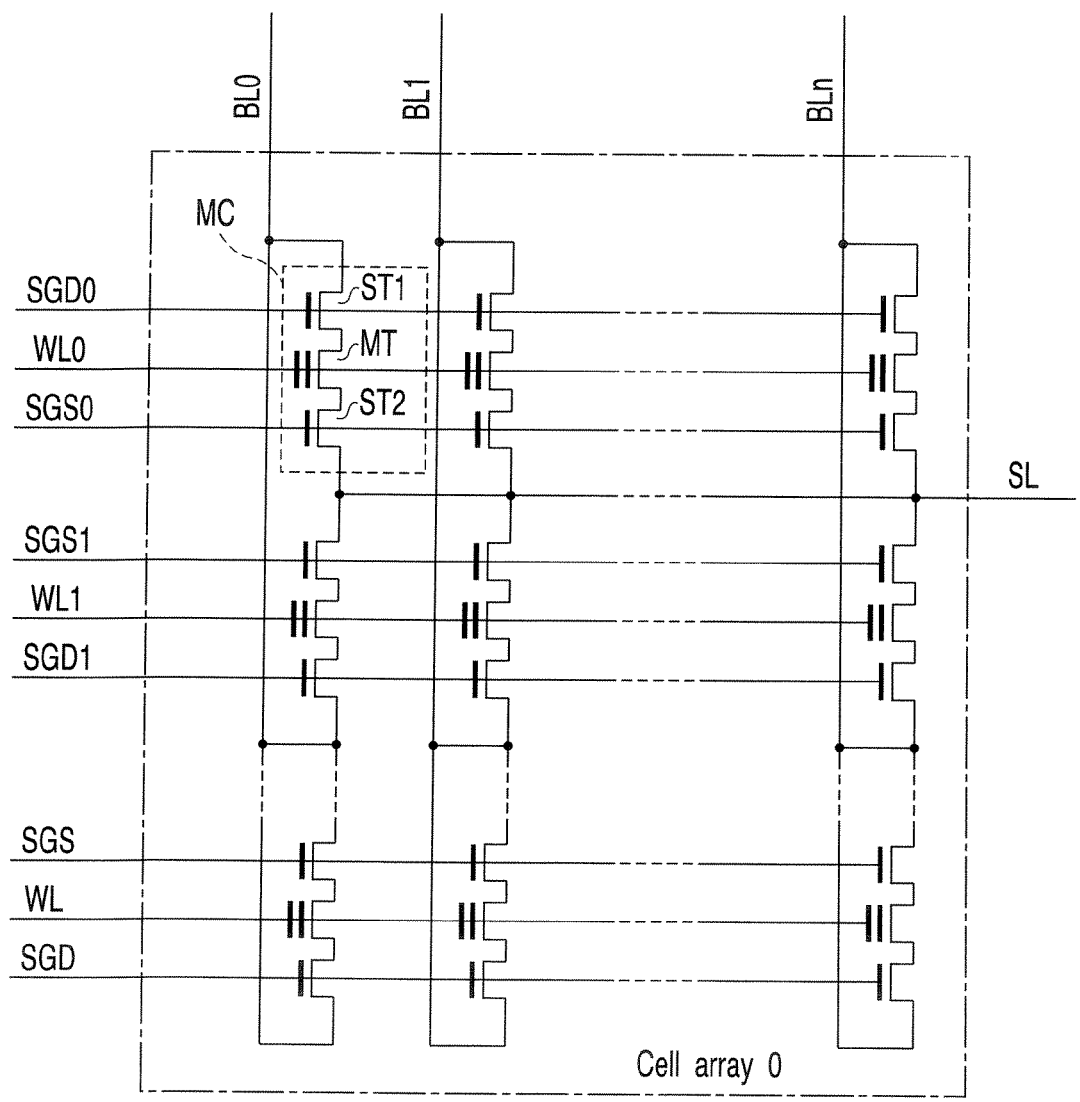
FIG. 57 is a circuit diagram of a cell array provided in a 3Tr-NAND flash memory in accordance with a seventh embodiment of the invention.

Next, a semiconductor memory device in accordance with a seventh embodiment of the invention will be described here. In the present embodiment, the above first to sixth embodiments are applied to a 3Tr-NAND flash memory. FIG. 57 is a circuit diagram of a cell array 0.

As shown in FIG. 57, each of memory cells MC of the 3Tr-NAND flash memory includes a memory cell transistors MT and select transistors ST1 and ST2 for which current paths are connected in series. The current path of the memory cell transistor MT is connected between the current paths of the select transistors ST1 and ST2. The memory cell transistor MT has a stacked gate structure that includes a floating gate formed on a semiconductor substrate with a gate insulating film interposed therebetween and a control gate formed on the floating gate with an inter-gate insulating film interposed therebetween. In addition, the select transistors ST1 and ST2 each have a multilayered gate structure that includes a first polysilicon layer formed on a semiconductor substrate with a gate insulating film interposed therebetween, and a second polysilicon layer formed on the first silicon layer with an inter-gate insulating film interposed therebetween. A source region of the select transistor ST1 is connected to a drain region of the memory cell transistor MT, and a source region of the memory cell transistor MT is connected to a drain region of the select transistor ST2. In addition, memory cells MC adjoining each other in the column direction share the drain region of the select transistor ST1 or the source region of the select transistor ST2.

Control gates of the memory cell transistors MT of the memory cells MC in a same row are connected commonly to any one of the word lines WL0 to WL255. Gates of the select transistors ST1 of the memory cells MC in a same row are connected commonly to any one of the select gate lines SGC0 to SGD255. Gates of the select transistors ST2 are connected commonly to any one of the select gate lines SGS0 to SGS255. The drain regions of the select transistors ST1 of the memory cells MC in a same column are connected commonly to any one of the bit lines BL0 to BL255.

Figure 58:
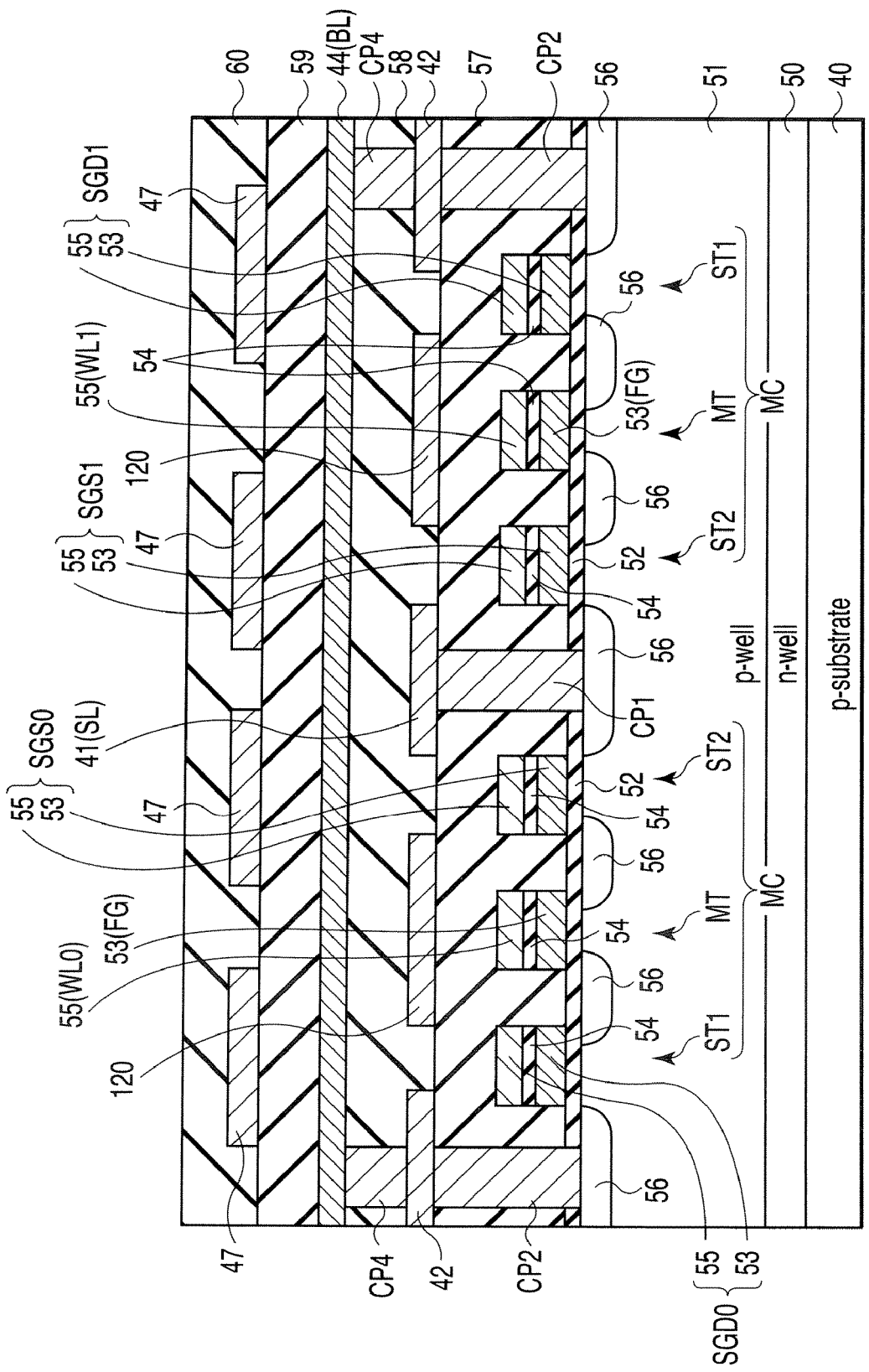
FIG. 58 is a sectional view of a memory cell provided in the 3Tr-NAND flash memory in accordance with the seventh embodiment of the invention.

FIG. 58 is a sectional view taken along a bit line direction of a cell array 0. As shown in FIG. 58, at the surface of a p-type semiconductor substrate 40, an n-well region 50 is formed. At the surface of the n-well region 50, a p-well region 51 is formed. In the p-well region, gate electrodes of the memory transistor MT and the select transistors ST1 and ST2 are formed with a gate insulating film 52 interposed therebetween. As in the first embodiment, the gate electrodes of the memory cell transistor MT and the select transistors ST1 and ST2 each have a polysilicon layer 53 formed on the gate insulating film 52, an inter-gate insulating film 54 formed on the polysilicon layer 53, and a polysilicon layer 55 formed on the inter-gate insulating film 54.

A structure of the memory cell transistor MT is similar to that of the memory cell transistor MT of the 2Tr flash memory described in the first embodiment. A structure of the select transistors ST1 and ST2 is similar to that of the select transistor ST of the 2Tr flash memory.

A memory cell MC including a memory cell transistor MT and select transistors ST1 and ST2 is formed so as to have the following relationship. Specifically, in adjacent memory cells MC, their select transistors ST1 or their select transistors ST2 are adjacent to each other. The adjacent transistors share an impurity diffused layer 56.

In addition, the drain region of the select transistor ST1 is connected to a bit line 44 with contact plugs CP2 and CP4 and a metal wiring layer 42 interposed between. The source region of the select transistor ST2 is connected to a source line 41 with a contact plug CP1 interposed therebetween. Of course, in the 3Tr-NAND flash memory as well, a shunt wire 120 of a word line and a shunt wire 47 of a select gate line may be provided.

Even in the 3Tr-NAND flash memory as described above, the advantageous effects described in the first to sixth embodiments can be attained.

Figure 59:
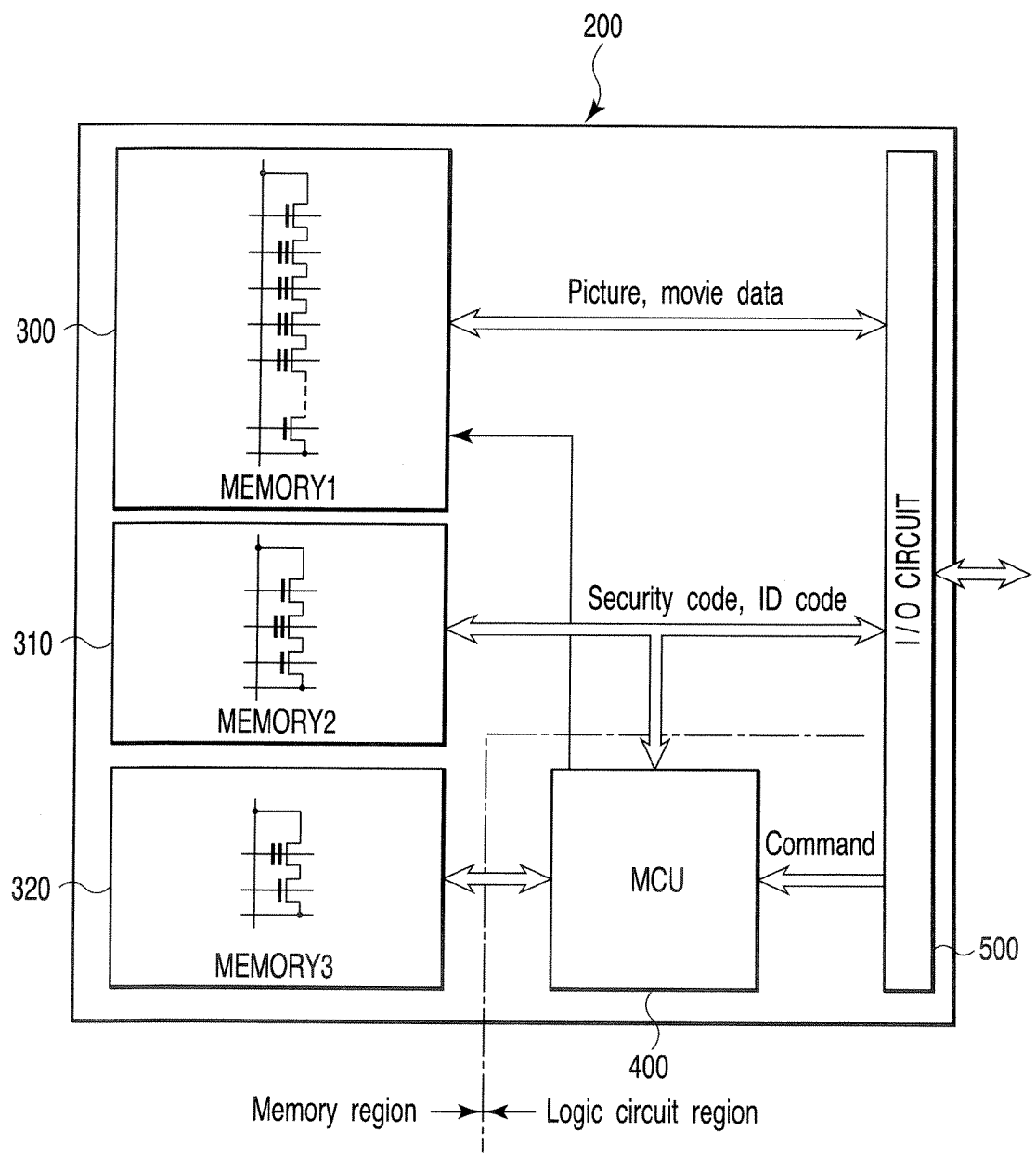
FIG. 59 is a block diagram of a system LSI in accordance with an eighth embodiment of the invention.

Next, a semiconductor memory device according to a eighth embodiment of the present invention will be explained. The eighth embodiment is related to an LSI in which a flash memory explained in each of the first to seventh embodiments is embedded in a same chip. FIG. 59 is a block diagram of a system LSI according to the sixth embodiment.

As shown in FIG. 59, a system LSI 200 comprises a NAND flash memory 300, a 3Tr-NAND flash memory 310, a 2Tr flash memory 320, an MCU 400, and an I/O circuit 500 formed on a single semiconductor substrate.

The NAND flash memory 300 is used as a storage memory for storing image data or video data.

The 3Tr-NAND flash memory 310 holds an ID code for accessing the LSI 200 and a security code. The configuration of the 3Tr-NAND flash memory 310 is as explained in the seventh embodiment.

The 2Tr flash memory 320 holds program data for the MCU 400 to operate. The configuration of the 2Tr flash memory 320 is as explained in the first to sixth embodiments.

The MCU 400 does processing on the basis of the program read from the 2Tr flash memory 320, in response to various commands externally input. At this time, the MCU 400 accesses the 2Tr flash memory 320 directly without intervention of an SRAM (Static Random Access Memory) or the like. The processing done by the MCU 400 includes the compression or decompression of the data input to the NAND flash memory 300 and control of an external device. In addition, the MCU 400 reads specific data from the 3Tr-NAND flash memory 310, when the data held in the NAND flash memory 300 is accessed from the outside. Then, the MCU 400 checks the read-out data against the externally input ID code and security data. If they coincide with each other, the MCU 400 permits access to the NAND flash memory 300. When access to the NAND flash memory 300 is permitted, the data in the NAND flash memory 300 is accessed from the outside (host). Specifically, the MCU 400 triggers the NAND flash memory 300 in response to the command received from the outside, thereby reading (or writing) the data.

The I/O circuit 500 controls the exchange of signals between the LSI 200 and the outside.

As described above, the system LSI of the eighth embodiment produces not only the effects in item (1) to item (8) explained in the first to seventh embodiments but also the effects described below.

(9) It is Possible to Embed a Plurality of Types of Flash Memories in a Single Chip, While Suppressing the Manufacturing Cost.

With the configuration of the sixth embodiment, the memory cell transistors MT and select transistors ST1, ST2, ST included in the NAND flash memory 300, 3Tr-NAND flash memory 310, and 2Tr flash memory 320 are formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MT, and the select gates of the select transistors are the same in the three flash memories 300, 310, 320. In such a manufacturing method, the memory cell arrays of the three flash memories can be formed by the number of processes required to form a single flash memory. Therefore, the manufacturing cost of a system LSI including three types of semiconductor memories can be reduced

(10) The Performance of the System LSI can be Made Higher.

The system LSI of the sixth embodiment has the NAND flash memory 300, 3Tr-NAND flash memory 310, and 2Tr flash memory 320 as described above.

Unlike the NAND flash memory 300 and 3Tr-NAND flash memory 310, the 2Tr flash memory 320 uses a positive voltage and a negative voltage in a write and an erase operation. Therefore, the gate insulating film of the MOS transistors used in the row decoder included in the 2Tr flash memory 320 may be thinner than that of the MOS transistors used in the row decoders included in the NAND flash memory 300 and 3Tr-NAND flash memory 310. Thus, the row decoder of the 2Tr flash memory can be made more compact. In addition, the operating speed of the row decoder can be made faster than that of the row decoders in the NAND flash memory 300 and 3Tr-NAND flash memory 310.

In the eighth embodiment, the program data for the MCU 400 to operate is stored in the 2Tr flash memory 320. Thus, the 2Tr flash memory can operate at high speed as described above. The data can be read directly from the 2Tr flash memory 320 without the intervention of the RAM. As a result, a RAM or the like is not needed, which helps simplify the configuration of the system LSI and improve the operating speed.

In addition, the 3Tr-NAND flash memory 310 holds an ID code and a security code. These code data are not so large in the amount of data, but are frequently changed and updated. Thus, the memory to hold the code data is required to operate at some high speed. In this respect, the 3Tr-NAND flash memory 310 uses a smaller erase unit than that in the NAND flash memory 300 and can rewrite the data in pages. Therefore, it can be said that the 3Tr-NAND flash memory 310 is the preferable semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the sixth embodiment, however, such a controller is not needed. The reason is that the 2Tr flash memory 320 is caused to hold a firmware program to control the blocks in the NAND flash memory 300 and the MCU 400 is caused to perform such control. The MCU 400 performs the control in an interval of time between its original jobs (such as the process of controlling an external device or the process of computing the data input to the NAND flash memory 300). Of course, when the comparison of the capacity of the MCU 400 with the amount of work the MCU 400 has to process has shown that the amount of work has exceeded the capacity, a hardware sequencer or the like may be provided to control the NAND flash memory 300.

Figure 60:
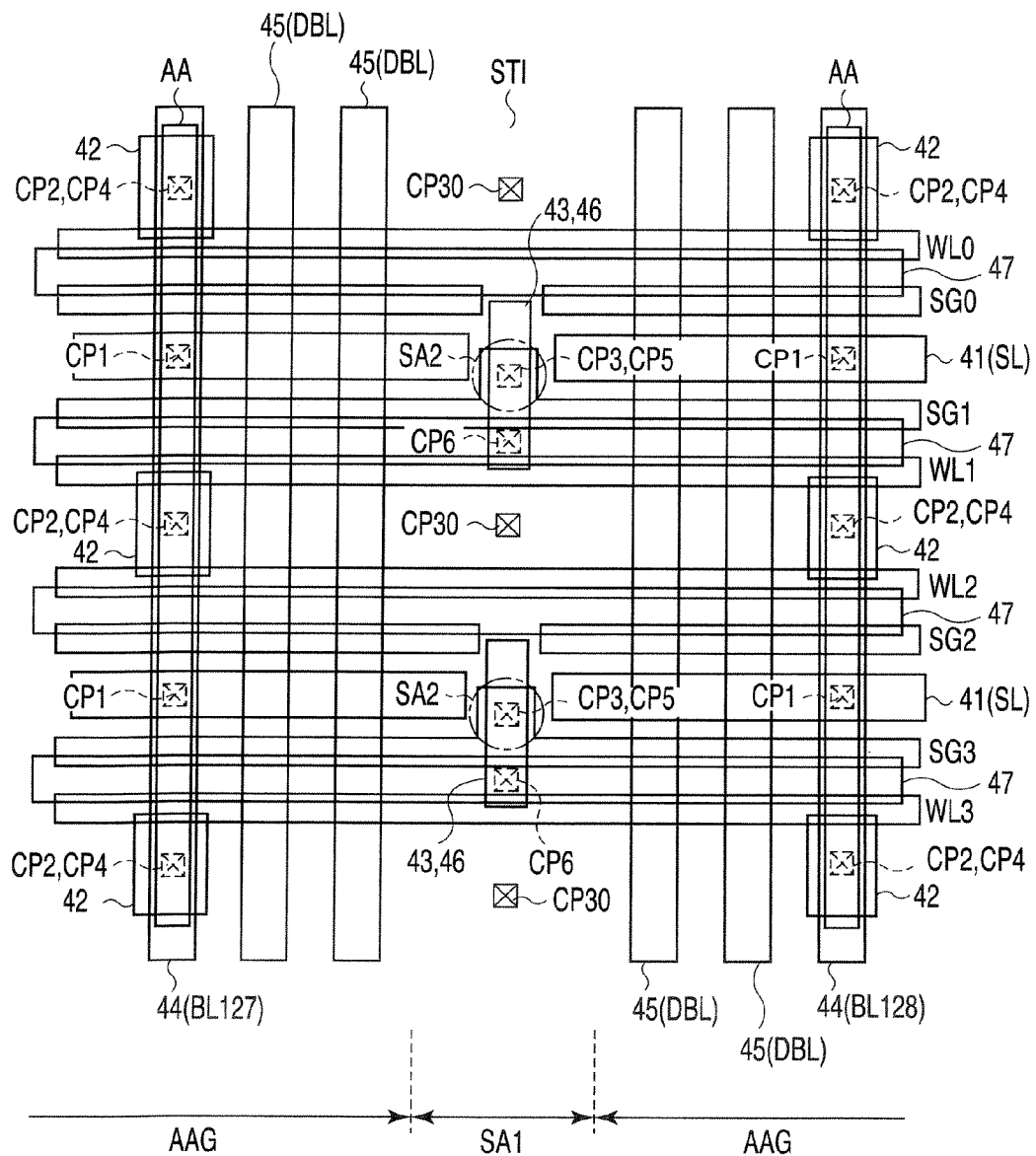
FIG. 60 is a plan view of a cell array provided in a flash memory in accordance with a first modified example of the first to eighth embodiments of the invention.

As described above, with the flash memory in accordance with the embodiments of the invention, column addresses are assigned to bit lines such that bit lines adjacent to an edge of a memory cell array and a shunt region are not selected in plurality at the same time. Therefore, the efficiency of recovering memory cells using ECC can be improved. The above embodiments have described that a shunt region SA1 is provided as a region for connecting a word line or a select gate line and a shunt wire. However, as shown in FIG. 60, the shunt region SA1 may be provided as a region for imparting a potential to well regions 50 and 51 or a semiconductor substrate 40 by a contact plug CP30 or the like. In the present embodiments, a region other than the shunt region and memory cell array end part can be applied as long as a fault is likely to occur in this region.

For example, in the above configuration described in the fifth embodiment, a source contact region SCA is also provided as a region where the regularity of a memory cell pattern is distorted. Therefore, the shunt region SA1 in the above embodiments may be replaced with the source contact region.

Further, the above embodiments have described a case in which one bit can be corrected by an ECC circuit by way of example. However, two or more bits may be correctable. In this case, the bit lines adjacent to the edge of the memory cell array or shunt region may be selected at the same time by the number of correctable bits. FIG. 61 shows a case in which two bits can be corrected. With the configuration of FIG. 61, two bit lines adjacent to the memory cell array end part or shunt region may be selected at the same time. However, since the ECC circuit enables two bit correction, such a fault can be recovered even if a fault occurs with these two bit lines.

The bit lines adjacent to the memory cell array end part and shunt region, the number of which is larger than the number of correctable bits in the ECC circuit, may be selected at the same time. That is, the number of bit lines adjacent to the edge of the memory cell array and shunt region and selected at the same time may not always be equal to or smaller than the number of correctable bits. That is, the number of bit lines selected at the same time is reduced by applying the method of assigning addresses described in the above embodiments to any one of the edge of the memory cell array and shunt region in a cell array. Therefore, the number of bit lines which are likely to be faulty from among the bit lines selected at the same time is reduced more remarkably than conventionally, and thus, a probability is reduced such that failures whose number is greater than the number of correctable bits are selected. Consequently, the efficiency of recovery using the ECC circuit is improved.

In the above embodiments, an element region AA may be formed in a shunt region SA1. That is, a structure of the shunt region SA1 is not problematic in particular, and the shunt region SA1 is provided as a mere example. Therefore, the present embodiments can be applied if there is a site at which a fault is likely to occur. In addition, while the above embodiments have described a 2Tr flash memory and a 3Tr-NAND flash memory by way of example, of course, the present embodiment can be applied to a variety of memories such as a NAND flash memory, a NOR flash memory, a DRAM, an MRAM, a Ferroelectric RAM, or an SRAM.

Figure 62:
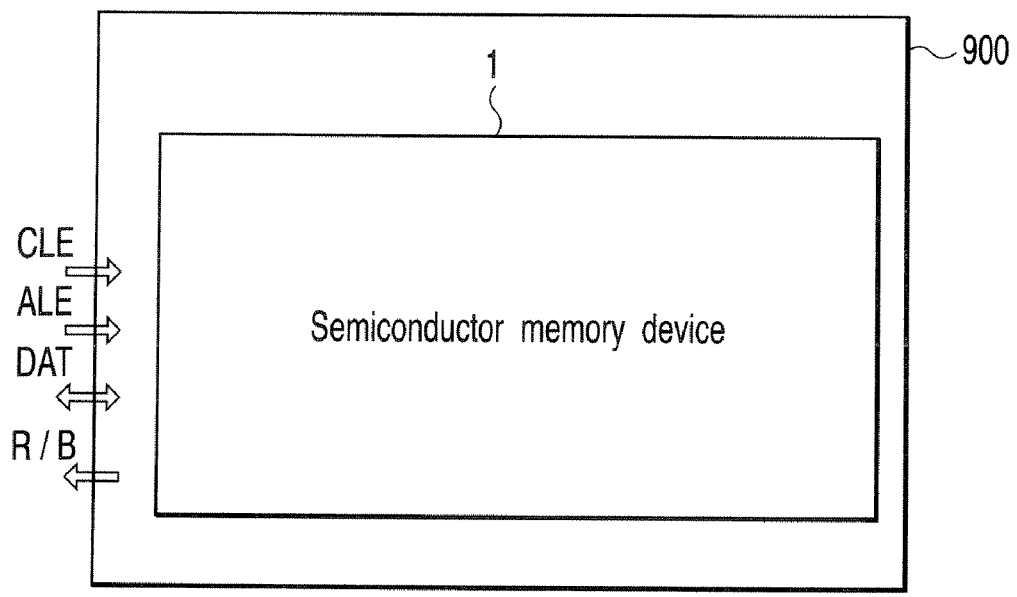
FIG. 62 is a block diagram of a memory card comprising the flash memory in accordance with the first to eighth embodiments of the invention.

Next, an application of the flash memory will be explained. FIG. 62 shows an example of a memory card. As shown in FIG. 62, the memory card 900 includes a flash memory 1 (3Tr-NAND flash memory, NAND flash memory, or 2Tr flash memory) explained in the above embodiments. The flash memory 1 receives specific controls signals and data from an external unit (not shown). In addition, the flash memory 1 outputs specific control signals and data to the external unit.

A signal line (DAT), a command line enable signal line (CLE), an address line enable signal line (ALE) and a ready/busy signal line (R/B) are connected to the memory card 900 having the flash memory 1. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 63:
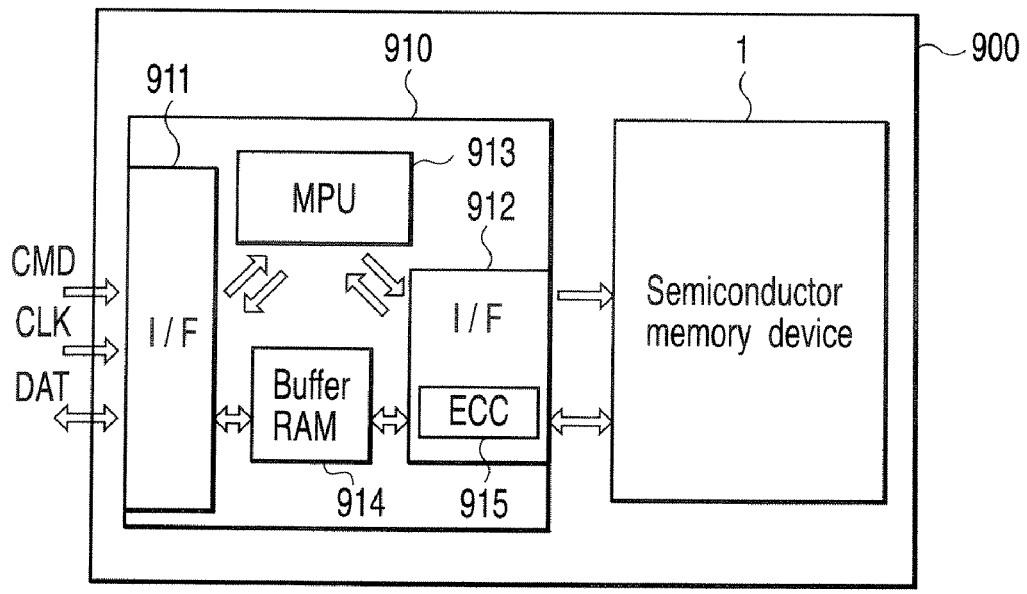
FIG. 63 is a block diagram of a memory card comprising the flash memory in accordance with the first to eighth embodiments of the invention.

Another exemplary implementation is shown in FIG. 63. The memory card shown in FIG. 63 differs from the memory card presented in FIG. 62 in that the memory card of FIG. 63 includes, in addition to the memory device, a controller 910 which controls the flash memory 1 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 64:
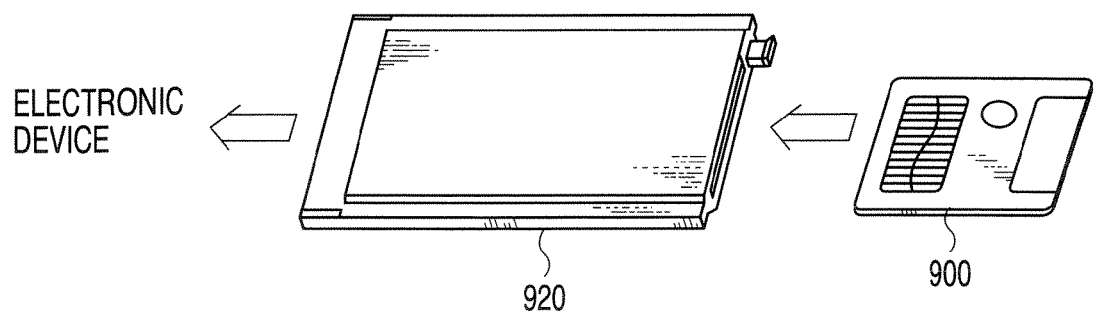
FIG. 64 is an external view of a memory card comprising the flash memory in accordance with the first to eighth embodiments of the invention and a card holder.

FIG. 64 shows another application. As shown in FIG. 64, the memory card 900 is inserted into a cardholder 920, which is then connected to electronic equipment (not shown). The cardholder 920 may have a part of the function of the controller 910.

Figure 65:
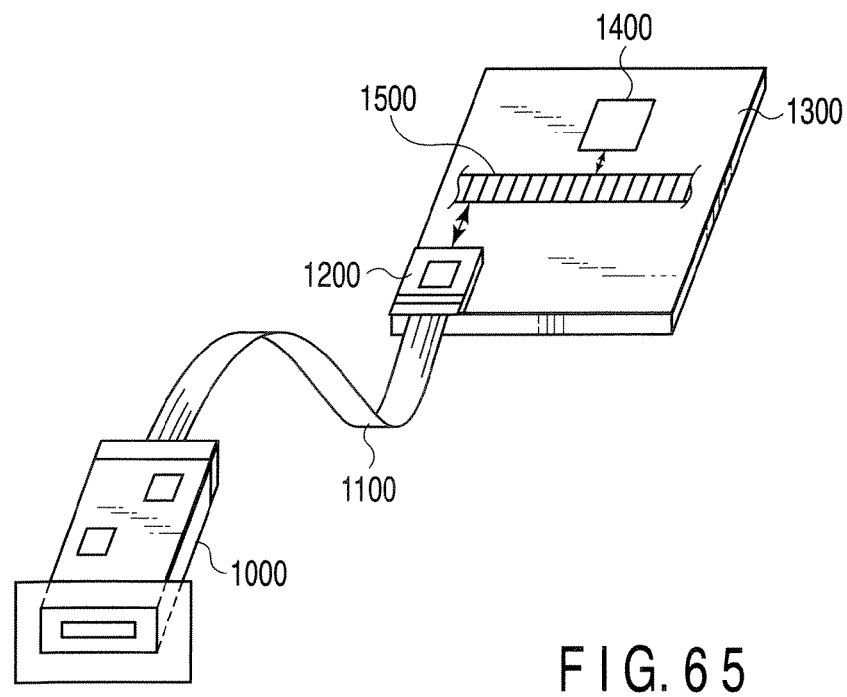
FIG. 65 is an external view of a connector device which connects a memory card comprising the flash memory in accordance with the first to eighth embodiments of the invention.

FIG. 65 shows another application. As shown in FIG. 65, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 66:
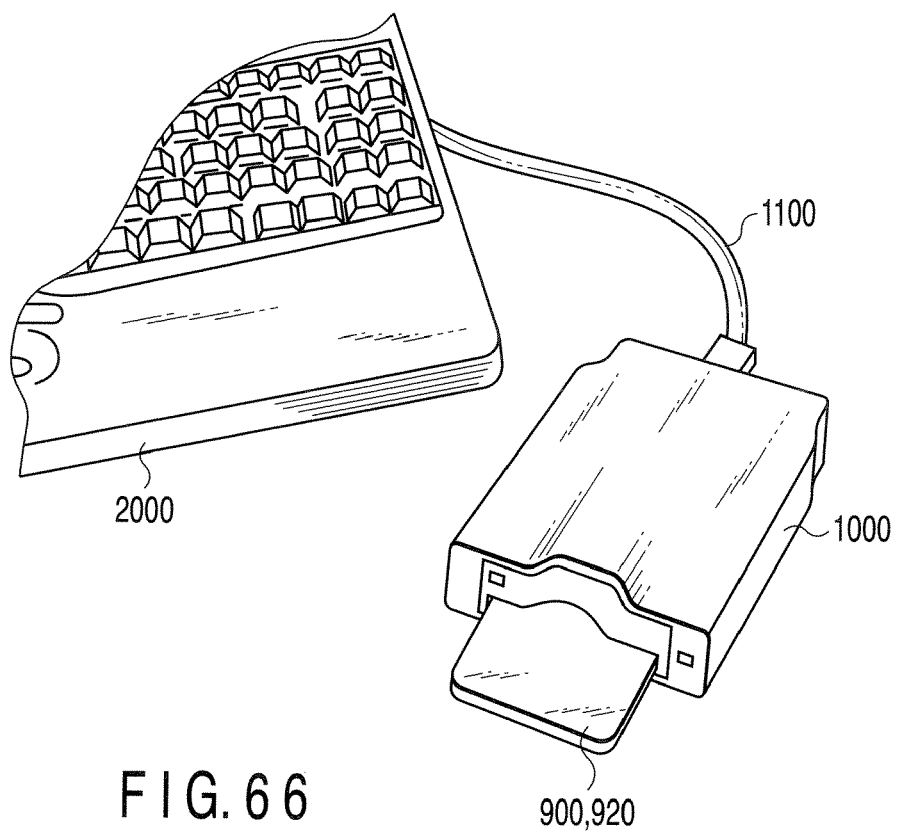
FIG. 66 is an external view of a connector device which connects a memory card comprising the flash memory in accordance with the first to eighth embodiments of the invention.

FIG. 66 shows another application. The memory card 900 or the cardholder 920 in which the memory card 900 has been inserted is inserted into the connection unit 1000. The connection unit 1000 is connected to a personal computer 2000 via the connection cable 1100.

Figure 67:
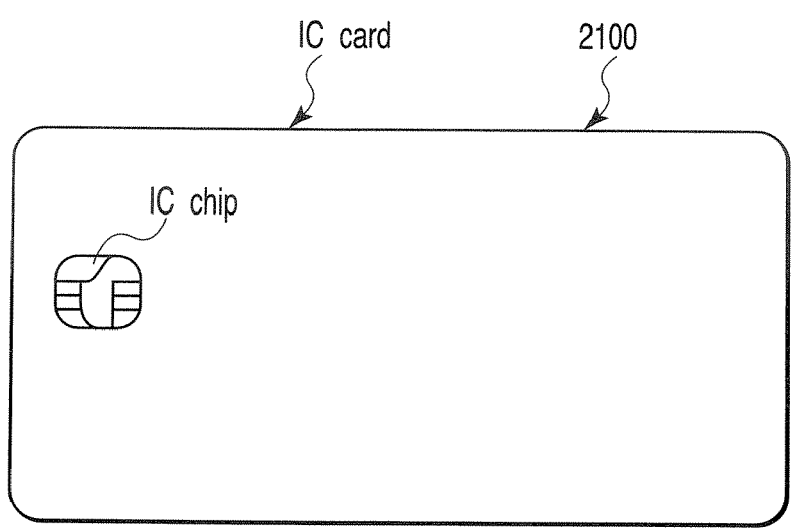
FIG. 67 is an external view of an IC card comprising the flash memory in accordance with the first to eighth embodiments of the invention.
Figure 68:
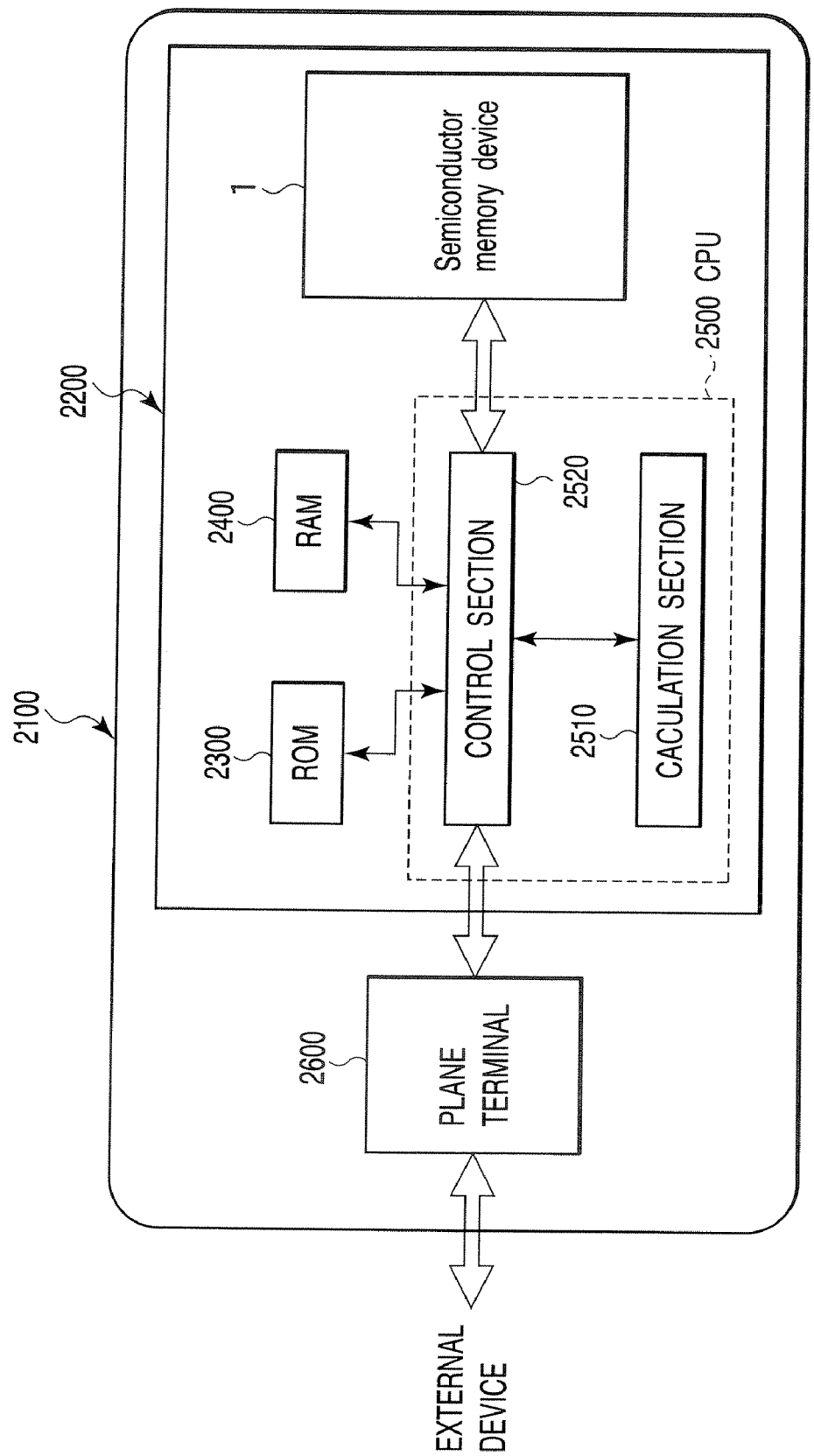
FIG. 68 is a block diagram of an IC card comprising the flash memory in accordance with the first to eighth embodiments of the invention.

FIGS. 67 and 68 show another application. As shown in FIGS. 67 and 68, an IC card 2100 includes an MCU 2200. The MCU 2200 includes the flash memory 1 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 1, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cell arrays in which memory cells are arranged in a matrix;
word lines which are commonly connected to gates of the memory cells in a same row in the memory cell arrays;
bit lines which are commonly connected to drains of the memory cells in a same column in the memory cell arrays, the bit lines representing addresses of the memory cells;
column gates each of which is provided on a memory cell array basis, the column gates selecting the bit lines in the memory cell arrays;
sense amplifiers each of which is provided on a memory cell array basis, the sense amplifiers amplifying data read out from the memory cells selected by the column gates; and
an error correcting circuit which performs error correction of the read-out data,
the memory cell arrays including:
first regions including first element isolating regions which have stripe shapes along the bit lines and which are cyclically repeated in a semiconductor substrate, and the memory cells being formed on an element region between the adjacent element isolating regions, the first regions being arranged in plurality along the word line direction; and
a second region provided adjacent to the first region in a direction along the word lines, the second region including a second element isolating region whose width along the word line direction is greater than that of the first element isolating region, connections of the bit lines to the memory cells adjacent to the second region being different from one another among the memory cell arrays.

2. The device according to claim 1, further comprising:
a row decoder which selects the word line and which is adjacent to the memory cell arrays in the direction along the word line,
wherein the second region is adjacent to an edge of array of the first regions and is adjacent to the row decoder.

3. The device according to claim 1, further comprising:
a contact plug which is formed on the second region and connected to the semiconductor substrate.

4. The device according to claim 1, further comprising:
a source line which commonly connects sources of the memory cells; and
a shunt region of the word lines, which is provided on the second region.

5. The device according to claim 1, wherein, when the error correcting circuit can correct an error of n bits (n is a natural number of 1 or more), the number of the bit lines to which the same column addresses can be assigned among the memory cell arrays and which is adjacent to the second region is equal to or smaller than n.

6. The device according to claim 1,
wherein the second region includes an array edge region arranged adjacent to an edge of the array of the first region and a plurality of intra-array regions in which a shunt region of the word line is formed,
the number of the bit lines provided in the first region between the intra-array regions is identical among the memory cell arrays, and
the number of the bit lines provided in the first region between the array edge region and the intra-array region which is the closest to the array edge region is different among the memory cell arrays.

7. The device according to claim 1, further comprising:
a source line which is commonly connected to sources of the memory cells,
wherein the memory cells each comprise a first MOS transistor each having a floating gate and a control gate and a second MOS transistor having a drain connected to a source of the first MOS transistor,
the word lines include control gate lines which are commonly connected to the control gates of the first MOS transistors in a same row in the memory cell arrays, and select gate lines which are commonly connected to the gates of the second MOS transistors in a same row in the memory cell arrays,
the bit lines being commonly connected to the drains of the first MOS transistors in a same column in the memory cell arrays, and
the source line being commonly connected to the sources of the second MOS transistors in the memory cell arrays.

8. A memory card comprising a semiconductor memory device recited in claim 1.

9. The card according to claim 8, further comprising a control circuit which controls the semiconductor memory device.

10. A semiconductor memory device comprising:
a plurality of memory cell arrays in which memory cells are arranged in a matrix;

word lines which are commonly connected to gates of the memory cells in a same row in the memory cell arrays;

bit lines which are commonly connected to drains of the memory cells in a same column in the memory cell arrays;

column gates each of which is provided on a memory cell array basis, the column gate selecting the bit line in the memory cell arrays;

sense amplifiers each of which is provided on a memory cell array basis, the sense amplifier amplifying data read out from the memory cell selected by the column gate; and an error correcting circuit which performs error correction of the read-out data, the memory cell arrays including:

first regions including first element isolating regions which have stripe shapes along the bit lines and which are cyclically repeated in a semiconductor substrate, and the memory cells being formed on an element region between the adjacent element isolating regions, the first regions being arranged in plurality along the word line direction; and a second region provided adjacent to the first region in a direction along the word lines, the second region including a second element isolating region whose width along the word line direction is greater than that of the first element isolating region, the column gates including MOS transistors each of which is provided on a bit line basis, each MOS transistor having one end of a current path connected to the corresponding bit line, the MOS transistors being arranged in a matrix in the column gates, gates of the MOS transistors in a same row being commonly connected, wherein the MOS transistor connected to the bit line adjacent to the second region are arranged in rows different from one another among the memory cell arrays.

11. The device according to claim 10, further comprising:
a row decoder which selects the bit line, the row decoder being adjacent to the memory cell arrays in the direction along the word line,
wherein the second region is adjacent to an edge of the array of the first regions and is adjacent to the row decoder.

12. The device according to claim 10, further comprising:
a contact plug which is formed on the second region and connected to the semiconductor substrate.

13. The device according to claim 10, further comprising:
a source line which is commonly connected to sources of the memory cells; and
a shunt region of the word line, provided on the second region.

14. The device according to claim 10, wherein, when the error correcting circuit can correct an error of n bits (n is a natural number of 1 or more), the number of the bit lines to which the same column addresses can be assigned among the memory cell arrays and which is adjacent to the second region are equal to or smaller than n.

15. The device according to claim 10,
wherein the second region includes an array edge region arranged adjacent to an edge of the arrays of the first region and a plurality of intra-array regions in which a shunt region of the word line is formed,
the number of the bit lines provided in the first region between the intra-array regions is identical among the memory cell arrays, and
the number of the bit lines provided in the first region between the array edge region and the intra-array region which is the closest to the array edge region is different among the memory cell arrays.

16. The device according to claim 10, further comprising:
a source line which is commonly connected to sources of the memory cells,
wherein the memory cells each comprises a first MOS transistor having a floating gate and a control gate, and a second MOS transistor having a drain connected to a source of the first MOS transistor,
the word lines include control gate lines which are commonly connected to the control gates of the first MOS transistors in a same row in the memory cell arrays and select gate lines which are commonly connected to gates of the second MOS transistors in a same row in the memory cell arrays,
the bit lines being commonly connected to drains of the first MOS transistors in a same column in the memory cell arrays, and
the source line commonly connecting the sources of the second MOS transistors in the memory cell arrays.

17. A semiconductor memory device comprising:
memory cell arrays in which memory cells are arranged in a matrix;
first wirings each of which commonly connects gates of the memory cells in a same row or drains of the memory cells in a same column in the memory cell arrays, the wirings representing addresses of the memory cells;
dummy wirings extending along sides of each of the memory cell in parallel with the first wiring;
column gates each of which is provided on a memory cell array basis, the column gate selecting a column direction of each memory cell array;
sense amplifiers each of which is provided on a memory cell array basis, the sense amplifiers each amplifying data read out from a memory cell which corresponds to the column selected by a column gate;
an error correcting circuit which performs error correction of the read-out data, connections of the wirings to the memory cells being different from one another among the memory cell arrays being arranged adjacent to the dummy wirings; and
a source line which commonly connects sources of the memory cells, wherein the memory cells each includes a first MOS transistor having a floating gate and a control gate, and a second MOS transistor having a drain connected to the source of the first MOS transistor,
the first wirings commonly connected to the control gates of the first MOS transistors in the same row in the memory cell arrays and gates of the second MOS transistors or drains of the first MOS transistors in a same column in the memory cell arrays, and
the source line commonly connects sources of the second MOS transistors in the memory cell arrays.

* * * * *